(12) United States Patent
Cho et al.

(10) Patent No.: US 11,765,935 B2
(45) Date of Patent: Sep. 19, 2023

(54) DISPLAY APPARATUS

(71) Applicant: LG Display Co., Ltd., Seoul (KR)

(72) Inventors: Seong-Pil Cho, Goyang-si (KR); Dong-Yup Kim, Gimpo-si (KR); Kyung-Mo Son, Paju-si (KR); Sang-Soon Noh, Goyang-si (KR); Jun-Seuk Lee, Seoul (KR); Yong-Bin Kang, Gumi-si (KR); Kye-Chul Choi, Seoul (KR); Sung-Ho Moon, Gumi-si (KR); Sang-Gul Lee, Seoul (KR); Byeong-Keun Kim, Gimpo-si (KR); Kyoung-Soo Lee, Paju-si (KR); Hyun-Gyo Jeong, Daegu (KR); Jin-Kyu Roh, Gimcheon-si (KR); Jung-Doo Jin, Gumi-si (KR); Ki-Hyun Kwon, Gumi-si (KR); Hee-Jin Jung, Busan (KR); Jang-Dae Kim, Daegu (KR); Won-Ho Son, Busan (KR); Chan-Ho Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 332 days.

(21) Appl. No.: 16/921,432

(22) Filed: Jul. 6, 2020

(65) Prior Publication Data

US 2021/0005693 A1    Jan. 7, 2021

(30) Foreign Application Priority Data

Jul. 4, 2019 (KR) .................. 10-2019-0080814
Dec. 31, 2019 (KR) .................. 10-2019-0180030

(51) Int. Cl.
*H01L 27/14* (2006.01)
*H10K 59/121* (2023.01)
(Continued)

(52) U.S. Cl.
CPC ..... *H10K 59/1213* (2023.02); *H10K 59/1216* (2023.02); *H01L 27/1225* (2013.01);
(Continued)

(58) Field of Classification Search
CPC ............ H01L 27/3262; H01L 27/3265; H01L 27/1225; H01L 27/1255; H01L 29/4908;
(Continued)

(56) References Cited

U.S. PATENT DOCUMENTS 7,863,607 B2 * 1/2011 Lee .................. H01L 29/7869
257/43
10,490,668 B2   11/2019 Noh et al.
(Continued)

FOREIGN PATENT DOCUMENTS

CN          107452749         * 12/2017
KR    10-2015-0101416 A        9/2015
(Continued)

*Primary Examiner* — Tan N Tran
(74) *Attorney, Agent, or Firm* — Birch, Stewart, Kolasch & Birch, LLP

(57) ABSTRACT

A display apparatus including a first thin-film transistor, a second thin-film transistor and a third thin-film transistor is provided. The first thin-film transistor includes a first active layer composed of a polysilicon material, a first gate electrode overlapping the first active layer such that a first gate insulating layer is interposed therebetween, a first source electrode and a first drain electrode. The first gate electrode includes n layers. The first source electrode and the first drain electrode are connected to the first active layer. The second thin-film transistor includes a second active layer composed of a polysilicon material, a second gate electrode overlapping the second active layer such that a first gate insulating layer is interposed therebetween, a second source electrode and a second drain electrode. The second gate electrode includes n+1 layers. The second source electrode (Continued)

and the second drain electrode are connected to the second active layer.

38 Claims, 19 Drawing Sheets

(51) Int. Cl.
  *H01L 27/12* (2006.01)
  *H01L 29/786* (2006.01)
  *H01L 29/49* (2006.01)
(52) U.S. Cl.
  CPC ...... *H01L 27/1255* (2013.01); *H01L 29/4908* (2013.01); *H01L 29/7869* (2013.01); *H01L 29/78675* (2013.01)
(58) Field of Classification Search
  CPC ........... H01L 29/78675; H01L 29/7869; H01L 29/78648; H01L 2227/323; H01L 2251/5315; H10K 59/1213; H10K 59/1216; H10K 59/1201; H10K 2102/3026
  USPC ............................................... 257/40, 59, 72
  See application file for complete search history.

(56) References Cited

U.S. PATENT DOCUMENTS

| | | | |
|---|---|---|---|
| 10,937,840 B2* | 3/2021 | Lee | ........................ H01L 51/524 |
| 11,189,677 B2* | 11/2021 | Park | .................... H01L 29/7869 |
| 2018/0151125 A1 | 5/2018 | Lee | |

FOREIGN PATENT DOCUMENTS

| | | |
|---|---|---|
| KR | 10-2018-0061524 A | 6/2018 |
| KR | 10-2019-0003150 A | 1/2019 |

\* cited by examiner

DISPLAY APPARATUS

CROSS-REFERENCE TO RELATED APPLICATIONS

This application claims the priority benefit of the Korean Patent Application Nos. 10-2019-0080814 filed on Jul. 4, 2019, and 10-2019-0180030 filed on Dec. 31, 2019, both filed in the Republic of Korea, the entire contents of all of these applications are hereby expressly incorporated by reference as if fully set forth herein in the present application.

BACKGROUND OF THE INVENTION

Field of the Invention

The present invention relates to a display apparatus, and more particularly, to a display apparatus having a plurality of thin-film transistors composed of different semiconductors.

Discussion of the Related Art

The recent advent of the information age has brought about remarkable development in the field of displays for visually representing electrical information signals. In response thereto, a variety of display apparatuses having excellent characteristics, such as thinness, light weight and low power consumption, have been developed.

Specific examples of such a display apparatus include a liquid crystal display apparatus (LCD) and electroluminescent display apparatuses such as an organic light emitting display apparatus (OLED) and a quantum dot light emitting display apparatus (QLED). In particular, electroluminescent display apparatuses, which are considered as the next-generation display apparatuses having self-emission characteristics, are superior in terms of viewing angle, contrast, response speed, and power consumption compared with liquid crystal displays.

An electroluminescent display apparatus includes a display area for displaying an image and a non-display area disposed adjacent to the display area. The display area includes at least one pixel region. Also, the pixel region includes a pixel circuit and a light emitting element. A plurality of thin-film transistors are disposed in the pixel circuit to drive the light emitting elements disposed in the corresponding pixel region.

The thin-film transistor can be classified depending on the material constituting the semiconductor layer. Among them, a polysilicon thin-film transistor and an oxide semiconductor thin-film transistor are used. Meanwhile, an electroluminescent display apparatus in which the polysilicon thin-film transistor and the oxide semiconductor thin-film transistor are formed on the same substrate is actively being developed.

SUMMARY OF THE INVENTION

In a method of forming a display apparatus, the present inventors of the present invention have recognized that the property value (e.g., s-factor) at or below a threshold voltage required for each transistor is different depending on the location and the characteristics of the transistor.

Thus, the present inventors have conceived an improved display apparatus that is capable of increasing the property value (e.g., s-factor) at or below a threshold voltage of only a certain transistor by differently forming the structure of a gate electrode, the structure of an insulating layer on the gate electrode or the structure of a source and a drain, based on the location and the characteristics of the transistor.

An object of the present invention is to provide a display apparatus that is capable of differently implementing the characteristics of thin-film transistors by differently configuring the structure of a gate electrode, the structure of an insulating layer on the gate electrode or the structure of a source and a drain, based on the location and the characteristics of the transistor.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display apparatus comprises a first thin-film transistor which includes a first active layer composed of a polysilicon material, a first gate electrode overlapping the first active layer such that a first gate insulating layer is interposed therebetween, a first source electrode and a first drain electrode, a second thin-film transistor which includes a second active layer composed of a polysilicon material, a second gate electrode overlapping the second active layer such that a first gate insulating layer is interposed therebetween, a second source electrode and a second drain electrode, and a third thin-film transistor which includes a third active layer composed of an oxide semiconductor, a third gate electrode overlapping the third active layer such that a second gate insulating layer is interposed therebetween, a third source electrode and a third drain electrode. The first gate electrode includes n layers, where n can be a natural number such as a positive number or integer. The first source electrode and the first drain electrode are connected to the first active layer. The second gate electrode includes n+1 layers. The second source electrode and the second drain electrode are connected to the second active layer. The third source electrode and the third drain electrode are connected to the third active layer.

In another aspect of the present invention, a display apparatus comprises a first thin-film transistor which includes a first active layer composed of a polysilicon material, a first gate electrode overlapping the first active layer such that a first gate insulating layer is interposed therebetween, a first source electrode and a first drain electrode, a second thin-film transistor which includes a second active layer composed of a polysilicon material, a second gate electrode overlapping the second active layer such that a first gate insulating layer is interposed therebetween, a second source electrode and a second drain electrode, a third thin-film transistor which includes a third active layer composed of an oxide semiconductor, a third gate electrode overlapping the third active layer such that a second gate insulating layer is interposed therebetween, a third source electrode and a third drain electrode, and a storage capacitor which includes a first capacitor electrode disposed on the same layer as the first gate electrode and the second gate electrode, and a second capacitor electrode overlapping the first capacitor electrode such that a first interlayer insulating layer including a first interlayer upper insulating layer and a first interlayer lower insulating layer is interposed therebetween. The first source electrode and the first drain electrode are connected to the first active layer. The second source electrode and the second drain electrode are connected to the second active layer. The third source electrode and the third drain electrode connected to the third active layer. An upper surface of the second gate electrode contacts the first interlayer upper insulating layer of the first interlayer insulating layer. An upper surface of the first gate electrode contacts the first interlayer lower insulating layer of the first interlayer insulating layer.

In another aspect of the present invention, a display apparatus comprises a first thin-film transistor which includes a first active layer composed of a polysilicon material, a first gate electrode overlapping the first active layer such that a first gate insulating layer is interposed therebetween, a first source electrode and a first drain electrode, a second thin-film transistor which includes a second active layer composed of a polysilicon material, a second gate electrode overlapping the second active layer such that a first gate insulating layer is interposed therebetween, a second source electrode and a second drain electrode, a third thin-film transistor which includes a third active layer composed of an oxide semiconductor, a third gate electrode overlapping the third active layer such that a second gate insulating layer is interposed therebetween, a third source electrode and a third drain electrode, and a storage capacitor which includes a first capacitor electrode disposed on the same layer as the first gate electrode and the second gate electrode, and a second capacitor electrode overlapping the first capacitor electrode such that a first interlayer insulating layer is interposed therebetween. The first source electrode and the first drain electrode are connected to the first active layer. The second source electrode and the second drain electrode are connected to the second active layer. The third source electrode and the third drain electrode are connected to the third active layer. Each of the first source electrode and the first drain electrode of the first thin-film transistor has a single-layer structure. Each of the second source electrode and the second drain electrode of the second thin-film transistor has a double-layer structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
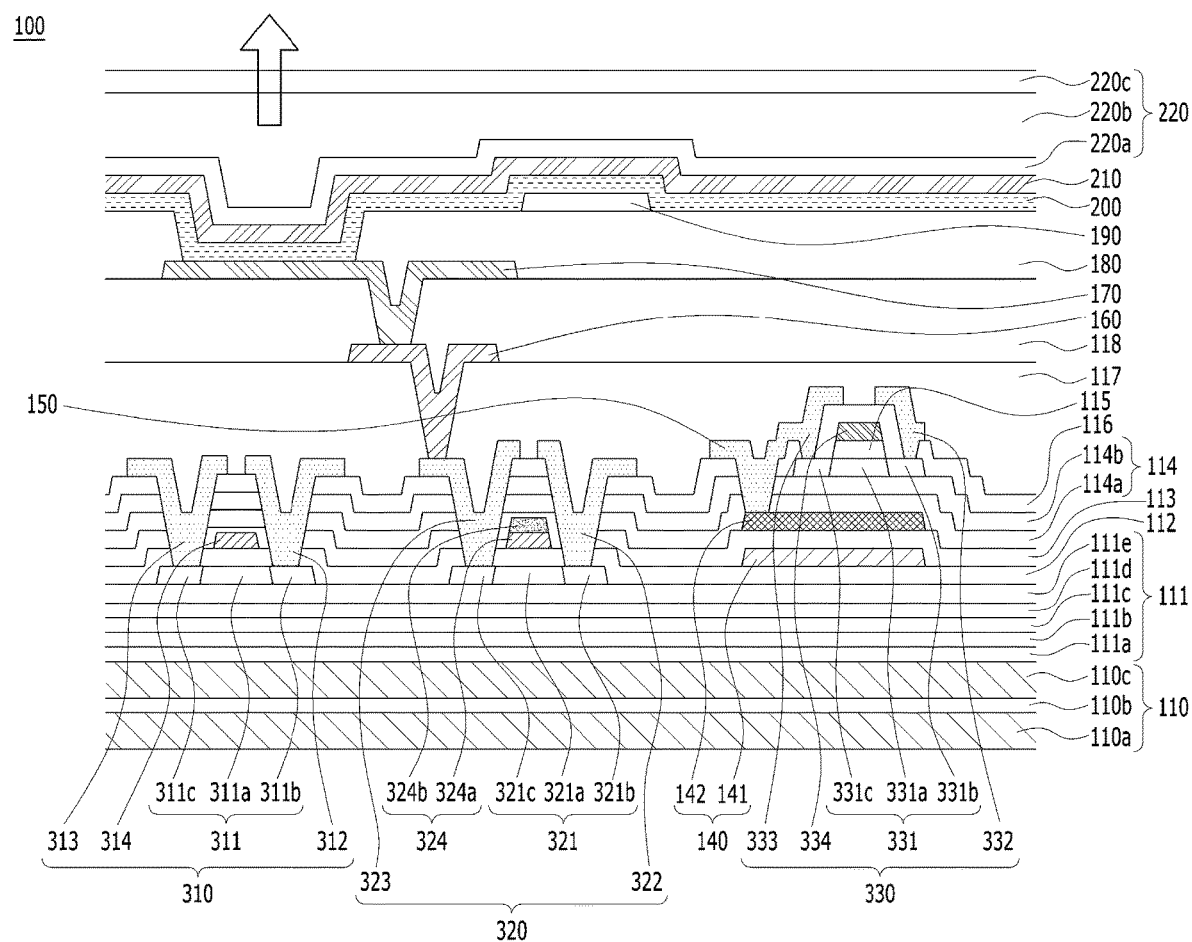
FIG. 1 is a cross-sectional view illustrating a display apparatus according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

The advantages and features of the present invention and methods of achieving the same will be more clearly understood from the following detailed description taken in conjunction with the accompanying drawings. However, the present invention is not limited to the embodiments described below, and can be implemented in various forms. The embodiments of the present invention are provided only to completely disclose the present invention and fully inform a person having ordinary knowledge in the field to which the present invention pertains of the scope of the present invention. Accordingly, the present invention is defined only by the scope of the claims.

The shapes, sizes, ratios, angles, numbers and the like shown in the drawings to illustrate the embodiments of the present invention are merely exemplary, and the invention is not limited to the illustrated details. Wherever possible, the same reference numbers will be used throughout the drawings to refer to the same or like parts. In the following description, detailed descriptions of related prior art can be omitted so as to avoid unnecessarily obscuring the subject matter of the present invention. When terms such as "including", "having" and "comprising" are used throughout the specification, additional components can also be present, unless "only" is used. A component described in a singular form encompasses components in a plural form unless particularly stated otherwise.

It will be interpreted that a constituent component includes an error range, even when there is no additional particular description thereof.

In describing positional relationships, when terms such as "on", "above", "under" and "next to" are used to describe the relationship between two elements, at least one intervening element can be disposed between the two elements unless "immediately" or "directly" is used.

It will be understood that when an element or a layer is referred to as being "on" another element or layer, it can be directly on the other element, or an intervening element can also be present between the two elements.

It will be understood that, although the terms "first", "second", etc. can be used herein to describe various elements, these terms should not be construed as limiting the elements, and are used only to distinguish one element from another and may not define order. Accordingly, a first element mentioned below can be a second element without exceeding the technical concept of the present invention.

Like reference numbers refer to like elements throughout the present disclosure.

In the drawings, the sizes and thicknesses of respective elements are shown for better understanding of the present invention and should not be construed as limiting the scope of the present invention.

It will be understood that each of the features of the various embodiments of the invention can be partly or entirely united or combined with one another, and it will be sufficiently understood by those skilled in the art that the embodiments can be linked to each other or driven within the technical scope in various ways and can be implemented independently of each other or simultaneously implemented in association with each other.

Hereinafter, the embodiments of the present invention will be described with reference to the attached drawings.

The display apparatus of the present disclosure can be applied to an electroluminescent display apparatus such as an organic light-emitting display apparatus (OLED) or a quantum dot light-emitting display apparatus (QLED), but the present invention is not limited thereto, and can be applied to various display devices, for example, a liquid crystal display apparatus (LCD). All the components of the display apparatus according to all embodiments of the present invention are operatively coupled and configured.

FIG. 1 is a cross-sectional view illustrating a display apparatus according to an embodiment of the present invention.

Referring to FIG. 1, a display apparatus 100 according to the embodiment of the present invention includes a substrate 110, a first buffer layer 111, a first thin-film transistor 310, a second thin-film transistor 320, a third thin-film transistor 330, a storage capacitor 140, a first gate insulating layer 112, a first interlayer insulating layer 113, a second buffer layer 114, a second gate insulating layer 115, a second interlayer insulating layer 116, a first planarization layer 117, a second planarization layer 118, a first electrode 170, a connection electrode 150, a bank 180, an auxiliary electrode 160, a spacer 190, a light-emitting structure 200, a second electrode 210 and an encapsulating element 220.

The substrate 110 can support various components of the display apparatus 100. The substrate 110 can be formed of glass or a plastic material having flexibility. When the substrate 110 is composed of a plastic material, it can be formed of, for example, polyimide (PI). When the substrate 110 is formed of polyimide (PI), the process of manufacturing the display apparatus can be performed in the state in which a support substrate composed of glass is disposed under the substrate 110, and the support substrate can be released after the process of manufacturing the display apparatus is completed. Further, a back plate for supporting the substrate 110 can be disposed below the substrate 110 after the support substrate is released.

In the case where the substrate 110 is formed of polyimide (PI), moisture can pass through the substrate 110 formed of polyimide (PI) and then permeates the first thin-film transistor 120 or the light-emitting structure 200, the performance of the display apparatus 100 can be deteriorated. The display apparatus 100 according to the embodiment of the present invention can include double-layered polyimide (PI) in order to prevent the performance of the display apparatus 100 from being deteriorated due to moisture permeation. In the display apparatus 100 according to the embodiment of the present invention, an inorganic film can be formed between the two polyimides (PI) to prevent the moisture from passing through the lower polyimide (PI), so that the reliability of the display apparatus can be improved.

In addition, when an inorganic film is formed between two polyimides (PI), electric charges charged in the lower polyimide (PI) can form a back bias, and can affect the first thin-film transistor 310 or the second thin-film transistor 320. Thus, an additional metal layer needs to be formed in order to block the electric charges charged in the lower polyimide (PI). However, in the display apparatus 100 according to the embodiment of the present invention, an inorganic film is formed between the two polyimides (PI), and blocks the electric charges charged in the lower polyimide (PI), so that the reliability of products can be improved. And, since the step of forming the metal layer to block the electric charges charged in the polyimide (PI) can be omitted, the display apparatus 100 according to the embodiment of the present invention can simplify the overall process, and reduce production costs.

In a flexible display apparatus in which polyimide (PI) is used as the substrate 110, it is very important to ensure the environmental reliability and performance reliability of panels. The display apparatus 100 according to the embodiment of the present invention can realize a structure capable of securing environmental reliability of a product by using double polyimide (PI) as a substrate 110. For example, the substrate 110 of the display apparatus 100 can include a first polyimide layer 110a, a second polyimide layer 110c, and an inorganic insulating layer 110b disposed between the first polyimide layer 110a and the second polyimide layer 110c, as shown in FIG. 1. The inorganic insulating layer 110b can prevent the effects of the electric charges on the first thin-film transistor 310 and the second thin-film transistor 320 through the second polyimide layer 110b, when the electric charges are charged in the first polyimide layer 110a. And, the inorganic insulating layer 110b formed between the first polyimide layer 110a and the second polyimide layer 110c can prevent moisture from permeating through the first polyimide layer 110b.

The inorganic insulating layer 110b can have a single layer structure composed of silicon nitride (SiNx) or silicon oxide (SiOx), or a multi-layer structure thereof. The display apparatus 100 according to the embodiment of the present invention can use silicon oxide (SiOx) material for forming the inorganic insulating layer 110b. For example, the inorganic insulating layer 110b can be formed of silicon dioxide (silica or silicon dioxide: $SiO_2$). However, the present invention is not limited thereto, and the inorganic insulating layer 110b can have a multi-layer structure including silicon dioxide ($SiO_2$) and silicon nitride ($SiN_x$).

The first buffer layer 111 can be formed over the entire surface of the substrate 110. The first buffer layer 111 can include a single layer structure composed of silicon nitride (SiNx) or silicon oxide (SiOx), or a multi-layer structure thereof. The first buffer layer 111 can improve adhesion between the substrate 110 and the layers formed on the first buffer layer 111, and can block alkaline components and the like flowing out from the substrate 110. The first buffer layer 111 is not an essential component, and can be omitted depending on the type and material of the substrate 110, the structure and type of the thin-film transistor, and the like.

In the embodiment of the present invention, the first buffer layer 111 can have a multi-layer structure in which silicon dioxide ($SiO_2$) and silicon nitride (SiNx) are alternately stacked. For example, the first buffer layer 111 can include n+1 layers, wherein n is an even number including zero, such as 0, 2, 4, 6 or 8. Thus, in the case where n=0, the first buffer layer 111 is formed as a single layer. And, the first buffer layer 111 can include silicon nitride (SiNx) or silicon oxide (SiOx). In the case where n=2, the first buffer layer 111 is formed as a triple layer. When the first buffer layer 111 is formed as a triple layer, the upper and lower layers can include oxidized silicon (SiOx), and the intermediate layer disposed between the upper and lower layers can include silicon nitride (SiNx). In the case where n=4, the first buffer layer 111 can be formed as a quintuple layer. When the first buffer layer 111 is formed as a quintuple layer, a 1-a buffer layer 111a can be formed on the substrate 110, as shown in FIG. 1. In addition, the 1-a buffer layer 111a can be formed of a silicon dioxide ($SiO_2$) material. A 1-b buffer layer 111b can be formed of a silicon nitride (SiNx) material, and can be disposed on the 1-a buffer layer 111a. A 1-c buffer layer 111c can be formed of a silicon dioxide ($SiO_2$) material, and can be disposed on the 1-b buffer layer 111b. A 1-d buffer layer 111d can be formed of a silicon nitride (SiNx) material, and can be disposed on the 1-c buffer layer 111c. A 1-e buffer layer 111e can be formed of a silicon dioxide ($SiO_2$) material, and can be disposed on the 1-d buffer layer 111d. Thus, when n is an even number greater than or equal to 2, the first buffer layer 111 can have a multiple-layer structure in which silicon oxide (SiOx) and silicon nitride (SiNx) are alternately stacked. In addition, the uppermost and lowermost layers of the first buffer layer 111, which includes multiple layers, can be formed of a silicon oxide (SiOx) material. For example, the first buffer layer 111 including a plurality of layers can include an upper layer contacting a first active layer 311 of the first thin-film transistor 310, a lower layer contacting the substrate 311, and an intermediate layer disposed between the upper layer and the lower layer. In addition, the upper layer and the lower layer can be formed of a silicon oxide (SiOx) material. In addition, the upper layer of the first buffer layer 111, which includes multiple layers, can be thicker than the lower layer and the intermediate layer. In the first buffer layer 111 including multiple layers, the thickness of the upper layer contacting the first active layer 311 of the first thin-film transistor 310 and the second active layer 321 of the second thin-film transistor 320 can be higher than that of each of the lower layer and the intermediate layer. For example, when the first buffer layer 111 is formed as a quintuple layer, as shown in FIG. 1, the 1-e buffer layer 111e contacting the first active layer 311 and the second active layer 321, can be the upper layer, and the 1-a buffer layer 111a contacting the substrate 110, can be the lower layer. In addition, the 1-b buffer layer 111b, the 1-c buffer layer 111c and the 1-d buffer layer 111d, disposed between the 1-a buffer layer 111a and the 1-e buffer layer 111e, can be intermediate layers. Here, the thickness of the 1-e buffer layer 111e as the upper layer, can be higher than the thickness of the 1-a buffer layer 111a as the lower layer, and the thicknesses of each of the 1-b buffer layer 111b, the 1-c buffer layer 111c and the 1-d buffer layer 111d as intermediate layers. For example, the thickness of the 1-e buffer layer 111e can be 3,000 Å, and the thickness of the 1-a buffer layer 111a can be 1,000 Å. In addition, the thickness of each of the 1-b buffer layer 111b, the 1-c buffer layer 111c and the 1-d buffer layer 111d can be 1,000 Å.

In addition, when the first buffer layer 111 including a plurality of layers, other layers excluding the upper layer contacting the first active layer 311 of the first thin-film transistor 310 and the second active layer 321 of the second thin-film transistor 320 can have the same thickness. For example, the 1-a buffer layer 111a, the 1-b buffer layer 111b, the 1-c buffer layer 111c, and the 1-d buffer layer 111d excluding the 1-e buffer layer 111e which contacts the first active layer 311 and the second active layer 321, can have the same thickness.

The first thin-film transistor 310 and the second thin-film transistor 320 can be disposed on the first buffer layer 111.

The first thin-film transistor 310 can include a first active layer 311, a first gate electrode 314, a first source electrode 312 and a first drain electrode 313, but the present invention is not limited thereto. For example, the first source electrode 312 can be a drain electrode and the first drain electrode 313 can be a source electrode.

The second thin-film transistor 320 can include a second active layer 321, a second gate electrode 324, a second source electrode 322 and a second drain electrode 323, but the present invention is not limited thereto. For example, the second source electrode 322 can be a drain electrode and the second drain electrode 323 can be a source electrode.

The first active layer 311 of the first thin-film transistor 310 and the second active layer 321 of the second thin-film transistor 320 can be disposed on the first buffer layer 111.

The first active layer 311 and the second active layer 321 can include polysilicon. For example, the first active layer 311 and the second active layer 321 can include low-temperature polysilicon (LTPS). Polysilicon material has low energy consumption and excellent reliability due to the high mobility thereof (100 $cm^2$/Vs or more), thus being applicable to gate drivers for driving elements that drive thin-film transistors for display elements, and/or multiplexers (MUX). In the display apparatus according to the embodiment of the present invention, active layer of driving thin-film transistor can include low-temperature polysilicon, but the present invention is not limited thereto. For example, low-temperature polysilicon can also be applied to active layer of switching thin-film transistor. In the embodiment of the present invention, the first active layer 311 of the first thin-film transistor 310 is applied as an active layer of the switching thin-film transistor, and the second active layer 321 of the second thin-film transistor 320 is applied as an active layer of a driving thin-film transistor. Thus, the first thin-film transistor 310 can be a switching thin-film transistor, and the second thin-film transistor 320 can be a driving thin-film transistor.

An amorphous silicon (a-Si) material can be deposited on the first buffer layer 111, and a polysilicon layer can be formed by a process of crystallizing. And, the first active layer 311 and the second active layer 321 can be formed by patterning the polysilicon.

The first active layer 311 can include a first channel region 311a in which a channel is formed during driving of the first thin-film transistor 310, and a first source region 311b and a first drain region 311c at both sides of the first channel region 311a. The first source region 311b can be a portion of the first active layer 311 that is connected to the first source electrode 312, and the first drain region 311c can be a portion of the first active layer 311 that is connected to the first drain electrode 313. The first source region 311b and the first drain region 311c can be formed by ion-doping (impurity doping)

of the first active layer 311. The first source region 311b and the first drain region 311c can be formed by ion-doping in a polysilicon material, and the first channel region 311a can be the portion of the polysilicon material that remains not ion-doped.

The second active layer 321 can include a second channel region 321a in which a channel is formed during driving of the second thin-film transistor 320, and a second source region 321b and a second drain region 321c at both sides of the second channel region 321a. The second source region 321b can be the portion of the second active layer 321 that is connected to the second source electrode 322, and the second drain region 321c can be the portion of the second active layer 321 that is connected to the second drain electrode 323. The second source region 321b and the second drain region 321c can be formed by ion-doping (for example, impurity doping) of the second active layer 321. The second source region 321b and the second drain region 321c can be formed by ion-doping in the polysilicon material, and the second channel region 321a can be a portion of the polysilicon material that remains not ion-doped.

The first gate insulating layer 112 can be disposed on the first active layer 311 of the first thin-film transistor 310 and the second active layer 321 of the second thin-film transistor 320. The first gate insulating layer 112 can have a single layer structure of silicon nitride (SiNx) or silicon oxide (SiOx), or a multi-layer structure thereof. A contact hole to respectively connect the first source electrode 312 and the first drain electrode 313 to the first source region 311b and the first drain region 311c of the first active layer 311 can be formed in the first gate insulating layer 112. In addition, a contact hole to respectively connect the second source electrode 322 and the second drain electrode 323 to the second source region 321b and the second drain region 321c of the second active layer 321 can be formed in the first gate insulating layer 112.

The first gate electrode 314 of the first thin-film transistor 310, the second gate electrode 324 of the second thin-film transistor 320, and a first capacitor electrode 141 of a storage capacitor 140 can be disposed on the first gate insulating layer 112.

The first gate electrode 314, the second gate electrode 324 and the first capacitor electrode 141 can include a single layer or multiple layers containing any one of molybdenum (Mo), copper (Cu), titanium (Ti), aluminum (Al), chromium (Cr), gold (Au), nickel (Ni) or neodymium (Nd), or an alloy thereof.

In the embodiment of the present invention, the second gate electrode 324 can have a larger number of layers than the first gate electrode 314 and the first capacitor electrode 141. The first gate electrode 314 and the first capacitor electrode 141 can include n layers. The second gate electrode 324 can include n+1 layers. Herein, n is a natural number such as 1, 2, 3 or 4. For example, the first gate electrode 314 and the first capacitor electrode 141 can include a single layer. Also, the second gate electrode 324 can include double layers. When the second gate electrode 324 includes double layers, the upper metal layer 324b is formed of titanium (Ti) or titanium nitride (TiNx) in order to prevent hydrogen from diffusing into the second active layer 321 of the second thin-film transistor 320. In the embodiment of the present invention, each of the first gate electrode 314 and the first capacitor electrode 141 can have a single-layer structure including any one of a metal such as molybdenum (Mo), copper (Cu), aluminum (Al), chromium (Cr), gold (Au), nickel (Ni), neodymium (Nd) or neodymium (Nd), or an alloy thereof. In addition, the second gate electrode 324 can have a double-layer structure of a lower metal layer 324a containing molybdenum or aluminum, and an upper metal layer 324b containing titanium or titanium nitride.

In the embodiment of the present invention, the display apparatus 100 can include the first thin-film transistor 310 and the second thin-film transistor 320, which contain a polysilicon material. The first thin-film transistor 310 can be a switching thin-film transistor, and the second thin-film transistor 320 can be a driving thin-film transistor. In the case of the switching thin-film transistor, the property value (sub-threshold swing, s-factor) (voltage/decade) at or below a threshold voltage should be low in order to perform a high-speed refresh. In the case of the driving thin-film transistor, the property value (s-factor) at or below a threshold voltage should be high in order to sustain the stable current driving of the display apparatus 100. In the case of the switching thin-film transistor, the property value (s-factor) at or below a threshold voltage should be low, so that a current change can be great even upon slight regulation of gate voltage. And, in the case of the switching thin-film transistor, the property value (s-factor) at or below a threshold voltage should be low, so that current leakage in the off state can be reduced. However, when the property value (s-factor) at or below a threshold voltage is low in the driving thin-film transistor, a region of driving voltage can be lowered, so that screen defects in the display apparatus 100 can occur. Therefore, in the case of the switching thin-film transistor, the thin-film transistor should be configured such that the property value (s-factor) at or below a threshold voltage is low. In the case of the driving thin-film transistor, the thin-film transistor should be configured such that the property value (s-factor) at or below a threshold voltage is high.

Therefore, the prevent inventors have conducted various experiments to obtain different the property values (s-factor) at or below a threshold voltage of thin-film transistors, and have configured thin-film transistors having different the property values (s-factor) at or below a threshold voltage, based on the various experiments. The first gate electrode 314 of the first thin-film transistor 310 used as a switching thin-film transistor can include n layers. In addition, the second gate electrode 324 of the second thin-film transistor 320 used as the driving thin-film transistor can include n+1 layers. In addition, the uppermost layer or the lowermost layer of the second gate electrode 324 including n+1 layers can be formed of titanium (Ti) or titanium nitride (TiNx). The titanium (Ti) or titanium nitride (TiNx) layer of the second gate electrode 324 can be a barrier layer that prevents hydrogen from diffusing into the second active layer 321 of the second thin-film transistor 320. Thus, by creating a difference in the degree of hydrogenation between the first active layer 311 of the first thin-film transistor 310 used as a switching thin-film transistor, and the second active layer 321 of the second thin-film transistor 320 used as a driving thin-film transistor, the property value (s-factor) at or below a threshold voltage of only the second thin-film transistor 320 used as the driving thin-film transistor can be increased.

Therefore, the gate electrode structure can be configured differently depending on the characteristics of the transistor, so that the property value (s-factor) at or below a threshold voltage of the desired transistor can be increased.

The first gate electrode 314 can be formed on the first gate insulating layer 112 such that the first gate electrode 314 overlaps the first channel region 311a of the first active layer 311. The first capacitor electrode 141 can be omitted, based on the driving characteristics of the display apparatus 100, the structure and type of the thin-film transistor, and the like. In addition, the second gate electrode 324 can be formed on the first gate insulating layer 112 such that the second gate electrode 324 overlaps the second channel region 321a of the second active layer 321. The first gate electrode 314, the lower metal layer 324a of the second gate electrode 324 and the first capacitor electrode 141 can be formed through the same process. In addition, the first gate electrode 314, the lower metal layer 324a of the second gate electrode 324, and the first capacitor electrode 141 can be formed of the same material and can be formed on the same layer.

The first interlayer insulating layer 113 can be disposed on the first gate insulating layer 112, the first gate electrode 314, the second gate electrode 324 and the first capacitor electrode 141.

The first interlayer insulating layer 113 can include a single layer of silicon nitride (SiNx) or silicon oxide (SiOx), or multiple layers thereof, but the present invention is not limited thereto. A contact hole to expose the first source region 311b and the first drain region 311c of the first active layer 311 can be formed in the first interlayer insulating layer 113. In addition, a contact hole to expose the second source region 321b and the second drain region 321c of the second active layer 321 can be formed in the first interlayer insulating layer 113.

The titanium (Ti) or titanium nitride (TiNx) layer, which is the uppermost layer or the lowermost layer of the second gate electrode 324 including n+1 layers, can be a barrier that is disposed to overlap the second channel region 321a of the second active layer 321 in order to block hydrogen diffused from the first interlayer insulating layer 113. In the embodiment of the present invention, the upper metal layer 324b of the second gate electrode 324 can be formed of a titanium (Ti) or titanium nitride (TiNx) layer. In addition, the second gate electrode 324 can be disposed to overlap the second channel region 321a. Thus, the titanium (Ti) or titanium nitride (TiNx) layer, which is the upper metal layer 324b of the second gate electrode 324, can block diffusion of hydrogen into the second channel region 321a through the first interlayer insulating layer 113 disposed on the second gate electrode 324. Because the diffusion of hydrogen is prevented, the property value (s-factor) at or below a threshold voltage of the second thin-film transistor 320 is increased. Therefore, the second thin-film transistor 320, as the driving thin-film transistor, can serve to maintain stable current driving of the display apparatus 100.

The second capacitor electrode 142 of the first capacitor electrode 140 can be disposed on the first interlayer insulating layer 113. The second capacitor electrode 142 can include a single layer or multiple layers formed of any one of molybdenum (Mo), copper (Cu), titanium (Ti), aluminum (Al), chromium (Cr), gold (Au), nickel (Ni), neodymium (Nd), or an alloy thereof. The second capacitor electrode 142 can be formed on the first interlayer insulating layer 113 so that the second capacitor electrode 142 overlaps the first capacitor electrode 141. In addition, the second capacitor electrode 142 can be formed of the same material as the first capacitor electrode 141. The second capacitor electrode 142 can be omitted, based on the driving characteristics of the display apparatus 100, the structure and type of the thin-film transistor, and the like.

The second buffer layer 114 can be disposed on the first interlayer insulating layer 113 and the second capacitor electrode 142. The second buffer layer 114 can include a single layer of silicon nitride (SiNx) or silicon oxide (SiOx) or multiple layers thereof. Referring to FIG. 1, the second buffer layer 114 can have a multiple-layer structure including a second buffer lower layer 114a and a second buffer upper layer 114b. In addition, the second buffer lower layer 114a can be formed as a silicon nitride (SiNx) layer, and the second buffer upper layer 114b can be formed as a silicon oxide (SiOx) layer.

The second buffer layer 114 can include a contact hole formed to expose the first source region 311b and the first drain region 311c of the first active layer 311. In addition, the second buffer layer 114 can include a contact hole formed to expose the second capacitor electrode 142 of the storage capacitor 140. Further, the second buffer layer 114 can include a contact hole formed to expose the first source region 321b and the first drain region 321c of the second active layer 321.

A third active layer 331 of the third thin-film transistor 330 can be disposed on the second buffer layer 114. The third thin-film transistor 330 can include the third active layer 331, the second gate insulating layer 115, a third gate electrode 334, a third source electrode 332 and a third drain electrode 333. In another embodiment of the present invention, the third source electrode 332 can be a drain electrode, and the third drain electrode 333 can be a source electrode.

The third active layer 331 can include a third channel region 331a in which a channel is formed during driving of the third thin-film transistor 330, and a third source region 331b and a third drain region 331c on both sides of the third channel region 331a. The third source region 311b can be a portion of the third active layer 331 that is connected to the third source electrode 332, and the third drain region 331c can be a portion of the third active layer 331 that is connected to the third drain electrode 333.

The third active layer 331 can be formed of an oxide semiconductor. Since an oxide semiconductor has a larger band gap than a silicon material, electrons cannot exceed the band gap in the off state, and thus off-current is low. Therefore, a thin-film transistor including an active layer formed of an oxide semiconductor can be suitable for a switching thin-film transistor that has a short on-time and a long off-time, but the present invention is not limited thereto. For example, the thin-film transistor including an active layer formed of an oxide semiconductor can be used as a driving thin-film transistor. Further, the thin-film transistor including an active layer formed of an oxide semiconductor is suitable for a high-resolution display element, since auxiliary capacity can be reduced due to the small off-current. Referring to FIG. 1, the third thin-film transistor 330 is used as a switching thin-film transistor of the display apparatus 100. The third active layer 331 can be composed of a metal oxide, for example, one of various metal oxides such as indium-gallium-zinc oxide (IGZO). The third active layer 331 of the third thin-film transistor 330 is described to be formed based on an IGZO layer, on the assumption that the third active layer 331 is formed of IGZO, among various metal oxides, but the present invention is not limited thereto. For example, the third active layer 331 can be formed of other metal oxides such as IZO (indium zinc oxide), IGTO (indium-gallium-tin-oxide), or IGO (indium-gallium-oxide), rather than IGZO.

The third channel region 331a of the third active layer 331 can be disposed so as to overlap the third gate electrode 334. In addition, the third source region 331b and the third drain region 331c of the third active layer 331 can be disposed on both sides of the third channel region 331a. In addition, the second gate insulating layer 115 can be disposed between the third gate electrode 334 and the third active layer 331. In addition, the second gate insulating layer 115 can be disposed so as to overlap the third gate electrode 334 and the third channel region 331a of the third active layer 331.

The second gate insulating layer 115 and the third gate electrode 334 can be formed in the same pattern by etching the insulating material layers and the metal material layers using a photoresist pattern (PR) as a mask. The second gate insulating layer 115 can be disposed on the third active layer 331. The second gate insulating layer 115 can include a single layer of silicon nitride (SiNx) or silicon oxide (SiOx), or multiple layers thereof. The second gate insulating layer 115 can be patterned so as to overlap the third channel region 331a of the third active layer 331.

The third gate electrode 334 can be disposed on the second gate insulating layer 115. The third gate electrode 334 can include a single layer or multiple layers containing any one of molybdenum (Mo), copper (Cu), titanium (Ti), aluminum (Al), chromium (Cr), gold (Au), nickel (Ni), neodymium (Nd), or an alloy thereof. The third gate electrode 334 can be patterned to overlap the third active layer 331 and the second gate insulating layer 115. The third gate electrode 334 can be patterned to overlap the third channel region 331a of the third active layer 331. In addition, the second gate insulating layer 115 can be patterned to overlap the third channel region 331a of the third active layer 331. Thus, the third gate electrode 334 and the second gate insulating layer 115 can overlap the third channel region 331a of the third active layer 331.

The second interlayer insulating layer 116 can be disposed on the second buffer layer 114, the third active layer 331 and the gate electrode 334. The second interlayer insulating layer 116 can include a contact hole to expose the first active layer 311 of the first thin-film transistor 310, the second active layer 321 of the second thin-film transistor 320, and the third active layer 331 of the third thin-film transistor 330. For example, the second interlayer insulating layer 116 can include a contact hole formed to expose the first source region 311b and the first drain region 311c of the first active layer 311 in the first thin-film transistor 310. Also, the second interlayer insulating layer 116 can include a contact hole formed to expose the second source region 321b and the second drain region 321c of the second active layer 321 of the second thin-film transistor 320. In addition, the second interlayer insulating layer 116 can include a contact hole to expose the third source region 331b and the third drain region 331c of the third active layer 331 of the third thin-film transistor 330. The second interlayer insulating layer 116 can include a single layer formed of silicon nitride (SiNx) or silicon oxide (SiOx), or multiple layers thereof.

The connection electrode 150, the first source electrode 312 and the first drain electrode 313 of the first thin-film transistor 310, and the second source electrode 322 and the second drain electrode 323 of the second thin-film transistor 320 can be disposed on the second interlayer insulating layer 116. In addition, the third source electrode 332 and the third drain electrode 333 of the third thin-film transistor 330 can be disposed on the second interlayer insulating layer 116.

The first source electrode 312 and the first drain electrode 313 of the first thin-film transistor 310 can be connected to the first active layer 311 of the first thin-film transistor 310 through the contact hole formed in the first gate insulating layer 112, the first interlayer insulating layer 113, the second buffer layer 114 and the second interlayer insulating layer 116. Thus, the first source electrode 312 of the first thin-film transistor 310 can be connected to the first source region 311b of the first active layer 311 through the contact hole formed in the first gate insulating layer 112, the first interlayer insulating layer 113, the second buffer layer 114 and the second interlayer insulating layer 116. In addition, the first drain electrode 313 of the first thin-film transistor 310 can be connected to the first drain region 311c of the first active layer 311 through the contact hole formed in the first gate insulating layer 112, the first interlayer insulating layer 113, the second buffer layer 114 and the second interlayer insulating layer 116.

The second source electrode 322 and the second drain electrode 323 of the second thin-film transistor 320 can be connected to the second active layer 321 of the second thin-film transistor 320 through the contact hole formed in the first gate insulating layer 112, the first interlayer insulating layer 113, the second buffer layer 114 and the second interlayer insulating layer 116. Therefore, the second source electrode 322 of the second thin-film transistor 320 can be connected to the second source region 321b of the second active layer 321 through the contact hole formed in the second gate insulating layer 112, the first interlayer insulating layer 113, the second buffer layer 114 and the second interlayer insulating layer 116. In addition, the second drain electrode 323 of the second thin-film transistor 320 can be connected to the second drain region 321c of the second active layer 311 through the contact hole formed in the first gate insulating layer 112, the first interlayer insulating layer 113, the second buffer layer 114 and the second interlayer insulating layer 116.

In addition, the connection electrode 150 can be electrically connected to the third drain electrode 333 of the third thin-film transistor 330. In addition, the connection electrode 150 can be electrically connected to the second capacitor electrode 142 of the storage capacitor 140 through the contact hole formed in the second buffer layer 114 and the second interlayer insulating layer 116. Therefore, the connection electrode 150 can electrically connect the second capacitor electrode 142 of the storage capacitor 140 to the third drain electrode 333 of the third thin-film transistor 330.

In addition, the third source electrode 332 and the third drain electrode 333 of the third thin-film transistor 330 can be connected to the third active layer 331 through the contact hole formed in the second interlayer insulating layer 116. Thus, the third source electrode 332 of the third thin-film transistor 330 can be connected to the third source region 331b of the third active layer 331 through the contact hole formed in the second interlayer insulating layer 116, and the third drain electrode 333 of the third thin-film transistor 330 can be connected to the third drain region 331c of the third active layer 331 through the contact hole formed in the second interlayer insulating layer 116.

The connection electrode 150, the first source electrode 312 and the first drain electrode 313 of the first thin-film transistor 310, the second source electrode 322 and the second drain electrode 323 of the second thin-film transistor 320, and the third source electrode 332 and the third drain electrodes 333 of the third thin-film transistor 330 can be formed through the same process. In addition, the connection electrode 150, the first source electrode 312 and the first drain electrode 313 of the first thin-film transistor 310, the second source electrode 322 and the second drain electrode 323 of the second thin-film transistor 320, and the third source electrode 332 and the third drain electrode 333 of the third thin-film transistor 330 can be formed of the same material. Each of the connection electrode 150, the first source electrode 312 and the first drain electrode 313 of the first thin-film transistor 310, the second source electrode 322 and the second drain electrode 323 of the second thin-film transistor 320, and the third source electrode 332 and the third drain electrode 333 of the third thin-film transistor 330 can include a single layer or multiple layers containing any one of molybdenum (Mo), copper (Cu), titanium (Ti), aluminum (Al), chromium (Cr), gold (Au), nickel (Ni), neodymium (Nd), or an alloy thereof. For example, each of the connection electrode 150, the first source electrode 312 and the first drain electrode 313 of the first thin-film transistor 310, the second source electrode 322 and the second drain electrode 323 of the second thin-film transistor 320, and the third source electrode 332 and the third drain electrode 333 of the third thin-film transistor 330 can have a three-layer structure of titanium (Ti)/aluminum (Al)/titanium (Ti), but the present invention is not limited thereto.

The connection electrode 150 can be connected to and integrated with the third drain electrode 333 of the third thin-film transistor 330.

The first planarization layer 117 can be disposed on the connection electrode 150, the first source electrode 312 and the first drain electrode 313 of the first thin-film transistor 310, the second source electrode 322 and the second drain electrode 323 of the second thin-film transistor 320, the third source electrode 332 and the third drain electrode 333 of the third thin-film transistor 330, and the second interlayer insulating layer 116. As shown in FIG. 1, a contact hole to expose the second drain electrode 323 of the second thin-film transistor 320 can be formed in the first planarization layer 117, but the present invention is not limited thereto. For example, a contact hole to expose the second source electrode 322 of the second thin-film transistor 320 can be formed in the first planarization layer 117. The first planarization layer 117 can be an organic material layer for planarizing and protecting the upper portions of the first thin-film transistor 310, the second thin-film transistor 320 and the third thin-film transistor 330. For example, the first planarization layer 117 can be formed of an organic material such as an acrylic resin, an epoxy resin, a phenolic resin, a polyamide resin, a polyimide resin, or the like, but it is not limited thereto.

The auxiliary electrode 160 can be disposed on the first planarization layer 117. The auxiliary electrode 160 can be connected to the second drain electrode 323 of the second thin-film transistor 320 through the contact hole in the first planarization layer 117. The auxiliary electrode 160 can electrically connect the second thin-film transistor 320 to the first electrode 170. The auxiliary electrode 160 can include a single layer or multiple layers containing any one of molybdenum (Mo), copper (Cu), titanium (Ti), aluminum (Al), chromium (Cr), gold (Au), nickel (Ni), neodymium (Nd) or an alloy thereof. The auxiliary electrode 160 can be formed of the same material as the second source electrode 322 and the second drain electrode 323 of the second thin-film transistor 320.

The second planarization layer 118 can be disposed on the auxiliary electrode 160 and the first planarization layer 117. In addition, as shown in FIG. 1, a contact hole to expose the auxiliary electrode 160 can be formed in the second planarization layer 118. The second planarization layer 118 can be an organic material layer for planarizing the upper portions of the first thin-film transistor 310, the second thin-film transistor 320 and the third thin-film transistor 330. For example, the second planarization layer 118 can be formed of an organic material selected from the group consisting of an acrylic resin, an epoxy resin, a phenolic resin, a polyamide resin, a polyimide resin and the like.

The first electrode 170 can be disposed on the second planarization layer 118. The first electrode 170 can be electrically connected to the auxiliary electrode 160 through the contact hole formed in the second planarization layer 118. Thus, the first electrode 170 can be connected to the auxiliary electrode 160 through the contact hole formed in the second planarization layer 118 and thereby can be electrically connected to the second thin-film transistor 320. The second thin-film transistor 320 connected to the first electrode 170 can be a driving thin-film transistor.

The first electrode 170 can have a multiple-layer structure including a transparent conductive film and an opaque conductive film having high reflection efficiency. The transparent conductive film can be formed of a material having a relatively large work function, such as indium-tin-oxide (ITO) or indium-zinc-oxide (IZO). In addition, the opaque conductive film can have a single-layer or multiple-layer structure including aluminum (Al), silver (Ag), copper (Cu), lead (Pb), molybdenum (Mo), titanium (Ti) or an alloy thereof. For example, the first electrode 170 can include a transparent conductive film, an opaque conductive film and a transparent conductive film which are formed sequentially, but the present invention is not limited thereto. For example, the first electrode 170 can include a transparent conductive film and an opaque conductive film which are formed sequentially.

Since the display apparatus 100 according to the embodiment of the present invention is a top-emission-type display apparatus, the first electrode 170 can be an anode. When the display apparatus 100 is a bottom-emission type, the first electrode 170 disposed on the second planarization layer 118 can be a cathode.

A bank 180 can be disposed on the first electrode 170 and the second planarization layer 118. An opening to expose the first electrode 170 can be formed in the bank 180. Since the bank 180 can define an emission region of the display apparatus 100, the bank 180 can be referred to as a "pixel-defining film". A spacer 190 can be further disposed on the bank 180. In addition, a light-emitting structure 200 including a light-emitting layer can further be disposed on the first electrode 170.

The light-emitting structure 200 can include a hole layer, a light-emitting layer and an electron layer, which are stacked on the first electrode 170 in that order or in the reverse order. In addition, the light-emitting structure 200 can include first and second light-emitting structures such that a charge generation layer is interposed therebetween. In this case, any one of the first and second light-emitting structures generates blue light, and the other of the first and second light-emitting structures generates yellow-green light, thereby generating white light. The white light generated in the light-emitting structure 200 is incident upon a color filter disposed on an upper portion of the light-emitting structure 200, thereby forming a color image. In another embodiment, each light-emitting structure 200 generates color light corresponding to each sub-pixel, so that a color image can be realized without a separate color filter. For example the light-emitting structure 200 of the red R sub-pixel generates red light, the light-emitting structure 200 of the green G sub-pixel generates green light, and the light-emitting structure 200 of the blue B sub-pixel generates blue light.

A second electrode 210 can be further disposed on the light-emitting structure 200. The second electrode 210 can be disposed on the light-emitting structure 200 such that the light-emitting structure 200 is interposed between the first electrode 170 and the second electrode 210. In the display apparatus 100 according to the embodiment of the present invention, the second electrode 210 can be a cathode.

An encapsulating element 220 to prevent moisture permeation can be further disposed on the second electrode 210.

The encapsulating element 220 can include a first inorganic encapsulating layer 220a, a second organic encapsulating layer 220b and a third inorganic encapsulating layer 220c. The first inorganic encapsulating layer 220a of the encapsulating element 220 can be disposed on the second electrode 210. In addition, the second organic encapsulating layer 220b can be disposed on the first inorganic encapsulating layer 220a. In addition, the third inorganic encapsulating layer 220c can be disposed on the second inorganic encapsulating layer 220b. Each of the first inorganic encapsulating layer 220a and the third inorganic encapsulating layer 220c of the encapsulating element 220 can be formed of an inorganic material such as silicon nitride (SiNx) or silicon oxide (SiOx). The second organic encapsulating layer 220b of the encapsulating element 220 can be formed of an organic material such as an acrylic resin, an epoxy resin, a phenolic resin, a polyamide resin, or a polyimide resin.

FIGS. 2A to 2F are cross-sectional views illustrating a method for manufacturing the display apparatus 100 according to the embodiment of the present invention. The description will be given with reference to FIG. 1 along with FIGS. 2A to 2F, and redundant descriptions will be omitted or briefly explained.

Figure 2A:
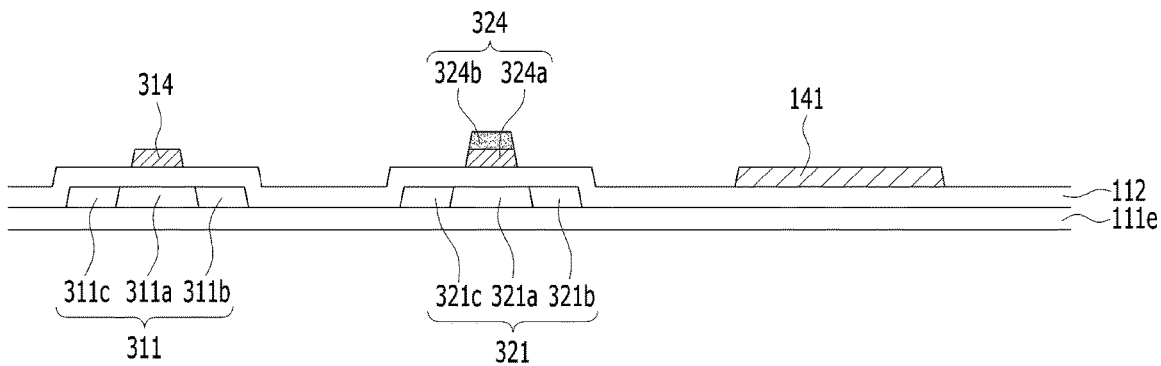
FIGS. 2A to 2F are cross-sectional views illustrating a method of manufacturing the display apparatus according to the embodiment of the present invention.

Referring to FIG. 2A, the method of manufacturing the display apparatus 100 according to the embodiment of the present invention can include a step of forming the first active layer 311 of the first thin-film transistor 310 and the second active layer 321 of the second thin-film transistor 320 on the 1-e buffer layer 111e of the first buffer layer 111. The first active layer 311 and the second active layer 321 can include polysilicon (poly-Si). After the amorphous silicon (a-Si) material is deposited on the 1-e buffer layer 111e, polysilicon can be formed through a crystallization process. Then, the first active layer 311 and the second active layer 321 can be formed by patterning the polysilicon.

The first gate insulating layer 112 can be formed on the first active layer 311 and the second active layer 321.

The first gate electrode 314 of the first thin-film transistor 310, the second gate electrode 324 of the second thin-film transistor 320 and the first capacitor electrode 141 of the storage capacitor 140 can be formed on the first gate insulating layer 112. The first gate electrode 314 of the first thin-film transistor 310 can be disposed so as to overlap the first channel region 311a of the first active layer 311. In addition, the second gate electrode 324 of the second thin-film transistor 320 can be disposed so as to overlap the second channel region 321a of the second active layer 321. Each of the first gate electrode 314 and the first capacitor electrode 141 can have a single-layer structure. In addition, the second gate electrode 324 can have a double-layer structure including a lower metal layer 324a and an upper metal layer 324b. The first gate electrode 314, the lower metal layer 324a of the second gate electrode 324 and the first capacitor electrode can be formed of the same material. The upper metal layer 324b of the second gate electrode 324 can be formed of a different material, for example, titanium (Ti) or titanium nitride (TiNx), from the lower metal layer 324a. In FIG. 2A, the first gate electrode 314 and the first capacitor electrode 141 are formed as a single layer and the second gate electrode 324 is formed as a double layer, but the present invention is not limited thereto. For example, the first gate electrode 314 and the first capacitor electrode 141 can include two or more layers, and the second gate electrode 324 can include three or more layers. As such, the first gate electrode 314 and the first capacitor electrode 141 can include n or more layers. In addition, the second gate electrode 324 can include n+1 or more layers, wherein n is a natural number such as 1, 2, 3 or 4 or positive number or integer. In addition, the uppermost metal layer of the second gate electrode 324 can be formed of titanium (Ti) or titanium nitride (TiNx). The second thin-film transistor 320 including the second gate electrode 324 including n+1 layers is used as a driving thin-film transistor, and the first thin-film transistor 310 including the first gate electrode 314 including n layers is used as a switching thin-film transistor.

The first gate electrode 314 can be disposed to overlap the first channel region 311a of the first active layer 311, and the second gate electrode 324 can be disposed to overlap the second channel region 321a of the second active layer 321.

Figure 2B:
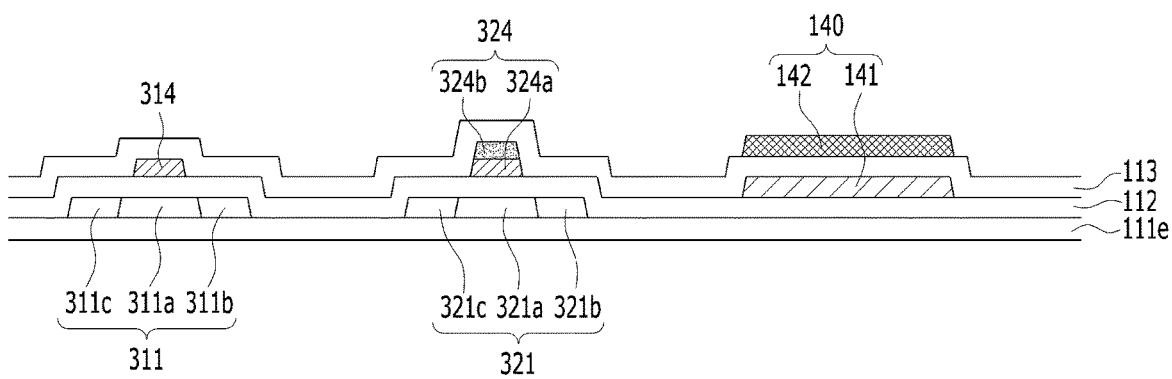

Referring to FIG. 2B, the first interlayer insulating layer 113 can be formed on the first gate electrode 314, the second gate electrode 324 and the first capacitor electrode 141. In addition, the second capacitor electrode 142 can be formed on the first interlayer insulating layer 113. The second capacitor electrode 142 can be disposed to overlap the first capacitor electrode 141 such that the first interlayer insulating layer 113 is interposed therebetween.

Figure 2C:
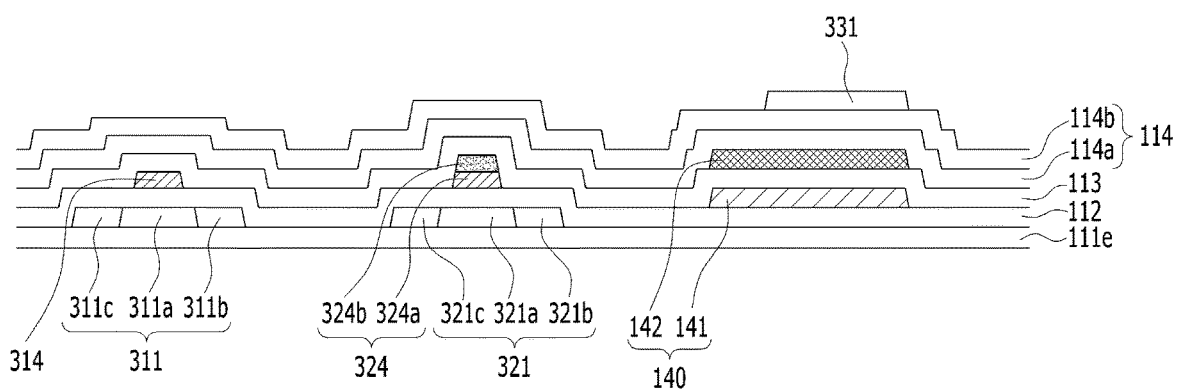

Referring to FIG. 2C, the second buffer lower layer 114a of the second buffer layer 114 can be formed on the second capacitor electrode 142 and the first interlayer insulating layer 113. In addition, the second buffer upper layer 114b can be formed on the second buffer lower layer 114a. In FIG. 2C, the second buffer layer 114 has a double-layer structure including the second buffer lower layer 114a and the second buffer upper layer 114b, but the present invention is not limited thereto. For example, the second buffer layer 114 can include a single layer or more than two layers. The third active layer 331 of the third thin-film transistor 330 can be formed on the second buffer layer 114. The third active layer 331 can be disposed to overlap the first capacitor electrode 141 and the second capacitor electrode 142. In addition, the third active layer 331 can be formed of an oxide semiconductor.

Figure 2D:
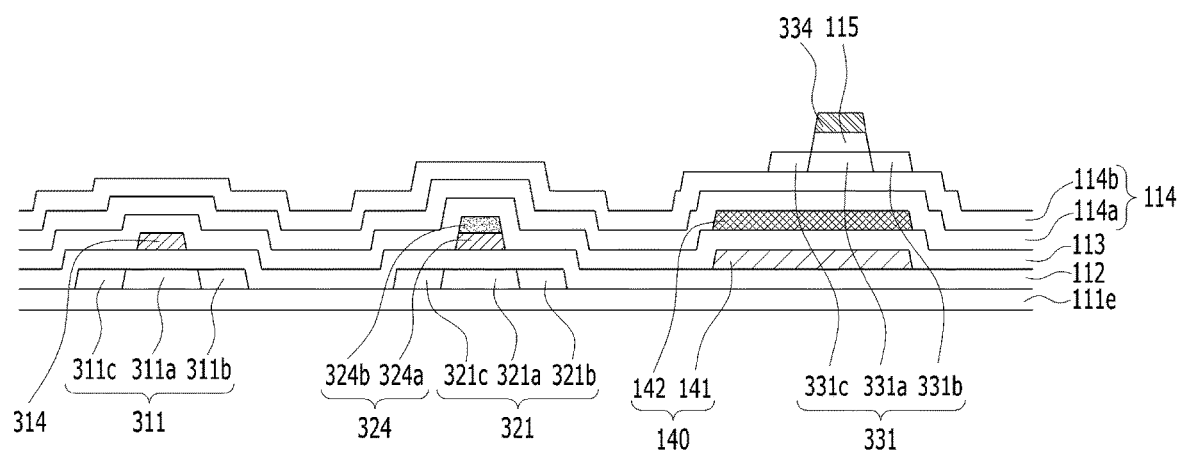

Referring to FIG. 2D, the second gate insulating layer 115 and the third gate electrode 334 of the third thin-film transistor 330 can be formed on the third active layer 331. An insulating material layer and a metal material layer can be sequentially formed over the entire surface of the substrate including the third active layer 331, and a photoresist pattern can be formed on the metal material layer. The insulating material layer can be formed using a PECVD method, and the metal material layer can be formed using a sputtering method. The third gate electrode 334 can be formed by wet-etching the metal material layer using the photoresist pattern PR as a mask. The wet etchant for etching the metal material layer can be a substance that selectively etches molybdenum (Mo), copper (Cu), titanium (Ti), aluminum (Al), chromium (Cr), gold (Au), nickel (Ni), neodymium (Nd), or an alloy thereof, which constitutes the metal material layer but does not etch the insulating material layer. The second gate insulating layer 115 can be formed by dry-etching the insulating material layer using the photoresist pattern PR and the third gate electrode 334 as masks. The insulating material layer can be etched through the dry etching process to form the pattern of the second gate insulating layer 115 on the third active layer 331. In addition, the portion of the third active layer 331 exposed through the patterned second gate insulating layer 115 can be made conductive through dry etching. The first active layer 331 including the third channel region 331a, which is not made conductive, corresponding to the region where the third gate electrode 334 is formed, and a third source region 331b and a third drain region 331c, which are made conductive at both ends of the third active layer 331, can be formed. In the display apparatus 100 according to embodiments of the present disclosure, the first thin-film transistor 330 including the third active layer 331 formed of an oxide semiconductor is used as a switching thin-film transistor.

Figure 2E:
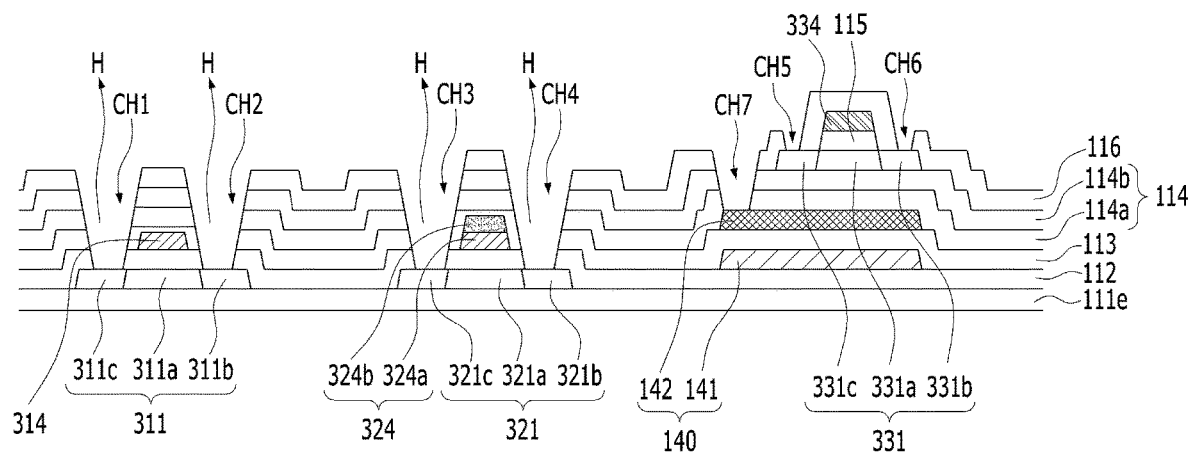

Referring to FIG. 2E, the second interlayer insulating layer 116 can be formed on the third gate electrode 334, the third active layer 331 and the second buffer layer 114. A first contact hole CH1 and a second contact hole CH2 to expose the first active layer 311 of the first thin-film transistor 310 can be formed by etching the second interlayer insulating layer 116, the second buffer layer 114, the first interlayer insulating layer 113 and the first gate insulating layer 112. In addition, a third contact hole CH3 and a fourth contact hole CH4 to expose the second active layer 321 of the second thin-film transistor 320 can be formed by etching the second interlayer insulating layer 116, the second buffer layer 114, the first interlayer insulating layer 113 and the first gate insulating layer 112. In addition, a fifth contact hole CH5 and a sixth contact hole CH6 to expose the third active layer 331 of the third thin-film transistor 330 can be formed by etching the second interlayer insulating layer 116. In addition, a seventh contact hole CH7 to expose the second capacitor electrode 142 of the storage capacitor 140 can be formed by etching the second interlayer insulating layer 116 and the second buffer layer 114.

The first drain region 311c of the first active layer 311 can be exposed through the first contact hole CH1, and the first source region 311b of the first active layer 311 can be exposed through the second contact hole CH2. In addition, the second drain region 321c of the second active layer 321 can be exposed through the third contact hole CH3, and the second source region 321b of the second active layer 321 can be exposed through the fourth contact hole CH4. In addition, the third drain region 331c of the third active layer 331 can be exposed through the fifth contact hole CH5, and the third source region 331b of the third active layer 331 can be exposed through the sixth contact hole CH6.

Portions of the first active layer 311 of the first thin-film transistor 310 and the second active layer 321 of the second thin-film transistor 320 exposed through the first contact hole CH1 and the second contact hole CH2 can be heat-treated. Hydrogen can be removed by heat-treating the first active layer 311 and the second active layer 321 exposed through the first contact hole CH1 and the second contact hole CH2. For example, hydrogen present in the first source region 311b and the first drain region 311c of the first active layer 311 and in the second source region 321b and the second drain region 321c of the active layer 321, exposed through the first contact hole CH1 and the second contact hole CH2, can be removed through a heat treatment process. The heat treatment process can be carried out at a temperature of 250° C. to 370° C., and the temperature does not limit the details of the disclosure.

Figure 2F:
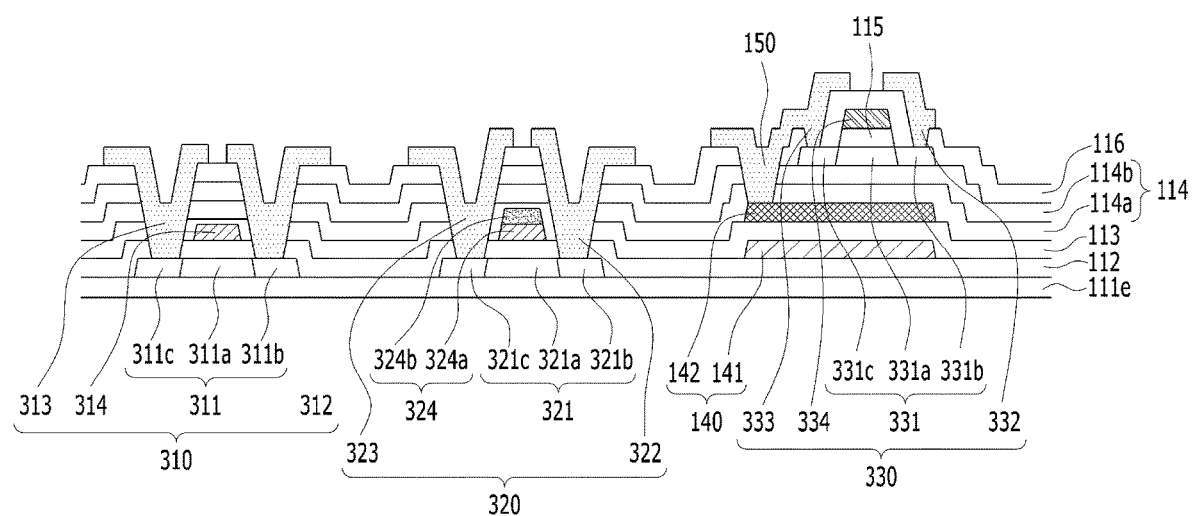

Referring to FIG. 2F, the first source electrode 312 and the first drain electrode 313 of the first thin-film transistor 310, the second source electrode 322 and the second drain electrode 323 of the second thin-film transistor 320, the third source electrode 332 and the third drain electrode 333 of the third thin-film transistor 330, and the connection electrode 150 can be formed on the second interlayer insulating layer 116. As shown in FIG. 2F, the upper metal layer 324b of the second gate electrode 324 formed of titanium (Ti) or titanium nitride (TiNx) can prevent hydrogen from diffusing into the second channel region 321a of the second active layer 321. The upper metal layer 324b of the second gate electrode 324 formed of titanium (Ti) or titanium nitride (TiNx) creates the difference between the degree of diffusion of hydrogen into the first channel region 311a of the first active layer 311 and the degree of diffusion of hydrogen into the second channel region 321a of the second active layer 321. Thus, the s-factor value at or below a threshold value of only the second thin-film transistor 320 used as the driving thin-film transistor can be increased. As such, the degree of diffusion of hydrogen can be selectively varied according to a design using the gate metal layer formed of titanium (Ti) or titanium nitride (TiNx). Accordingly, the gate metal layer formed of titanium (Ti) or titanium nitride (TiNx) is not formed in the first gate electrode 314 of the first thin-film transistor 310, which is used as a switching thin-film transistor, whereas the gate metal layer formed of titanium (Ti) or titanium nitride (TiNx) is formed in the second gate electrode 324 of the thin-film transistor 320, which is used as a driving thin-film transistor, so that the degree of diffusion of hydrogen therebetween can be made different.

The first source electrode 312 of the first thin-film transistor 310 can contact the first source region 311b of the first active layer 311 exposed through the second contact hole CH2, and the first drain electrode 313 of the first thin-film transistor 310 can contact the first drain region 311c of the first active layer 311 exposed through the first contact hole CH1. In addition, the second source electrode 322 of the second thin-film transistor 320 can contact the second source region 321b of the second active layer 321 exposed through the fourth contact hole CH4, and the second drain electrode 323 of the second thin-film transistor 320 can contact the third drain region 321c of the second active layer 321 exposed through the third contact hole CH3. In addition, the third source electrode 332 of the third thin-film transistor 330 can contact the third source region 331b of the third active layer 331 exposed through the sixth contact hole CH6, and the third drain electrode 333 of the thin-film transistor 330 can contact the third drain region 331c of the third active layer 331 exposed through the fifth contact hole CH5. In addition, the connection electrode 150 can contact the second capacitor electrode 142 of the storage capacitor 140 exposed through the seventh contact hole CH7.

In addition, as shown in FIG. 1, the first planarization layer 117, the auxiliary electrode 160, the second planarization layer 118, the first electrode 170, the bank 180, the spacer 190, the light-emitting structure 200, the second electrode 210 and the encapsulating element 220 can be formed on the first source electrode 312, the first drain electrode 313, the second source electrode 322, the second drain electrode 323, the third source electrode 332, the third drain electrode 333 and the connection electrode 150.

Figure 3:
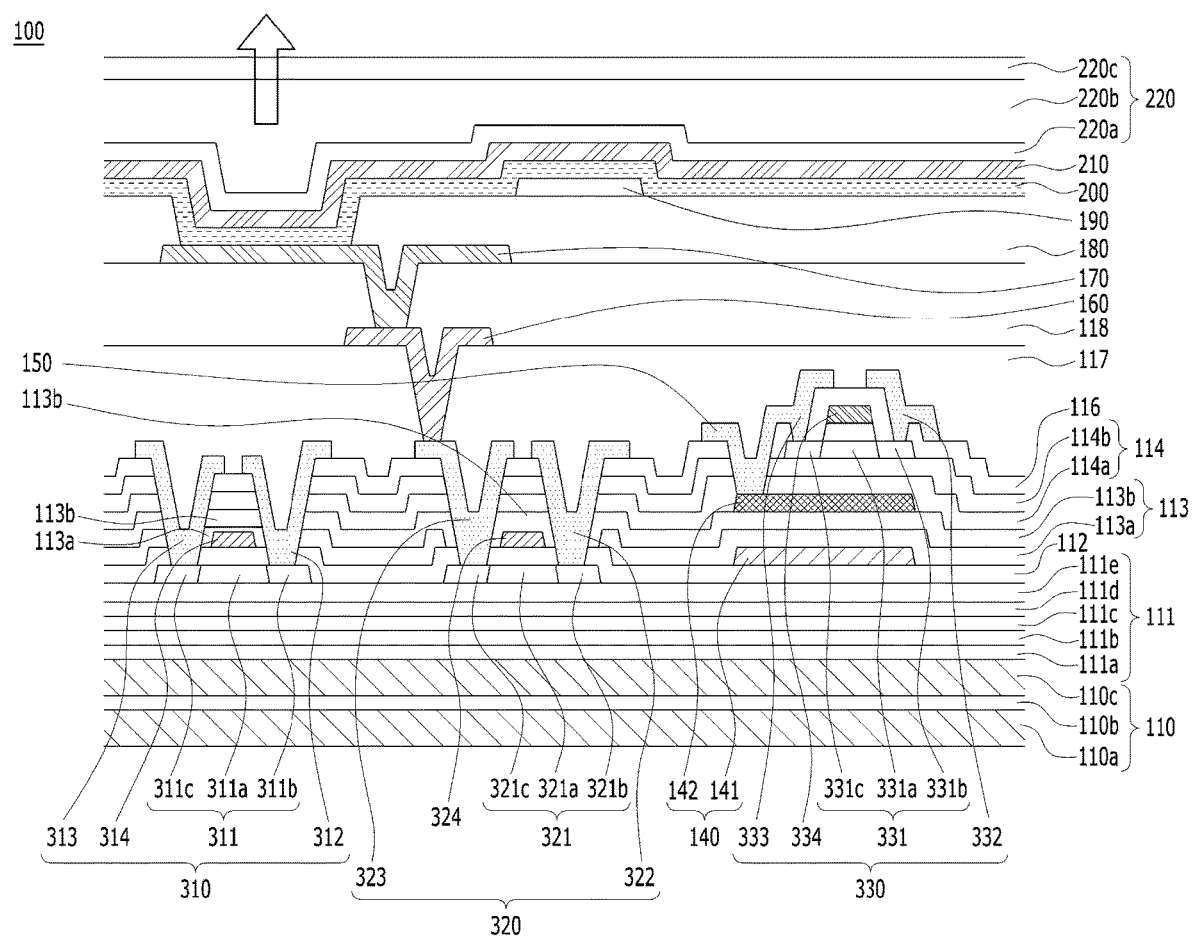
FIG. 3 is a cross-sectional view illustrating a display apparatus according to another embodiment of the present invention.

FIG. 3 is a sectional view illustrating a display apparatus 100 according to another embodiment of the present invention. The description will be given with reference to FIG. 1 along with FIG. 3, and redundant descriptions will be omitted or briefly explained.

For example, the substrate 110, the first buffer layer 111, the first gate insulating layer 112, the second buffer layer 114, the second gate insulating layer 115, the second interlayer insulating layer 116, the first planarization layer 117, the second planarization layer 118, the connection electrode 150, the auxiliary electrode 160, the first electrode 170, the bank 180, the spacer 190, the light-emitting structure 200, the second electrode 210, the encapsulating element 220, the storage capacitor 140, the first thin-film transistor 310 and the third thin-film transistor 330 are substantially the same.

Therefore, a redundant description of the configuration of FIG. 2 that is substantially the same as that of FIG. 1 will be omitted or briefly explained.

Referring to FIG. 3, the display apparatus 100 according to another embodiment of the present invention can include the substrate 110, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the spacer 190, the light-emitting structure 200, the second electrode 210, the encapsulating element 220, the storage capacitor 140, the connection electrode 150, the first thin-film transistor 310, the second thin-film transistor 320 and the third thin-film transistor 330. In addition, the active layer 311 of the first thin-film transistor 310 and the second active layer 321 of the second thin-film transistor 320 can be formed of polysilicon material, and the third active layer 331 of the third thin-film transistor 330 can be formed of an oxide semiconductor. In addition, the first thin-film transistor 310 and the third thin-film transistor 330 can be used as switching thin-film transistors, and the second thin-film transistor 320 can be connected to the first electrode 170, and can be used as a driving thin-film transistor.

In the display apparatus 100 according to another embodiment of the present invention, the first interlayer insulating layer 113 can have a double-layer structure including a first interlayer lower insulating layer 113a and a first interlayer upper insulating layer 113b. The first interlayer lower insulating layer 113a can be formed of a silicon nitride (SiNx) material, and the first interlayer upper insulating layer 113b can be formed of a silicon oxide (SiOx) material. Hydrogen generated in the first interlayer lower insulating layer 113a formed of a silicon nitride (SiNx) material can diffuse into the second channel region 321a of the second active layer 321.

Therefore, as shown in FIG. 3, in a region overlapping the second active layer 321, the first interlayer lower insulating layer 113a formed of a silicon nitride (SiNx) material can be removed, and only the first interlayer upper insulating layer 113b formed of a silicon oxide (SiOx) material can be disposed. Referring to FIG. 3, the first interlayer upper insulating layer 113b can be disposed to directly contact the upper surface and both side surfaces of the second gate electrode 324 disposed to overlap the second channel region 321a. In addition, the first interlayer upper insulating layer 113b can be formed to surround the upper surface and both side surfaces of the second gate electrode 324.

The upper surface of the second gate electrode 324 can directly contact the first interlayer upper insulating layer 113b of the first interlayer insulating layer 113, and the upper surface of the first gate electrode 314 can directly contact the first interlayer lower insulating layer 113a of the first interlayer insulating layer 113. Therefore, the first interlayer insulating layer 113 in the region corresponding to the first gate electrode 314 can have a double-layer structure, and the first interlayer insulating layer 113 in the region corresponding to the second gate electrode 324 can have a single-layer structure.

In addition, the first interlayer insulating layer 113 interposed between the first capacitor electrode 141 and the capacitor electrodes 142 of the storage capacitor 140 can include a first interlayer upper insulating layer 113b and a first interlayer lower insulating layer 113a. Therefore, the second capacitor electrode 142 can overlap the first capacitor electrode 141 such that the first interlayer upper insulating layer 113b and the first interlayer lower insulating layer 113a of the first interlayer insulating layer 113 are interposed therebetween.

Regarding the display apparatus 100 according to another embodiment of the present invention, only the first interlayer upper insulating layer 113b formed of a silicon oxide (SiOx) material can be formed in the region overlapping the second active layer 321 of the second thin-film transistor 320, in order to block diffusion of hydrogen that can decrease the s-factor value of the second thin-film transistor 320, which is used as a driving thin-film transistor. In addition, a first interlayer lower insulating layer 113a formed of a silicon nitride (SiNx) material and a second interlayer upper insulating layer 113b formed of a silicon nitride (SiNx) material having a lower hydrogen content can be formed in a region overlapping the first active layer 311 of the first thin-film transistor 310 used as a switching thin-film transistor. For example, the first interlayer upper insulating layer 113b can be formed of a silicon dioxide ($SiO_2$) material.

As shown in FIG. 3, the first interlayer insulating layer 113, disposed on the first gate electrode 314 of the first thin-film transistor 310 used as a switching thin-film transistor, and the first interlayer insulating layer 113 (first interlayer upper insulating layer 113b), disposed on the second gate electrode 324 of the second thin-film transistor 320, which is used as a driving thin-film transistor, are formed in different configurations, thus creating the difference between the degree of diffusion of hydrogen into the first channel region 311a of the first active layer 311 and the degree of diffusion of hydrogen into the second channel region 321a of the second active layer 321. The second interlayer lower insulating layer 113b formed of only silicon oxide (SiOx) having a lower hydrogen content than silicon nitride (SiNx) can prevent the diffusion of hydrogen into the second active layer 321 of the second thin-film transistor 320.

Therefore, the s-factor value at or below the threshold voltage of the first thin-film transistor 310 can be different from the s-factor value at the threshold voltage or less of the second thin-film transistor 320. There is an advantage in that the characteristics of the device can be made different by controlling the s-factor value at or below the threshold voltage of the second thin-film transistor 320 to be larger. As described above, by differently designing the structure of the insulating layer on the gate electrode according to the intended use of the thin-film transistor, the characteristics of the thin-film transistors can be made different. FIGS. 4A to 4F are sectional views illustrating a method of manufacturing the display apparatus 100 according to another embodiment of the present invention. The description will be given with reference to FIG. 1 along with FIGS. 4A to 4F and redundant descriptions will be omitted or briefly explained.

Figure 4A:
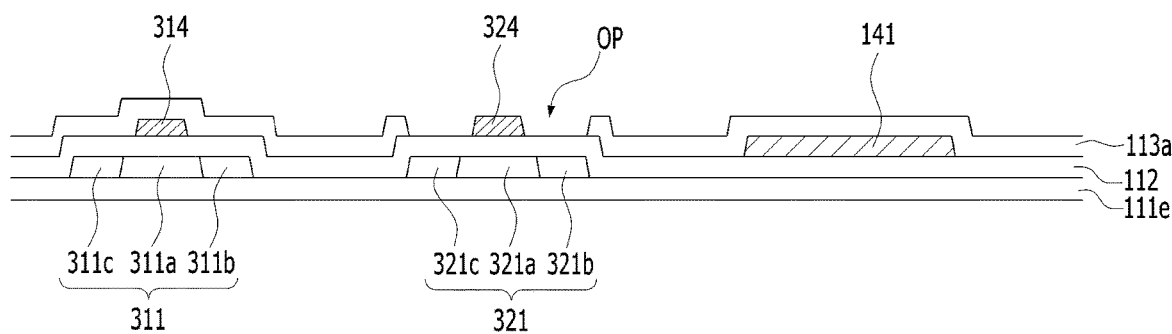
FIGS. 4A to 4F are cross-sectional views illustrating a method of manufacturing the display apparatus according to another embodiment of the present invention.

Referring to FIG. 4A, the display device 10 according to another embodiment of the present invention can include the first active layer 311 of the first thin-film transistor 310 and the second active layer 321 of the second thin-film transistor 320 formed on the 1-e buffer layer 111e of the first buffer layer 111. The first active layer 311 and the second active layer 321 can include polysilicon (poly-Si). After the amorphous silicon (a-Si) material is deposited on the 1-e buffer layer 111e, polysilicon is formed through a crystallization process. Then, the first active layer 311 and the second active layer 321 can be formed by patterning polysilicon.

Then, the first gate insulating layer 112 can be formed on the first active layer 311 and the second active layer 321.

The first gate electrode 314 of the first thin-film transistor 310, the second gate electrode 324 of the second thin-film transistor 320 and the first capacitor electrode 141 of the storage capacitor 140 can be formed on the first gate insulating layer 112. The first gate electrode 314 of the first thin-film transistor 310 can be disposed to overlap the first channel region 311a of the first active layer 311. In addition, the second gate electrode 324 of the second thin-film transistor 320 can be disposed to overlap the second channel region 321a of the second active layer 321.

The first gate electrode 314 can be disposed to overlap the first channel region 311a of the first active layer 311, and the second gate electrode 324 can be disposed to overlap the second channel region 321a of the second active layer 321.

In addition, the first gate electrode 314, the second gate electrode 324 and the first capacitor electrode 141 can be formed through the same process and can be formed of the same material.

The first interlayer lower insulating layer 113a of the first interlayer insulating layer 113 can be formed on the first gate electrode 314, the second gate electrode 324, the first capacitor electrode 141, the first interlayer insulating layer 141 and the first gate insulating layer 112. In addition, the first interlayer lower insulating layer 113a can include an opening OP to expose the second gate electrode 324 of the second thin-film transistor 320 used as a driving thin-film transistor. The opening OP of the first interlayer lower insulating layer 113a can be formed through an etching process. In addition, the first interlayer lower insulating layer 113a can be formed of a silicon nitride (SiNx) material.

Figure 4B:
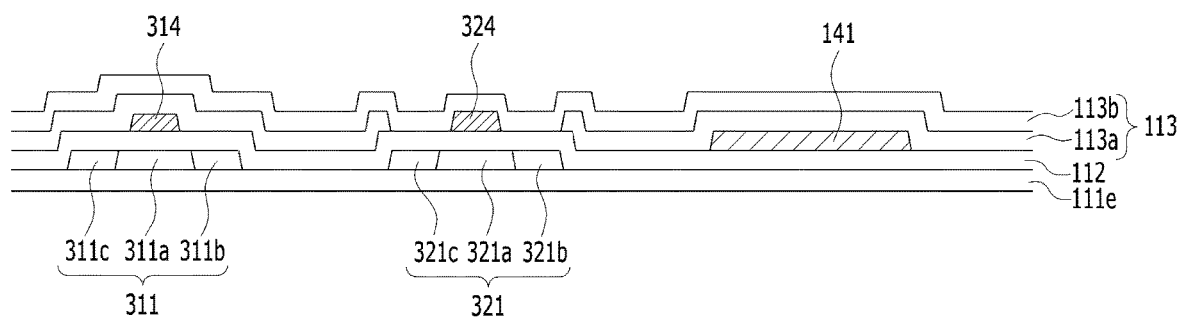

Referring to FIG. 4B, the first interlayer upper insulating layer 113b formed of a silicon oxide (SiOx) material, having lower hydrogen content than silicon nitride (SiNx), can be formed on the first interlayer lower insulating layer 113a. For example, the first interlayer upper insulating layer 113b can be formed of a silicon dioxide (SiO$_2$) material.

The second gate electrode 324 of the thin-film transistor 320, exposed through the opening OP in the first interlayer lower insulating layer 113a, can be surrounded by the first interlayer upper insulating layer 113b.

The first interlayer lower insulating layer 113a and the first interlayer upper insulating layer 113b can be formed on the first gate electrode 314 of the first thin-film transistor 310 and the first capacitor electrode 141 of the storage capacitor 140. Accordingly, the first interlayer insulating layer 113, having a double-layer structure, can be formed on the first gate electrode 314 and the first capacitor electrode 141. Only the first interlayer upper insulating layer 113b can be formed on the second gate electrode 324 of the second thin-film transistor 320. Accordingly, the first interlayer insulating layer 113 having a single-layer structure can be formed on the second gate electrode 324.

As such, the first interlayer lower insulating layer 113a formed of a silicon nitride (SiNx) material and the first interlayer upper insulating layer 113b formed of a silicon oxide (SiOx) material can be formed on the first gate electrode 314 of the first thin-film transistor 310, which is used as the switching thin-film transistor. In addition, only the first interlayer upper insulating layer 113b, formed of a silicon oxide (SiOx) material having hydrogen content lower than silicon nitride (SiNx), can be formed on the second gate electrode 324 of the second thin-film transistor 320 used as the driving thin-film transistor. Therefore, the degree of diffusion of hydrogen into the second active layer 321 of the second thin-film transistor 320 can be lower than the degree of diffusion of hydrogen into the first active layer 311 of the first thin-film transistor 310. Therefore, the s-factor value at or below the threshold voltage of the second thin-film transistor 320 used as the driving thin-film transistor can be smaller than the s-factor value at or below the threshold voltage of the first thin-film transistor 310. Therefore, the s-factor value at or below the threshold voltage of the second thin-film transistor 320 used as a driving thin-film transistor is increased compared to the S-factor value at or below the threshold voltage of the first thin-film transistor 310.

Figure 4C:
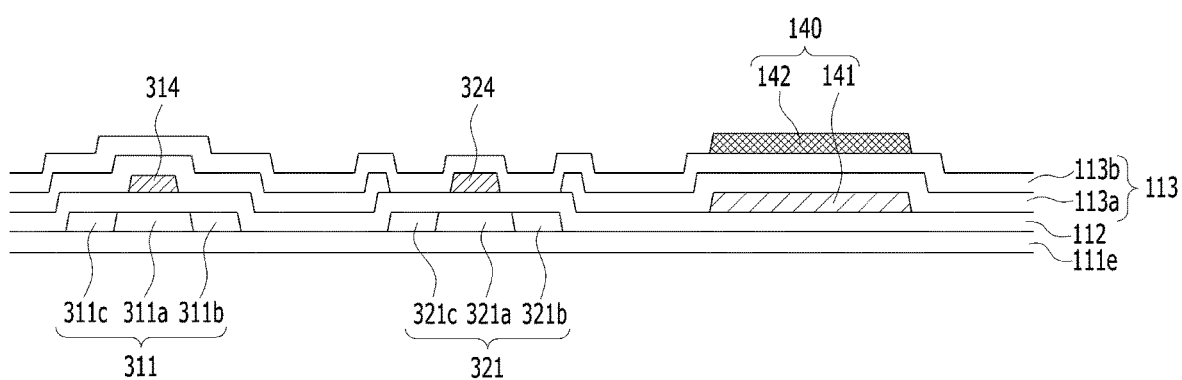

Referring to FIG. 4C, the second capacitor electrode 142 can be formed on the first interlayer insulating layer 113. The second capacitor electrode 142 can be disposed to overlap the first capacitor electrode 141 such that the first interlayer insulating layer 113 is interposed therebetween. The second capacitor electrode 142 can be disposed to overlap the first capacitor electrode 141 such that the first interlayer lower insulating layer 113a and the first interlayer upper insulating layer 113b are interposed therebetween.

Figure 4D:
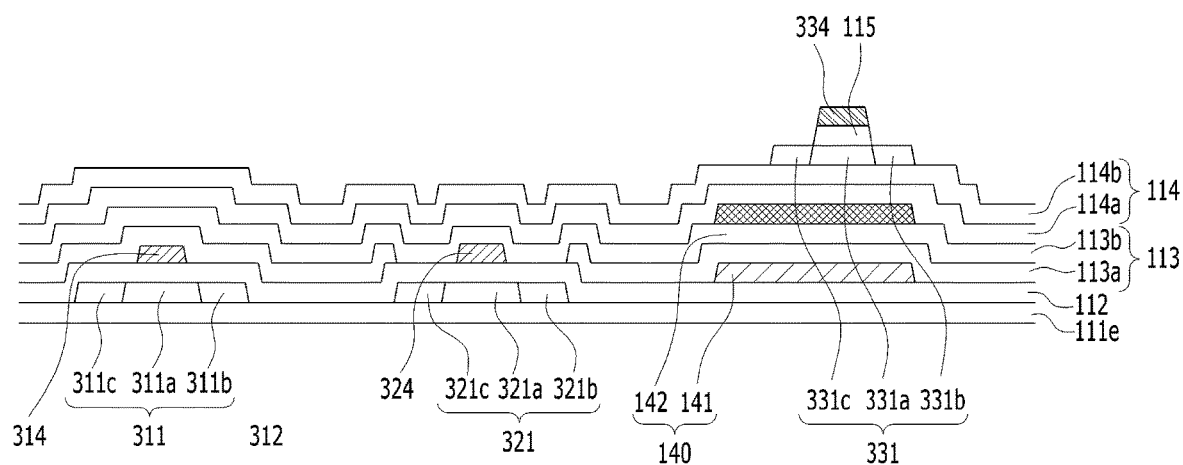

Referring to FIG. 4D, the second buffer lower layer 114a of the second buffer layer 114 can be formed on the second capacitor electrode 142 and the second buffer layer 113. In addition, the second buffer upper layer 114b can be formed on the second buffer lower layer 114a. In FIG. 4D, the second buffer layer 114 can have a double-layer structure including the second buffer lower layer 114a and the second buffer upper layer 114b, but the present invention is not limited thereto. For example, the second buffer layer 114 can include a single layer or three or more layers. The third active layer 331 of the third thin-film transistor 330 can be formed on the second buffer layer 114. The third active layer 331 can be disposed to overlap the first capacitor electrode 141 and the second capacitor electrode 142. In addition, the third active layer 331 can be formed of an oxide semiconductor.

The second gate insulating layer 115 and the third gate electrode 334 of the third thin-film transistor 330 can be formed on the third active layer 331. The first active layer 331, which includes a third channel region 331, which is not made conductive in the region, where the third gate electrode 334 is formed, and a third source region 331b and a third drain region 331c, which are made conductive at both ends of the third active layer 331, can be formed. In the display apparatus 100 according to embodiments of the present disclosure, the first thin-film transistor 330 including the third active layer 331 formed of an oxide semiconductor is used as a switching thin-film transistor.

Figure 4E:
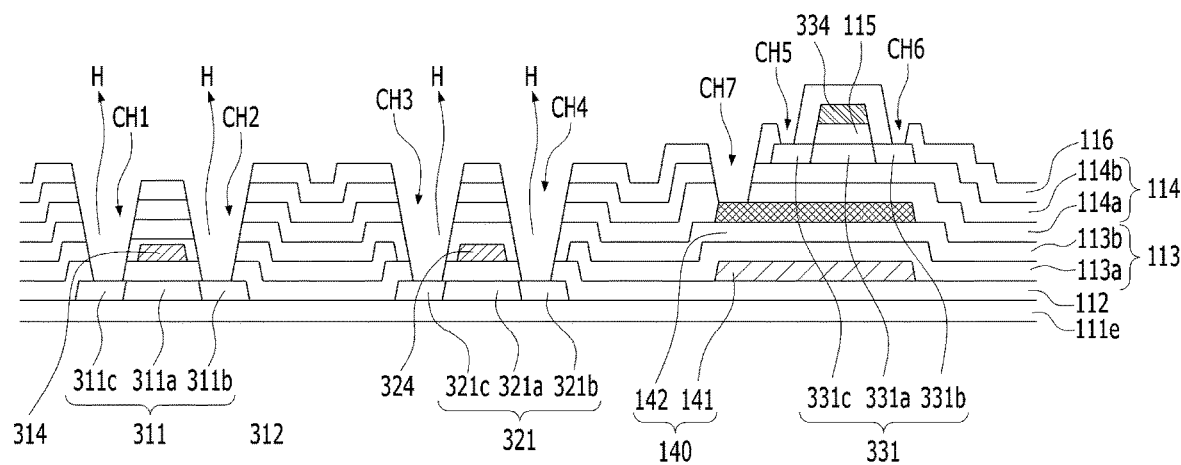

Referring to FIG. 4E, the second interlayer insulating layer 116 can be formed on the third gate electrode 334, the third active layer 331 and the second buffer layer 114. A first contact hole CH1 and a second contact hole CH2 to expose the first active layer 311 of the first thin-film transistor 310 can be formed by etching the second interlayer insulating layer 116, the second buffer layer 114, the first interlayer insulating layer 113 and the first gate insulating layer 112. In addition, a third contact hole CH3 and a fourth contact hole CH4 to expose the second active layer 321 of the second thin-film transistor 320 can be formed by etching the second interlayer insulating layer 116, the second buffer layer 114, the first interlayer insulating layer 113 and the first gate insulating layer 112. In addition, a fifth contact hole CH5 and a sixth contact hole CH6 to expose the third active layer 331 of the third thin-film transistor 330 can be formed by etching the second interlayer insulating layer 116. In addition, a seventh contact hole CH7 to expose the second capacitor electrode 142 of the storage capacitor 140 can be formed by etching the second interlayer insulating layer 116 and the second buffer layer 114.

The first drain region 311c of the first active layer 311 can be exposed through the first contact hole CH1, and the first source region 311b of the first active layer 311 can be exposed through the second contact hole CH2. In addition, the second drain region 321c of the second active layer 321 can be exposed through the third contact hole CH3, and the second source region 321b of the second active layer 321 can be exposed through the fourth contact hole CH4. In addition, the third drain region 331c of the third active layer 331 can be exposed through the fifth contact hole CH5, and the third source region 331b of the third active layer 331 can be exposed through the sixth contact hole CH6.

Portions of the first active layer 311 of the first thin-film transistor 310 exposed through the first contact hole CH1 and the second contact hole CH2 and portions of the second active layer 321 of the second thin-film transistor 320 exposed through the third contact hole CH3 and the fourth contact hole CH4 can be heat-treated. Hydrogen can be removed by heat-treating the first active layer 311, exposed through the first contact hole CH1 and the second contact hole CH2, and the second active layer 321, exposed through the third contact hole CH3 and the fourth contact hole CH4. For example, hydrogen present in the first source region 311b and the first drain region 311c of the first active layer 311, exposed through the first contact hole CH1 and the second contact hole CH2, and the second source region 321b and the second drain region 321c of the active layer 321, exposed through the third contact hole CH3 and the fourth contact hole CH4, respectively, can be removed through a heat treatment process. The heat treatment process can be carried out at a temperature of 250° C. to 370° C., and the temperature does not limit the details of the disclosure.

Figure 4F:
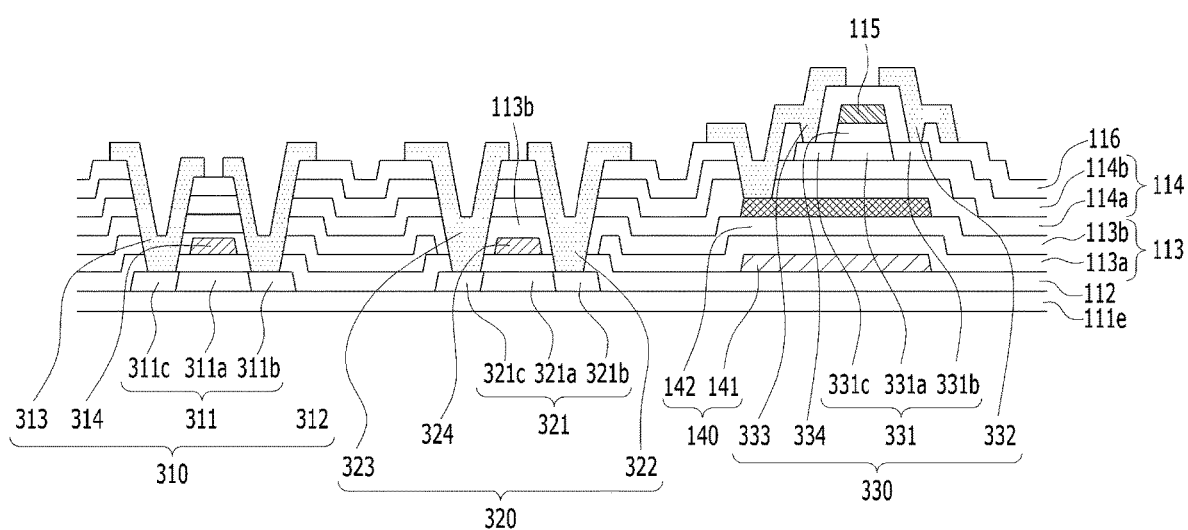

Referring to FIG. 4F, the first source electrode 312 and the first drain electrode 313 of the first thin-film transistor 310, the second source electrode 322 and the second drain electrode 323 of the second thin-film transistor 320, the third source electrode 332 and the third drain electrode 333 of the third thin-film transistor 330, and the connection electrode 150 can be formed on the second interlayer insulating layer 116.

The first source electrode 312 of the first thin-film transistor 310 can contact the first source region 311b of the first active layer 311 exposed through the second contact hole CH2, and the first drain electrode 313 of the first thin-film transistor 310 can contact the first drain region 311c of the first active layer 311 exposed through the first contact hole CH1. In addition, the second source electrode 322 of the second thin-film transistor 320 can contact the second source region 321b of the second active layer 321 exposed through the fourth contact hole CH4, and the second drain electrode 323 of the second thin-film transistor 320 can contact the third drain region 321c of the second active layer 321 exposed through the third contact hole CH3. In addition, the third source electrode 332 of the third thin-film transistor 330 can contact the third source region 331b of the third active layer 331 exposed through the sixth contact hole CH6, and the third drain electrode 333 of the thin-film transistor 330 can contact the third drain region 331c of the third active layer 331 exposed through the fifth contact hole CH5. In addition, the connection electrode 150 can contact the second capacitor electrode 142 of the storage capacitor 140 exposed through the seventh contact hole CH7.

In addition, as shown in FIG. 3, the first planarization layer 117, the auxiliary electrode 160, the second planarization layer 118, the first electrode 170, the bank 180, the spacer 190, the light-emitting structure 200, the second electrode 210 and the encapsulating element 220 can be formed on the first source electrode 312, the first drain electrode 313, the second source electrode 322, the second drain electrode 323, the third source electrode 332, the third drain electrode 333 and the connection electrode 150.

Figure 5:
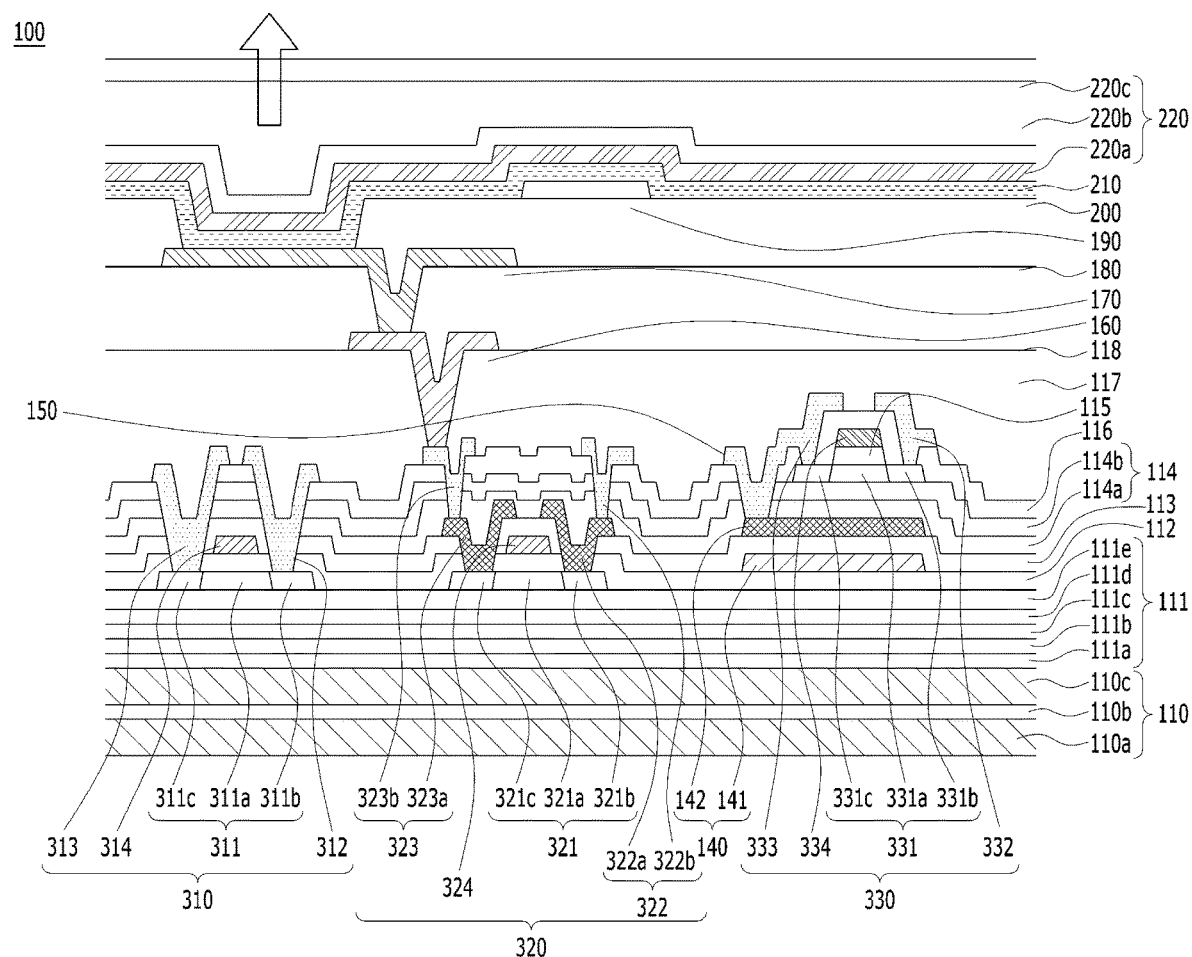
FIG. 5 is a cross-sectional view illustrating a display apparatus according to another embodiment of the present invention.

FIG. 5 is a sectional view illustrating a display apparatus 100 according to another embodiment of the present invention. The description will be given with reference to FIG. 1 along with FIG. 5, and redundant descriptions will be omitted or briefly explained.

For example, the substrate 110, the first buffer layer 111, the first gate insulating layer 112, the first interlayer insulating layer 113, the second buffer layer 114, the second gate insulating layer 115, the second interlayer insulating layer 116, the first planarization layer 117, the second planarization layer 118, the connection electrode 150, the auxiliary electrode 160, the first electrode 170, the bank 180, the spacer 190, the light-emitting structure 200, the second electrode 210, the encapsulating element 220, the storage capacitor 140, the first thin-film transistor 310, and the third thin-film transistor 330 are substantially the same. Therefore, a redundant description of the configuration of FIG. 2 that is substantially the same as that of FIG. 1 will be omitted or briefly explained.

Referring to FIG. 5, the display apparatus 100 according to another embodiment of the present invention can include the substrate 110, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the spacer 190, the light-emitting structure 200, the second electrode 210, the encapsulating element 220, the storage capacitor 140, the connection electrode 150, the first thin-film transistor 310, the second thin-film transistor 320 and the third thin-film transistor 330. In addition, the first active layer 311 of the first thin-film transistor 310 and the second active layer 321 of the second thin-film transistor 320 can be formed of polysilicon material, and the third active layer 331 of the third thin-film transistor 330 can be formed of an oxide semiconductor. In addition, the first thin-film transistor 310 and the third thin-film transistor 330 can be used as switching thin-film transistors, and the second thin-film transistor 320 can be connected to the first electrode 170 and can be used as a driving thin-film transistor.

In the display apparatus 100 according to another embodiment of the present invention, the second source electrode 322 of the second thin-film transistor 320 can include a second source lower electrode 322a and a second source upper electrode 322b. In addition, the second drain electrode 323 can include a second drain lower electrode 323a and a second drain upper electrode 323b. The second source lower electrode 322a and the second drain lower electrode 323a can be formed of the same material as the second capacitor electrode 142 of the storage capacitor 140. In addition, the second source upper electrode 322b and the second drain upper electrode 323b can be formed of the same material as the first source electrode 312 and the first drain electrode 313 of the first thin-film transistor 310, and can be formed of the same material as the third source electrode 332 and the third drain electrode 333 of the third thin-film transistor 330.

The second source lower electrode 322a and the second drain lower electrode 323a can prevent hydrogen from diffusing into the second channel region 321a of the second active layer 321.

The second source lower electrode 322a can directly contact the second source region 321b of the second active layer 321, exposed through the contact hole in the first interlayer insulating layer 113 and the first gate insulating layer 112. In addition, the second drain lower electrode 322b can directly contact the second drain region 321c of the second active layer 321 exposed through the contact hole in the first interlayer insulating layer 113 and the first gate insulating layer 112.

In addition, the second drain upper electrode 323b can be electrically connected to the first electrode 170. The second thin-film transistor 320 connected to the first electrode 170 can be a driving thin-film transistor.

FIGS. 6A to 6F are sectional views illustrating a method of manufacturing the display apparatus 100 according to another embodiment of the present invention. The description will be given with reference to FIG. 5 along with FIGS. 6A to 6F, and redundant descriptions will be omitted or briefly explained.

Figure 6A:
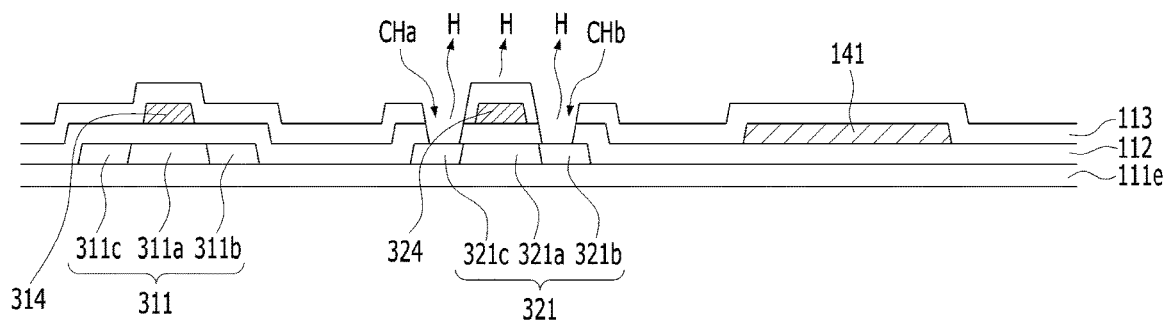
FIGS. 6A to 6F are cross-sectional views illustrating a method of manufacturing the display apparatus according to another embodiment of the present invention.

Referring to FIG. 6A, the display apparatus 100 according to the embodiment of the present invention can include the first active layer 311 of the first thin-film transistor 310 and the second active layer 321 of the second thin-film transistor 320 on the 1-e buffer layer 111e of the first buffer layer 111. The first active layer 311 and the second active layer 321 can include polysilicon (poly-Si). After the amorphous silicon (a-Si) material is deposited on the 1-e buffer layer 111e, polysilicon can be formed through a crystallization process. Then, the first active layer 311 and the second active layer 321 can be formed by patterning the polysilicon.

In addition, the first gate insulating layer 112 can be formed on the first active layer 311 and the second active layer 321.

The first gate electrode 314 of the first thin-film transistor 310, the second gate electrode 324 of the second thin-film transistor 320 and the first capacitor electrode 141 of the storage capacitor 140 can be formed on the first gate insulating layer 112. The first gate electrode 314 of the first thin-film transistor 310 can be disposed to overlap the first channel region 311a of the first active layer 311. In addition, the second gate electrode 324 of the second thin-film transistor 320 can be disposed to overlap the second channel region 321a of the second active layer 321.

The first gate electrode 314 can be disposed to overlap the first channel region 311a of the first active layer 311, and the second gate electrode 324 can be disposed to overlap the second channel region 321a of the second active layer 321.

In addition, the first gate electrode 314, the second gate electrode 324 and the first capacitor electrode 141 can be formed through the same process, and can be formed of the same material.

The first interlayer insulating layer 113 can be formed on the first gate electrode 314, the second gate electrode 324, the first capacitor electrode 141 and the first gate insulating layer 112. The first gate insulating layer 112 and the first interlayer insulating layer 113 can include a second source contact hole CHb and a second drain contact hole CHa that expose the upper surfaces of the second source region 321b and the second drain region 321c. In addition, the second source region 321b and the second drain region 321c of the second active layer 321 exposed through the second source contact hole CHb and the second drain contact hole CHa can be heat-treated for dehydrogenation. The heat treatment can be performed at a temperature of 250° C. to 370° C. As described above, when only the second active layer 321 of the second thin-film transistor 320 used as the driving thin-film transistor is selectively dehydrogenated through heat treatment, the characteristic value (s-factor) at or below the threshold voltage of only the second thin-film transistor 320 can be increased.

As shown in FIG. 6A, the second source contact hole CHb and the second drain contact hole CHa can be formed by etching the first gate insulating layer 112 and the first interlayer insulating layer 113 such that only the second active layer 321 of the thin-film transistor 320 used as the driving thin-film transistor is exposed. In addition, the second source region 321b and the second drain region 321c of the second active layer 321, exposed through the second source contact hole CHb and the second drain contact hole CHa, can be dehydrogenized through the heat treatment process. By selectively heat-treating only the second active layer 321 of the second thin-film transistor 320 used as a driving thin-film transistor, among the first thin-film transistor 310 and the second thin-film transistor 320, which include the active layer formed of the same polysilicon material, the s-factor at or below the threshold value of only the second thin-film transistor 320, used as the driving thin-film transistor, can be increased.

Figure 6B:
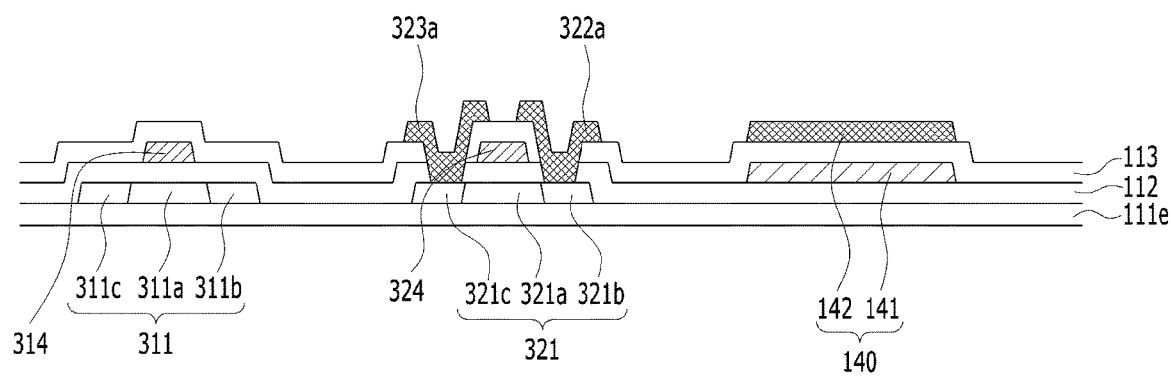

Referring to FIG. 6B, the second source lower electrode 322a directly contacts the second source region 321b of the second active layer 321 exposed through the second source contact hole CHb of the first interlayer insulating layer 113 and the first gate insulating layer 112. In addition, the second drain lower electrode 323a directly contacts the second drain region 321c of the second active layer 321 exposed through the second drain contact hole CHa of the second gate electrode 113 and the first gate insulating layer 112. In addition, the second drain lower electrode 323a directly contacts the second drain region 321c of the second active layer 321 exposed through the second drain contact hole CHa in the first interlayer insulating layer 113 and the first gate insulating layer 112. In addition, the second capacitor electrode 142 of the storage capacitor 140 can overlap the first capacitor electrode 141 such that the first interlayer insulating layer 113 is interposed therebetween. The second source lower electrode 322a, the second drain lower electrode 323a and the second capacitor electrode 142 can be formed through the same process, and can be formed of the same material.

Figure 6C:
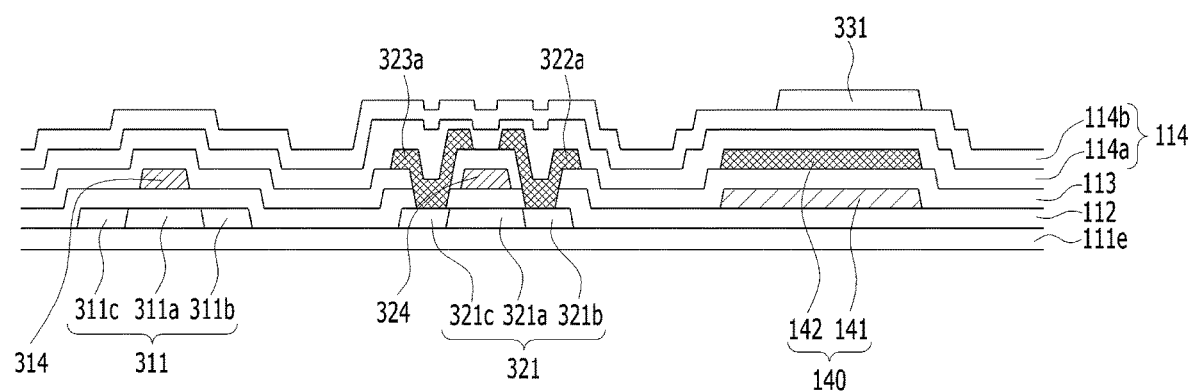

Referring to FIG. 6C, the second buffer lower layer 114a of the second buffer layer 114 can be formed on the second source lower electrode 322a, the second drain lower electrode 323a, the second capacitor electrode 142 and the first interlayer insulating layer 113. In addition, the second buffer upper layer 114b can be formed on the second buffer lower layer 114a. In FIGS. 6C to 6F, the second buffer layer 114 has a double-layer structure including the second buffer lower layer 114a and the second buffer upper layer 114b, but the present invention is not limited thereto. For example, the second buffer layer 114 can include a single layer. The third active layer 331 of the third thin-film transistor 330 can be formed on the second buffer layer 114. The third active layer 331 can be disposed to overlap the first capacitor electrode 141 and the second capacitor electrode 142. In addition, the third active layer 331 can be formed of an oxide semiconductor.

Figure 6D:
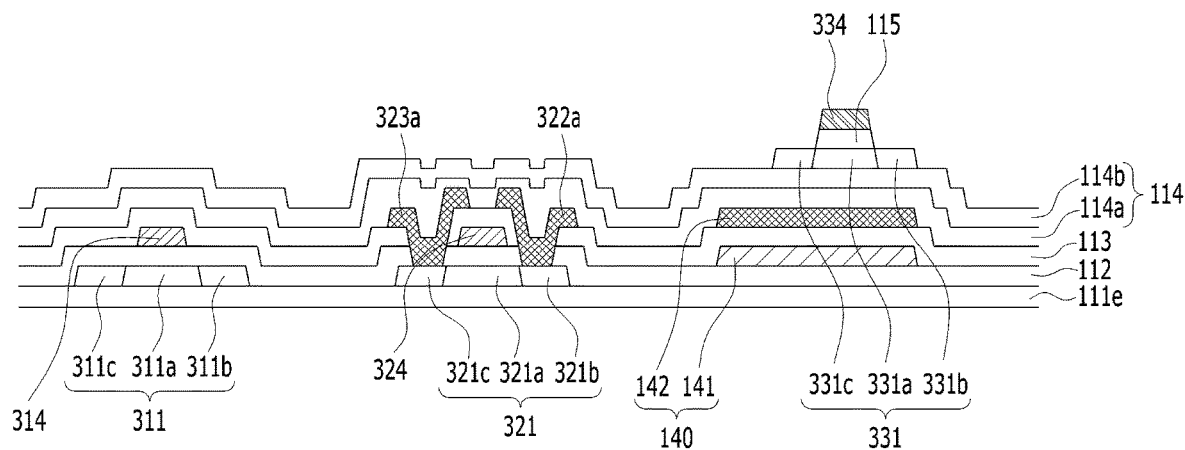

Referring to FIG. 6D, the second gate insulating layer 115 and the third gate electrode 334 of the third thin-film transistor 330 can be formed on the third active layer 331. The first active layer 331 including the third channel region 331a, which is not made conductive corresponding to the region where the third gate electrode 334 is formed, and a third source region 331b and a third drain region 331c, which are made conductive at both ends of the third active layer 331, can be formed. In the display apparatus 100 according to embodiments of the present disclosure, the first thin-film transistor 330 including the third active layer 331 formed of an oxide semiconductor is used as a switching thin-film transistor.

Figure 6E:
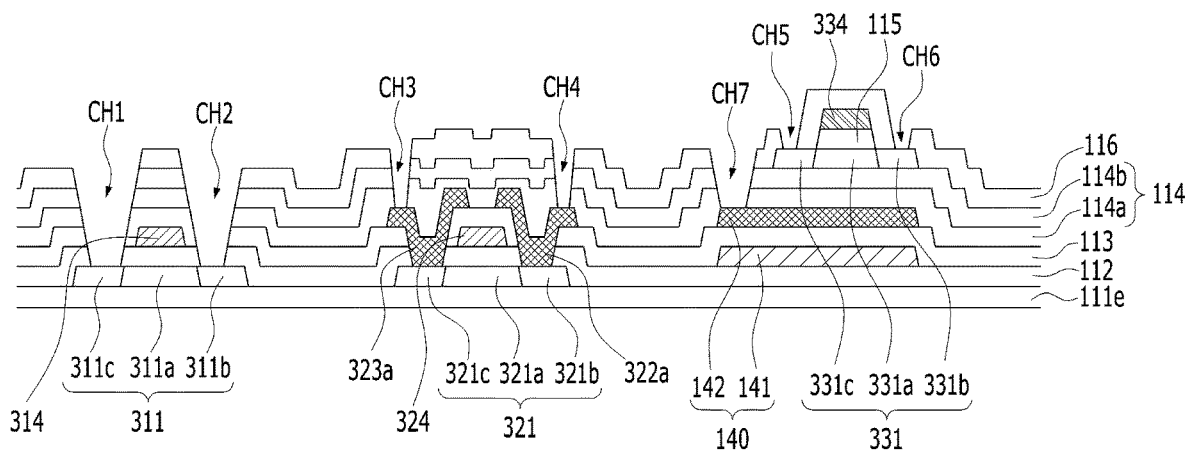

Referring to FIG. 6E, the second interlayer insulating layer 116 can be formed on the third gate electrode 334, the third active layer 331 and the second buffer layer 114. A first contact hole CH1 and a second contact hole CH2 to expose the first active layer 311 of the first thin-film transistor 310 can be formed by etching the second interlayer insulating layer 116, the second buffer layer 114, the first interlayer insulating layer 113 and the first gate insulating layer 112. In addition, a third contact hole CH3 and a fourth contact hole CH4 to expose the second interlayer insulating layer 116, the second buffer layer 114, the second drain lower electrode 323a and the second source lower electrode 322a of the second thin-film transistor can be formed. In addition, a fifth contact hole CH5 and a sixth contact hole CH6 to expose the third active layer 331 of the third thin-film transistor 330 can be formed by etching the second interlayer insulating layer 116. In addition, a seventh contact hole CH7 to expose the second capacitor electrode 142 of the storage capacitor 140 can be formed by etching the second interlayer insulating layer 116 and the second buffer layer 114.

The first drain region 311c of the first active layer 311 can be exposed through the first contact hole CH1, and the first source region 311b of the first active layer 311 can be exposed through the second contact hole CH2. In addition, the second drain lower electrode 323a of the second drain electrode 323 can be exposed through the third contact hole CH3, and the second source lower electrode 322a of the second source electrode 322 can be exposed through the fourth contact hole CH4. In addition, the third drain region 331c of the third active layer 331 can be exposed through the fifth contact hole CH5, and the third source region 331b of the third active layer 331 can be exposed through the sixth contact hole CH6.

Figure 6F:
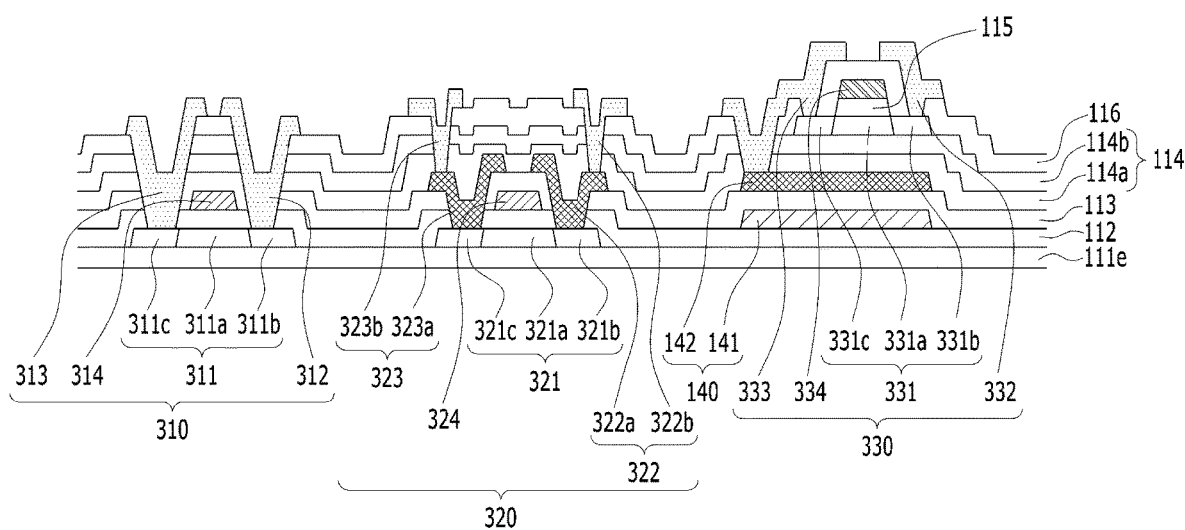

Referring to FIG. 6F, the first source electrode 312 and the first drain electrode 313 of the first thin-film transistor 310, the second source upper electrode 322b and the second drain upper electrode 323b of the second thin-film transistor 320, the third source electrode 332 and the third drain electrode 333 of the third thin-film transistor 330, and the connection electrode 150 can be formed on the second interlayer insulating layer 116.

The first source electrode 312 of the first thin-film transistor 310 can contact the first source region 311b of the first active layer 311 exposed through the second contact hole CH2, and the first drain electrode 313 of the first thin-film transistor 310 can contact the first drain region 311c of the first active layer 311 exposed through the first contact hole CH1. In addition, the second source upper electrode 322b of the second thin-film transistor 320 can contact the second source lower electrode 322a exposed through the fourth contact hole CH4, and the second drain upper electrode 323b of the second thin-film transistor 320 can contact the second drain lower electrode 323a exposed through the third contact hole CH3. The second source upper electrode 322b, which directly contacts the upper surface of the second source lower electrode 322a, is electrically connected to the second active layer 321 through the second source lower electrode 322a, which directly contacts the second source region 321b of the second active layer 321. The second drain upper electrode 323b, which directly contacts the upper surface of the second drain lower electrode 323a, is electrically connected to the second active layer 321 through the second drain lower electrode 323a, which directly contacts the second drain region 321c of the second active layer 321.

In addition, the third source electrode 332 of the third thin-film transistor 330 can contact the third source region 331b of the third active layer 331 exposed through the sixth contact hole CH6, and the third drain electrode 333 of the thin-film transistor 330 can contact the third drain region 331c of the third active layer 331 exposed through the fifth contact hole CH5. In addition, the connection electrode 150 can contact the second capacitor electrode 142 of the storage capacitor 140 exposed through the seventh contact hole CH7.

In addition, as shown in FIG. 5, the first planarization layer 117, the auxiliary electrode 160, the second planarization layer 118, the first electrode 170, the bank 180, the spacer 190, the light-emitting structure 200, the second electrode 210 and the encapsulating element 220 can be formed on the first source electrode 312, the first drain electrode 313, the second source electrode 322, the second drain electrode 323, the third source electrode 332, the third drain electrode 333 and the connection electrode 150.

Figure 7:
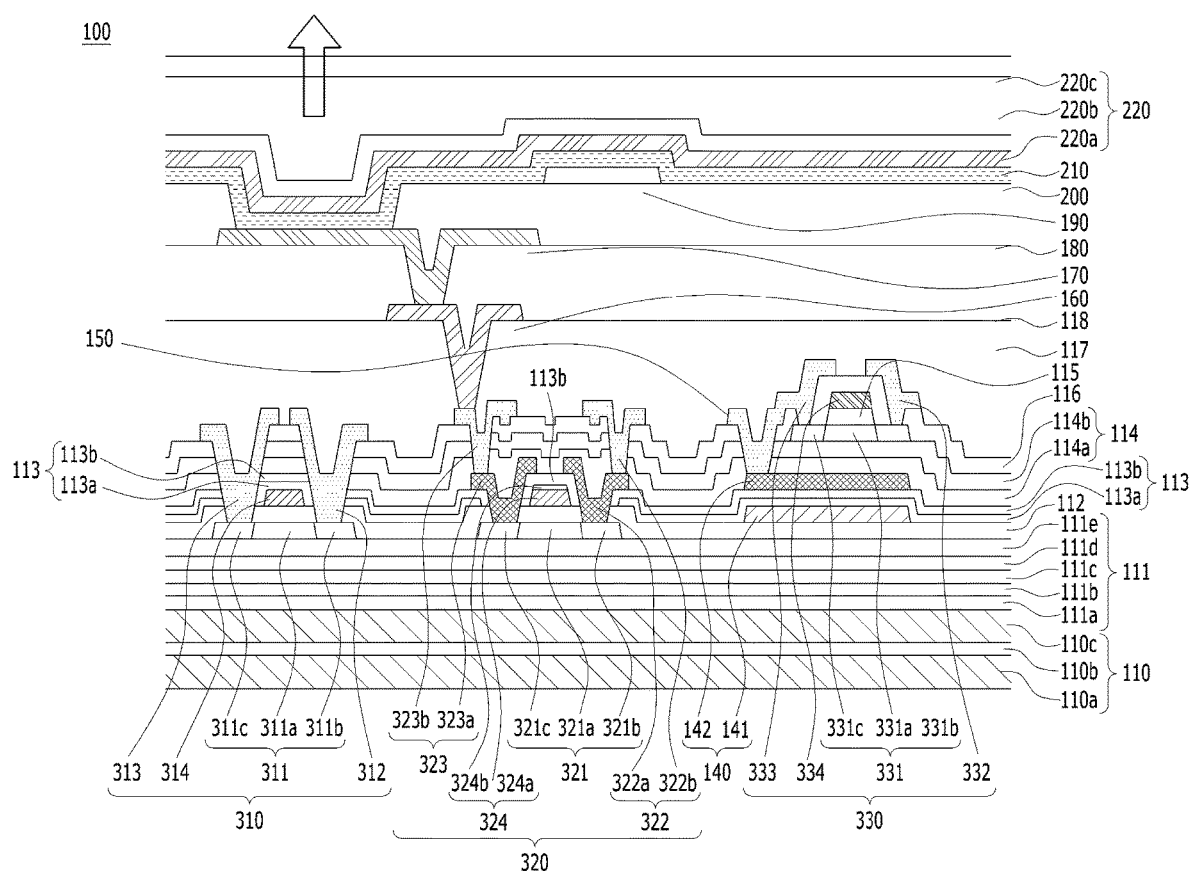
FIG. 7 is a cross-sectional view illustrating a display apparatus according to another embodiment of the present invention.

FIG. 7 is a sectional view illustrating the display apparatus 100 according to another embodiment of the present invention. The description will be given with reference to FIG. 1 along with FIG. 7 and redundant descriptions will be omitted or briefly explained. For example, the substrate 110, the first buffer layer 111, the first gate insulating layer 112, the second buffer layer 114, the second gate insulating layer 115, the second interlayer insulating layer 116, the first planarization layer 117, the second planarization layer 118, the connection electrode 150, the auxiliary electrode 160, the first electrode 170, the bank 180, the spacer 190, the light-emitting structure 200, the second electrode 210, the encapsulating element 220, the storage capacitor 140, the first thin-film transistor 310 and the third thin-film transistor 330 are substantially the same. Therefore, a redundant description of the configuration of FIG. 7 that is substantially the same as that of FIG. 1 will be omitted or briefly explained.

Referring to FIG. 7, the display apparatus 100 according to another embodiment of the present invention can include the substrate 110, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the spacer 190, the light-emitting structure 200, the second electrode 210, the encapsulating element 220, the storage capacitor 140, the connection electrode 150, the first thin-film transistor 310, the second thin-film transistor 320 and the third thin-film transistor 330. In addition, the first active layer 311 of the first thin-film transistor 310 and the second active layer 321 of the second thin-film transistor 320 can be formed of polysilicon material, and the third active layer 331 of the third thin-film transistor 330 can be formed of an oxide semiconductor. In addition, the first thin-film transistor 310 and the third thin-film transistor 330 can be used as switching thin-film transistors, and the second thin-film transistor 320 can be connected to the first electrode 170, and can be used as a driving thin-film transistor.

In the display apparatus 100 according to another embodiment of the present invention, the first gate electrode 314 of the first thin-film transistor 310, the second gate electrode 324 of the second thin-film transistor 320 and the first capacitor electrode 141 of the storage capacitor 140 can be disposed on the first gate insulating layer 112.

The second gate electrode 324 can have a larger number of layers than the first gate electrode 314 and the first capacitor electrode 141. The first gate electrode 314 and the first capacitor electrode 141 can include n layers. The second gate electrode 324 can include n+1 layers. Here, n is a natural number such as 1, 2, 3 or 4. For example, the first gate electrode 314 and the first capacitor electrode 141 can include a single layer. Also, the second gate electrode 324 can include double layers. When the second gate electrode 324 includes double layers, the upper metal layer 324b is formed of titanium (Ti) or titanium nitride (TiNx) in order to prevent hydrogen from diffusing into the second active layer 321 of the second thin-film transistor 320. According to an embodiment of the present disclosure, the first gate electrode 314 and the first capacitor electrode 141 can include a single layer containing any one of molybdenum (Mo), copper (Cu), aluminum (Al), chromium (Cr), gold (Au), nickel (Ni) or neodymium (Nd), or an alloy thereof. In addition, the second gate electrode 324 can have a double-layer structure including a lower metal layer 324a containing molybdenum or aluminum, and an upper metal layer 324b containing titanium or titanium nitride.

The first gate electrode 314 of the first thin-film transistor 310 used as a switching thin-film transistor can include n layers. In addition, the second gate electrode 324 of the second thin-film transistor 320 used as a driving thin-film transistor can include n+1 layers. The uppermost or lowermost layer of the second gate electrode 324 including n+1 layers can be formed of titanium (Ti) or titanium nitride (TiNx). The titanium (Ti) or titanium nitride (TiNx) layer of the second gate electrode 324 serves as a barrier layer that prevents hydrogen from diffusing into the second active layer 321 of the second thin-film transistor 320. Therefore, by creating a difference between the degree of hydrogenation of the first active layer 311 of the first thin-film transistor 310 used as the switching thin-film transistor and the degree of hydrogenation of the second active layer 321 of the second thin-film transistor 320 used as the driving thin-film transistor, the s-factor value at or below the threshold voltage of only the second thin-film transistor 320 used as the driving thin-film transistor can be increased.

As described above, by changing the gate electrode structure depending on the characteristics of the transistor, the s-factor at or below a threshold value of only a certain transistor can be selectively increased.

The first interlayer insulating layer 113 can be disposed on the first gate insulating layer 112, the first gate electrode 314, the second gate electrode 324 and the first capacitor electrode 141. The first interlayer insulating layer 113 can have a double-layer structure including a first interlayer lower insulating layer 113a and a first interlayer upper insulating layer 113b. The first interlayer lower insulating layer 113a can be formed of a silicon nitride (SiNx) material, and the first interlayer upper insulating layer 113b can be formed of a silicon oxide (SiOx) material. Hydrogen generated in the first interlayer lower insulating layer 113a formed of a silicon nitride (SiNx) material can diffuse into the second channel region 321a of the second active layer 321.

Therefore, as shown in FIG. 7, in a region overlapping the second active layer 321, the first interlayer lower insulating layer 113a formed of a silicon nitride (SiNx) material can be removed, and only the first interlayer upper insulating layer 113b formed of a silicon oxide (SiOx) material can be disposed. Referring to FIG. 7, the first interlayer upper insulating layer 113b can be disposed to directly contact the upper surface and both side surfaces of the second gate electrode 324, which is disposed to overlap the second channel region 321a. In addition, the first interlayer upper insulating layer 113b can be formed to surround the upper surface and both side surfaces of the second gate electrode 324.

Regarding the display apparatus 100 according to another embodiment of the present invention, only the first interlayer upper insulating layer 113b formed of a silicon oxide (SiOx) material can be formed in the region overlapping the second active layer 321 of the second thin-film transistor 320 in order to block the diffusion of hydrogen, which can decrease the s-factor value of the second thin-film transistor 320, which is used as a driving thin-film transistor. In addition, a first interlayer lower insulating layer 113a formed of a silicon nitride (SiNx) material and a second interlayer upper insulating layer 113b formed of a silicon nitride (SiNx) material having a lower hydrogen content can be formed in a region overlapping the first active layer 311 of the first thin-film transistor 310 used as a switching thin-film transistor. For example, the first interlayer upper insulating layer 113b can be formed of a silicon dioxide ($SiO_2$) material.

As shown in FIG. 7, the first interlayer insulating layer 113, disposed on the first gate electrode 314 of the first thin-film transistor 310, which is used as a switching thin-film transistor, and the first interlayer insulating layer 113 (first interlayer upper insulating layer 113b), disposed on the second gate electrode 324 of the second thin-film transistor 320, which is used as a driving thin-film transistor, are formed in different configurations, thus creating a difference between the degree of diffusion of hydrogen into the first channel region 311a of the first active layer 311 and the degree of diffusion of hydrogen into the second channel region 321a of the second active layer 321. The second interlayer lower insulating layer 113b formed of only silicon oxide (SiOx) having lower hydrogen content than silicon nitride (SiNx) can prevent the diffusion of hydrogen into the second active layer 321 of the second thin-film transistor 320.

Therefore, the s-factor value at or below the threshold voltage of the first thin-film transistor 310 can be different from the s-factor value at or below the threshold voltage of the second thin-film transistor 320. There is an advantage in that the characteristics of the device can be made different by controlling the s-factor value at or below the threshold voltage of the second thin-film transistor 320 to be larger. As described above, by differently designing the structure of the insulating layer on the gate electrode according to the intended use of the thin-film transistor, the characteristics of the thin-film transistor can be made different.

The second source electrode 322 of the second thin-film transistor 320 can include a second source lower electrode 322a and a second source upper electrode 322b. In addition, the second drain electrode 323 can include a second drain lower electrode 323a and a second drain upper electrode 323b. The second source lower electrode 322a and the second drain lower electrode 323a can be formed of the same material as the second capacitor electrode 142 of the storage capacitor 140. In addition, the second source upper electrode 322b and the second drain upper electrode 323b can be formed of the same material as the first source electrode 312 and the first drain electrode 313 of the first thin-film transistor 310, and can be formed of the same material as the third source electrode 332 and the third drain electrode 333 of the third thin-film transistor 330.

The second source lower electrode 322a and the second drain lower electrode 323a can prevent hydrogen from diffusing into the second channel region 321a of the second active layer 321.

The second source lower electrode 322a can directly contact the second source region 321b of the second active layer 321, which is exposed through the contact hole in the first interlayer insulating layer 113 and the first gate insulating layer 112. In addition, the second drain lower electrode 322b can directly contact the second drain region 321c of the second active layer 321, which is exposed through the contact hole in the first interlayer insulating layer 113 and the first gate insulating layer 112.

Figure 8:
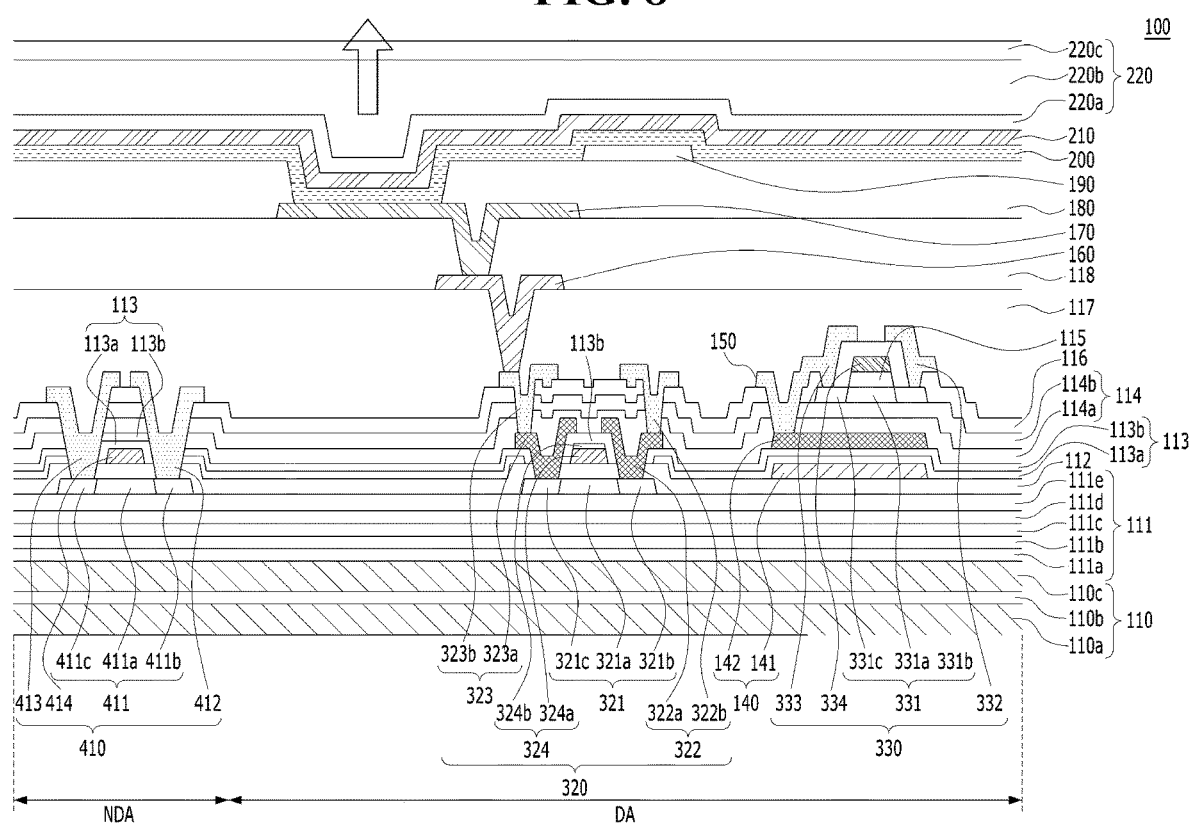
FIG. 8 is a cross-sectional view illustrating a display apparatus according to another embodiment of the present invention.

FIG. 8 is a sectional view illustrating the display apparatus 100 according to another embodiment of the present invention. The description will be given with reference to FIG. 7 along with FI. 8 and redundant descriptions will be omitted or briefly explained.

For example, the substrate 110, the first buffer layer 111, the first gate insulating layer 112, the first interlayer insulating layer 113, the second buffer layer 114, the second gate insulating layer 115, the second interlayer insulating layer 116, the first planarization layer 117, the second planarization layer 118, the auxiliary electrode 160, the first electrode 170, the bank 180, the spacer 190, the light-emitting structure 200, the second electrode 210, the encapsulating element 220, the second thin-film transistor 320 and the third thin-film transistor 330 are substantially the same. Therefore, a redundant description of the configuration of FIG. 8 that is substantially the same as that of FIG. 7 will be omitted or briefly explained.

Referring to FIG. 8, the display apparatus 100 can include a display area DA and a non-display area NDA. The display area DA can be formed of a plurality of pixel. And, each of the pixels can be formed of the second thin film transistor 320 and the third thin film transistor 330. The second thin film transistor 320 can include polysilicon material. For example, the polysilicon material can be LTPS material. In additional, the third thin film transistor 330 can include an oxide semiconductor. The second thin film transistor 320 including a polysilicon material can be a driving thin film transistor (Driving TFT) electrically connected to the first electrode 170 to supply current to the light-emitting structure 200. And, the third thin film transistor 330 including an oxide semiconductor can be a switching thin film transistor (Switching TFT) controlling the operation of the second thin film transistor 320 which is a driving thin film transistor. However, the present invention is not limited thereto, the second thin film transistor 320 including a polysilicon material can be a switching thin film transistor. In additional, the third thin film transistor 330 including an oxide semiconductor can be a driving thin film transistor. The non-display area NDS can be disposed close to the display area AA. And, a driving circuit to driving the pixels of the display area AA can be disposed on the non-display area NDA. Furthermore, the driving circuit can include a first thin film transistor 410. As such, the first thin film transistor 410 disposed in the non-display area NDA can include a polysilicon material.

The second thin film transistor 320 disposed in the display area AA can be formed of n-type transistor (n-type TFT) or p-type transistor (p-type TFT). And, the third thin film transistor 330 disposed in the display area AA can be formed of n-type TFT. Also, the first thin film transistor 410 disposed in the non-display area NDA can be formed of n-type TFT or P-type TFT. For example, the first thin film transistor 410 which is disposed in the non-display area NDA and includes a polysilicon material can be formed of p-type TFT. In this case, the second thin film transistor 320 which is disposed in the display area DA and includes a polysilicon material can also be formed of p-type TFT. And, the third thin film transistor 330 which is disposed in the display area DA and includes an oxide semiconductor can be formed of n-type TFT. As another embodiment, the first thin film transistor 410 which is disposed in the non-display area NDA and includes a polysilicon material can be formed of n-type TFT. In this case, the second thin film transistor 320 which is disposed in the display area DA and includes a polysilicon material can also be formed n-type TFT. In additional, the third thin film transistor 330 which is disposed in the display area DA and includes an oxide semiconductor can be formed of n-type TFT.

Referring to FIG. 8, the display apparatus 100 can include the substrate 110, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the spacer 190, the light-emitting structure 200, the second electrode 210, the encapsulating element 220, the storage capacitor 140, the connection electrode 150, the first thin-film transistor 410, the second thin-film transistor 320 and the third thin-film transistor 330. In addition, a first active layer 411 of the first thin-film transistor 410 and the second active layer 321 of the second thin-film transistor 320 can be formed of a polysilicon material, and the third active layer 331 of the third thin-film transistor 330 can be formed of an oxide semiconductor.

In the display apparatus 100 according to another embodiment of the present invention, a first gate electrode 414 of the first thin-film transistor 410, the second gate electrode 324 of the second thin-film transistor 320 and the first capacitor electrode 141 of the storage capacitor 140 can be disposed on the first gate insulating layer 112. Additionally, the first gate electrode 414 can be disposed in the non-display area NDA. And, the second gate electrode 324 and the storage capacitor 140 can be disposed in the display area DA. The second gate electrode 324 can have a larger number of layers than the first gate electrode 414 and the first capacitor electrode 141. The first gate electrode 414 and the first capacitor electrode 141 can include n layers. The second gate electrode 324 can include n+1 layers. Here, n is a natural number such as 1, 2, 3 or 4. For example, the first gate electrode 414 and the first capacitor electrode 141 can include a single layer. Also, the second gate electrode 324 can include double layers. When the second gate electrode 324 includes double layers, the upper metal layer 324b is formed of titanium (Ti) or titanium nitride (TiNx) in order to prevent hydrogen from diffusing into the second active layer 321 of the second thin-film transistor 320. According to an embodiment of the present disclosure, the first gate electrode 414 and the first capacitor electrode 141 can include a single layer containing any one of molybdenum (Mo), copper (Cu), aluminum (Al), chromium (Cr), gold (Au), nickel (Ni) or neodymium (Nd), or an alloy thereof. In addition, the second gate electrode 324 can have a double-layer structure including a lower metal layer 324a containing molybdenum or aluminum, and an upper metal layer 324b containing titanium or titanium nitride.

The first gate electrode 414 of the first thin-film transistor 410 used as a thin-film transistor of the driving circuit in the non-display area NDA can include n layers. In addition, the second gate electrode 324 of the second thin-film transistor 320 used as a driving thin-film transistor in the display area DA can include n+1 layers. The uppermost or lowermost layer of the second gate electrode 324 including n+1 layers can be formed of titanium (Ti) or titanium nitride (TiNx).

The titanium (Ti) or titanium nitride (TiNx) layer of the second gate electrode 324 serves as a barrier layer that prevents hydrogen from diffusing into the second active layer 321 of the second thin-film transistor 320. Therefore, the degree of hydrogenation of the first active layer 411 of the first thin-film transistor 410 which is formed of a polysilicon material in the non-display area NDA and the second active layer 321 of the second thin-film transistor 320 which is formed of a polysilicon material in the display area DA can be different. Thus, although the second active layer 321 of the second thin film transistor 320 can be formed of a polysilicon material, which is the same material as the first active layer 411 of the first thin film transistor 410, the s-factor value at or below the threshold voltage of the second thin-film transistor 320 disposed in the display area DA can be increased.

As described above, by changing the gate electrode structure depending on the location or the characteristics of the transistor, the s-factor at or below a threshold value of only a certain transistor can be selectively increased.

The first interlayer insulating layer 113 can be disposed on the first gate insulating layer 112, the first gate electrode 414, the second gate electrode 324 and the first capacitor electrode 141. The first interlayer insulating layer 113 can have a double-layer structure including a first interlayer lower insulating layer 113a and a first interlayer upper insulating layer 113b. The first interlayer lower insulating layer 113a can be formed of a silicon nitride (SiNx) material, and the first interlayer upper insulating layer 113b can be formed of a silicon oxide (SiOx) material. Hydrogen generated in the first interlayer lower insulating layer 113a formed of a silicon nitride (SiNx) material can diffuse into the second channel region 321a of the second active layer 321.

Therefore, as shown in FIG. 8, in a region overlapping the second active layer 321, the first interlayer lower insulating layer 113a formed of a silicon nitride (SiNx) material can be removed, and only the first interlayer upper insulating layer 113b formed of a silicon oxide (SiOx) material can be disposed. Referring to FIG. 8, the first interlayer upper insulating layer 113b can be disposed to directly contact the upper surface and both side surfaces of the second gate electrode 324, which is disposed to overlap the second channel region 321a. For example, the first interlayer upper insulating layer 113b can be formed to surround the upper surface and both side surfaces of the second gate electrode 324.

Referring to FIG. 8, the display apparatus 100 according to another embodiment of the present invention, the first interlayer upper insulating layer 113b formed of a silicon oxide (SiOx) material can be formed in contact with an upper surface and both side surface of the second gate electrode 324 which is disposed to overlap the second active layer in order to block the diffusion of hydrogen, which can decrease the s-factor value of the second thin-film transistor 320, which is formed of a polysilicon material and is disposed the display area DA. For example, the first interlayer upper insulating layer 113b can be formed of a silicon dioxide ($SiO_2$) material.

In addition, the first interlayer insulating layer 113 formed of a double layer can be formed in a region overlapping with the first active layer 411 of the first thin film transistor 410 which is formed of a polysilicon material and is disposed on the display area DA. For example, a first interlayer lower insulating layer 113a formed of a silicon nitride (SiNx) material and a second interlayer upper insulating layer 113b formed of a silicon nitride (SiNx) material having a lower hydrogen content can be formed. Thus, the first interlayer lower insulating layer 113a formed of a silicon nitride (SiNx) material can be formed in direct contact with the upper surface and the both side surface of the first gate electrode 414 disposed to overlap the first active layer 411.

As shown in FIG. 8, the stacked structure of the first interlayer insulating layer 113 on the first gate electrode 414 of the first thin-film transistor 410, which is disposed in the non-display area NDA, and the second gate electrode 324 of the second thin-film transistor 320, which is disposed in the display area DA, are formed in different, thus creating a difference between the degree of diffusion of hydrogen into a first channel region 411a of the first active layer 411 and the degree of diffusion of hydrogen into the second channel region 321a of the second active layer 321. The second interlayer lower insulating layer 113b formed of only silicon oxide (SiOx) having lower hydrogen content than silicon nitride (SiNx) can prevent the diffusion of hydrogen into the second active layer 321 of the second thin-film transistor 320.

Therefore, the s-factor value at or below the threshold voltage of the first thin-film transistor 410 can be different from the s-factor value at or below the threshold voltage of the second thin-film transistor 320. There is an advantage in that the characteristics of the device can be made different by controlling the s-factor value at or below the threshold voltage of the second thin-film transistor 320 to be larger. As described above, by differently designing the structure of the insulating layer on the gate electrode according to the location or the characteristics of the thin-film transistor, the characteristics of the thin-film transistor can be made different.

The second source electrode 322 of the second thin-film transistor 320 can include a second source lower electrode 322a and a second source upper electrode 322b. In addition, the second drain electrode 323 can include a second drain lower electrode 323a and a second drain upper electrode 323b. The second source lower electrode 322a and the second drain lower electrode 323a can be formed of the same material as the second capacitor electrode 142 of the storage capacitor 140. In addition, the second source upper electrode 322b and the second drain upper electrode 323b can be formed of the same material as the first source electrode 412 and the first drain electrode 413 of the first thin-film transistor 410. And, the second source upper electrode 322b and the second drain upper electrode 323b can be formed of the same material as the third source electrode 332 and the third drain electrode 333 of the third thin-film transistor 330.

The second source lower electrode 322a and the second drain lower electrode 323a can prevent hydrogen from diffusing into the second channel region 321a of the second active layer 321.

The second source lower electrode 322a can directly contact the second source region 321b of the second active layer 321, which is exposed through the contact hole in the first interlayer insulating layer 113 and the first gate insulating layer 112. In addition, the second drain lower electrode 322b can directly contact the second drain region 321c of the second active layer 321, which is exposed through the contact hole in the first interlayer insulating layer 113 and the first gate insulating layer 112.

Figure 9:
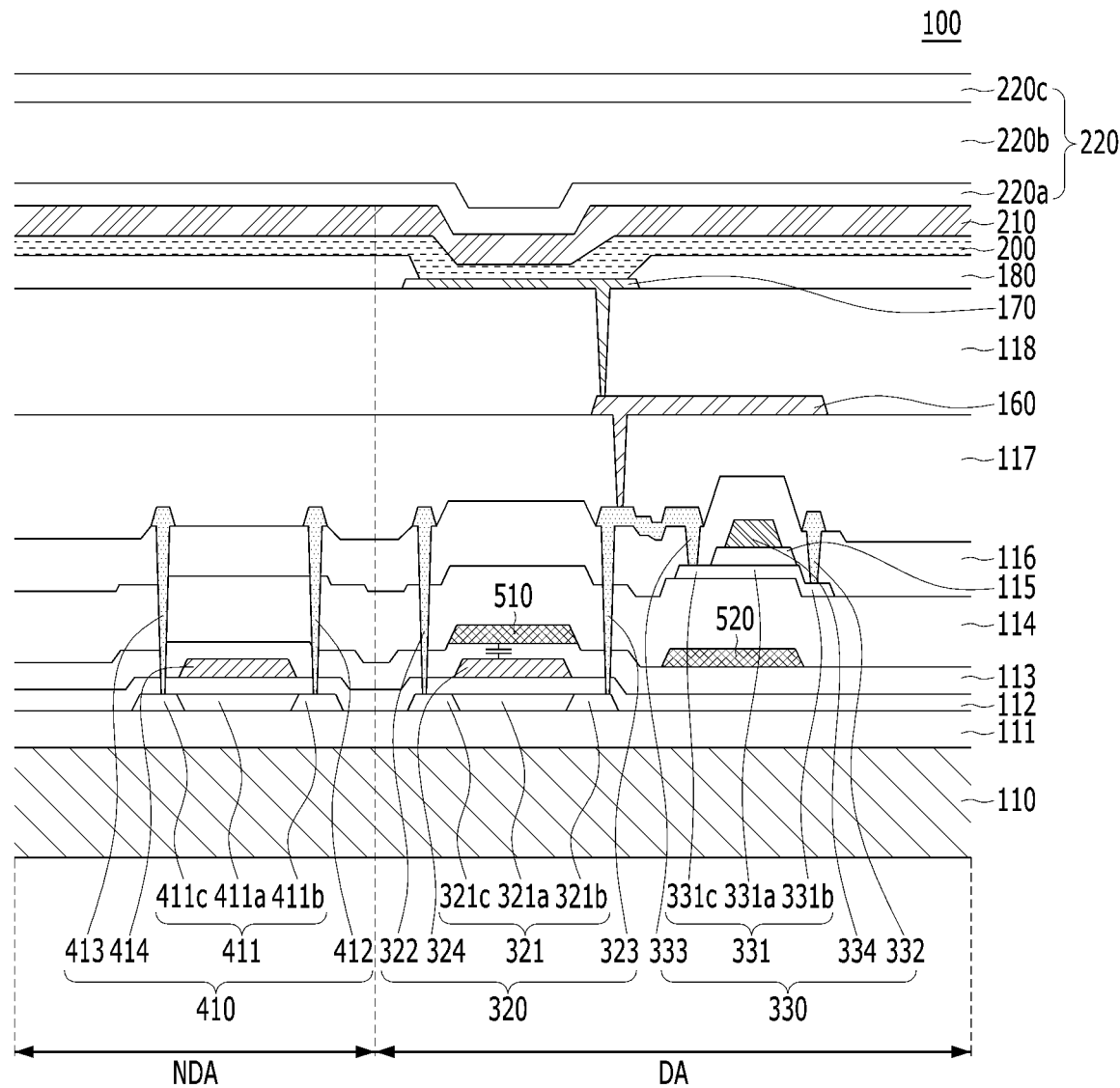
FIG. 9 is a cross-sectional view illustrating a display apparatus according to another embodiment of the present invention.

FIG. 9 is a sectional view illustrating a display apparatus 100 according to another embodiment of the present invention. The description will be given with reference to FIG. 1 along with FIG. 9, and redundant descriptions will be omitted or briefly explained.

Referring to FIG. 9, the display apparatus 100 according to another embodiment of the present invention can include the substrate 110, the first buffer layer 111, the first thin film transistor 410, the second thin film transistor 320, the third thin film transistor 330, the first gate insulating layer 112, the first interlayer insulating layer 113, the second buffer layer 114, the second gate insulating layer 115, the second interlayer insulating layer 116, the first planarization layer 117, the second planarization layer 118, the first auxiliary electrode 160, the first electrode 170, the bank 180, the light-emitting structure 200, the second electrode 210, the encapsulating element 220, a first metal pattern 510 and a second metal pattern 520.

As shown in FIG. 9, the first thin film transistor 410 can be disposed in the non-display area NDA, and the second thin film transistor 320 and the third thin film transistor 330 can be disposed in the display area DA. And, the first thin film transistor 410 disposed in the non-display area NDA and the second thin film transistor 320 disposed in the display area DA can include a polysilicon material. Also, the third thin film transistor 330 can include an oxide material.

The second thin film transistor 320 which is disposed in the display area DA and includes a polysilicon material can be a driving thin film transistor (Driving TFT) electrically connected to the first electrode 170 to supply current to the light-emitting structure 200. And, the third thin film transistor 330 including an oxide semiconductor can be a switching thin film transistor (Switching TFT) controlling the operation of the second thin film transistor 320 which is a driving thin film transistor. However, the present invention is not limited thereto, the second thin film transistor 320 including a polysilicon material can be a switching thin film transistor. And, the third thin film transistor 330 including an oxide semiconductor can be a driving thin film transistor.

Furthermore, the first thin film transistor 410 which is disposed in the non-display area NDA and include a polysilicon material can be a thin film transistor for the driving circuit. The driving circuit can be disposed in the non-display area NDA to operating the pixels of the display area DA. And, the driving circuit can include a first thin film transistor 410.

The second thin film transistor 320 disposed in the display area AA can be formed of n-type transistor (n-type TFT) or p-type transistor (p-type TFT). And, the third thin film transistor 330 disposed in the display area AA can be formed of n-type TFT. Also, the first thin film transistor 410 disposed in the non-display area NDA can be formed of n-type TFT or P-type TFT. For example, the first thin film transistor 410 which is disposed in the non-display area NDA and includes a polysilicon material can be formed of p-type TFT. In this case, the second thin film transistor 320 which is disposed in the display area DA and includes a polysilicon material can also be formed of p-type TFT. And, the third thin film transistor 330 which is disposed in the display area DA and includes an oxide semiconductor can be formed of n-type TFT. As another embodiment, the first thin film transistor 410 which is disposed in the non-display area NDA and includes a polysilicon material can be formed of n-type TFT. In this case, the second thin film transistor 320 which is disposed in the display area DA and includes a polysilicon material can also be formed n-type TFT. In additional, the third thin film transistor 330 which is disposed in the display area DA and includes an oxide semiconductor can be formed of n-type TFT.

The substrate 110 can be formed of glass or a plastic material having flexibility. When the substrate 110 is composed of a plastic material, it can be formed of, for example, polyimide (PI). In FIG. 9, the substrate 110 is represented by a single layer, but is not limited thereto. The substrate 110 can be formed of double polyimide (PI), as in FIG. 1. In addition, an inorganic insulating layer can be formed between the two polyimides (PI).

And, the first buffer layer 111 can be formed on the substrate 110. The first buffer layer 111 can be composed of silicon nitride (SiNx) or silicon oxide (SiOx). In FIG. 9, the first buffer layer 111 is represented by a single layer, but is not limited thereto. The first buffer layer 111 can be formed of multiple layers of alternating silicon nitride (SiNx) and silicon oxide (SiOx), as in FIG. 1.

The first thin-film transistor 110 and the second thin-film transistor 320 can be disposed on the first buffer layer 111.

The first thin-film transistor 410 disposed in the non-display area NDA can include a first active layer 411, a first gate electrode 414, a first source electrode 412 and a first drain electrode 413. The present invention is not limited thereto, the first source electrode 412 can be a drain electrode and the first drain electrode 413 can be a source electrode.

The second thin-film transistor 320 disposed in the display area DA can include a second active layer 321, a second gate electrode 324, a second source electrode 322 and a second drain electrode 323, but the present invention is not limited thereto. For example the second source electrode 322 can be a drain electrode and the second drain electrode 323 can be a source electrode.

The first active layer 411 of the first thin-film transistor 310 and the second active layer 321 of the second thin-film transistor 320 can be formed on the first buffer layer 111. The first active layer 411 and the second active layer 321 can include polysilicon. For example, the first active layer 411 and the second active layer 321 can include low-temperature polysilicon (LTPS). And, the first active layer 411 includes the first channel region 411a, the first source region 411b and the first drain region 411c. The second active layer 321 can include the second channel region 321a, the second source region 321b and the second drain region 321c.

The first gate insulating layer 112 can be formed on the first active layer 411 and the second active layer 321. And, the first gate electrode 414 of the first thin-film transistor 410 and the second gate electrode 324 of the second thin-film transistor 320 can be formed on the first gate insulating layer 112. Also, the first interlayer insulating layer 113 can be formed on the first gate electrode 414 and the second gate electrode 324.

The first metal pattern 510 and the second metal pattern 520 can be formed on the first interlayer insulating layer 113. The first metal pattern 510 and the second metal pattern 520 can include a single layer or multiple layers containing any one of molybdenum (Mo), copper (Cu), titanium (Ti), aluminum (Al), chromium (Cr), gold (Au), nickel (Ni) or neodymium (Nd), or an alloy thereof. The first metal patterns 510 can be disposed to overlap the second gate electrode 324 of the second thin film transistor 320 which is disposed in the display area DA and includes a polysilicon material. The first metal pattern 510 can overlap the second gate electrode 324 of the second thin film transistor 320 to form a storage capacitor.

In this way, the second gate electrode 324 can be used as a capacitor electrode to form the storage capacitor. And, the first metal pattern 510 can be formed to overlap the second gate electrode 324 with the first interlayer insulating layer 113 interposed therebetween. In this case, the first metal pattern 510 can be used as a capacitor electrode together with the second gate electrode 324.

And, as shown in FIG. 9, the first metal pattern 510 can be formed only on the second gate electrode 324 of the second thin film transistor 320 including polysilicon among the thin film transistors disposed in the display area DA. However, the present invention is not limited thereto. For example, the first metal pattern 510 can be formed only on a gate electrode of the driving thin film transistor among the thin film transistors disposed in the display area DA. The first metal pattern 510 can prevent hydrogen generated from the insulating layer by the process of forming the third thin film transistor 330 including the oxide semiconductor from being diffused into the second active layer 321 of the second thin film transistor 320.

The second metal pattern 520 can be disposed to overlap the third active layer 331 of the third thin film transistor 330. The second metal pattern 520 can serve to block external light from reaching the third channel region 331a of the third active layer 331. Thus, the second metal pattern 520 can be disposed to overlap the third channel region 331a of the third active layer 331. And, a width of the second metal pattern 520 can be formed larger than a width of the third channel region 331a.

The second buffer layer 114 can be formed on the first metal pattern 510 and the second metal pattern 520. The second buffer layer 114 can include a single layer of silicon nitride (SiNx) or silicon oxide (SiOx) or multiple layers thereof. In FIG. 9, the second buffer layer 114 is represented by a single layer of silicon nitride (SiNx) or silicon oxide (SiOx), but is not limited thereto. The second buffer layer 114 can be formed of multiple layers of alternating silicon nitride (SiNx) and silicon oxide (SiOx), as in FIG. 1.

The third active layer 331 of the third thin-film transistor 330 can be disposed on the second buffer layer 114. The third thin-film transistor 330 can include the third active layer 331, the second gate insulating layer 115, a third gate electrode 334, a third source electrode 332 and a third drain electrode 333. In another embodiment of the present invention, the third source electrode 332 can be a drain electrode, and the third drain electrode 333 can be a source electrode.

The third active layer 331 can include a third channel region 331a in which a channel is formed during driving of the third thin-film transistor 330, and a third source region 331b and a third drain region 331c on both sides of the third channel region 331a. The third active layer 331 can be formed of an oxide semiconductor.

The third channel region 331a of the third active layer 331 can be disposed so as to overlap the third gate electrode 334. In addition, the third source region 331b and the third drain region 331c of the third active layer 331 can be disposed on both sides of the third channel region 331a. In addition, the second gate insulating layer 115 can be disposed between the third gate electrode 334 and the third active layer 331. And, the second gate insulating layer 115 can be disposed between the third gate electrode 334 and the third gate region 331a of the third active layer 331 overlapping with the third gate electrode 334.

The third gate electrode 334 can be patterned to overlap the third channel region 331a of the third active layer 331. In addition, the second gate insulating layer 115 can be patterned to overlap the third channel region 331a of the third active layer 331. Thus, the third gate electrode 334 and the second gate insulating layer 115 can overlap the third channel region 331a of the third active layer 331.

The second interlayer insulating layer 116 can be disposed on the second buffer layer 114, the third active layer 331 and the gate electrode 334.

The first source electrode 412 and the first drain electrode 413 of the first thin-film transistor 410, and the second source electrode 322 and the second drain electrode 323 of the second thin-film transistor 320 can be disposed on the second interlayer insulating layer 116. In addition, the third source electrode 332 and the third drain electrode 333 of the third thin-film transistor 330 can be disposed on the second interlayer insulating layer 116.

The first source electrode 412 and the first drain electrode 413 of the first thin-film transistor 410 disposed in the non-display area NDA can be connected to the first active layer 411 of the first thin-film transistor 410 through the contact hole formed in the first gate insulating layer 112, the first interlayer insulating layer 113, the second buffer layer 114 and the second interlayer insulating layer 116. Thus, the first source electrode 412 of the first thin-film transistor 410 can be connected to the first source region 411b of the first active layer 411 through the contact hole formed in the first gate insulating layer 112, the first interlayer insulating layer 113, the second buffer layer 114 and the second interlayer insulating layer 116. And, the first drain electrode 413 of the first thin-film transistor 410 can be connected to the first drain region 411c of the first active layer 411 through the contact hole formed in the first gate insulating layer 112, the first interlayer insulating layer 113, the second buffer layer 114 and the second interlayer insulating layer 116.

And, the second source electrode 322 and the second drain electrode 323 of the second thin-film transistor 320 disposed in the display area DA can be connected to the second active layer 321 of the second thin-film transistor 320 through the contact hole formed in the first gate insulating layer 112, the first interlayer insulating layer 113, the second buffer layer 114 and the second interlayer insulating layer 116. Therefore, the second source electrode 322 of the second thin-film transistor 320 can be connected to the second source region 321b of the second active layer 321 through the contact hole formed in the second gate insulating layer 112, the first interlayer insulating layer 113, the second buffer layer 114 and the second interlayer insulating layer 116. In addition, the second drain electrode 323 of the second thin-film transistor 320 can be connected to the second drain region 321c of the second active layer 311 through the contact hole formed in the first gate insulating layer 112, the first interlayer insulating layer 113, the second buffer layer 114 and the second interlayer insulating layer 116.

In addition, the third source electrode 332 and the third drain electrode 333 of the third thin-film transistor 330 can be connected to the third active layer 331 through the contact hole formed in the second interlayer insulating layer 116. Thus, the third source electrode 332 of the third thin-film transistor 330 can be connected to the third source region 331b of the third active layer 331 through the contact hole formed in the second interlayer insulating layer 116, and the third drain electrode 333 of the third thin-film transistor 330 can be connected to the third drain region 331c of the third active layer 331 through the contact hole formed in the second interlayer insulating layer 116.

The first source electrode 412 and the first drain electrode 413 of the first thin-film transistor 410, the second source electrode 322 and the second drain electrode 323 of the second thin-film transistor 320, and the third source electrode 332 and the third drain electrodes 333 of the third thin-film transistor 330 can be formed through the same process. In addition, the first source electrode 412 and the first drain electrode 413 of the first thin-film transistor 410, the second source electrode 322 and the second drain electrode 323 of the second thin-film transistor 320, and the third source electrode 332 and the third drain electrode 333 of the third thin-film transistor 330 can be formed of the same material.

The second drain electrode 323 of the second thin film transistor 320 can be connected to and integrated with the third drain electrode 333 of the third thin-film transistor 330. However, the present invention is not limited thereto. For example, the second drain electrode 323 of the second thin film transistor 320 can be connected to and integrated with the third source electrode 332 of the third thin-film transistor 330.

The first planarization layer 117 can be formed on the first thin film transistor 410, the second thin film transistor 320 and the third thin film transistor 330. The auxiliary electrode 160 can be disposed on the first planarization layer 117. The auxiliary electrode 160 can be connected to the second drain electrode 323 of the second thin-film transistor 320 through the contact hole in the first planarization layer 117. And, the second planarization layer 118 can be disposed on the auxiliary electrode 160 and the first planarization layer 117.

The first electrode 170 can be disposed on the second planarization layer 118. The first electrode 170 can be electrically connected to the auxiliary electrode 160 through the contact hole formed in the second planarization layer 118. Thus, the first electrode 170 can be connected to the auxiliary electrode 160 through the contact hole formed in the second planarization layer 118 and thereby can be electrically connected to the second thin-film transistor 320. The second thin-film transistor 320 connected to the first electrode 170 can be a driving thin-film transistor.

A bank 180 can be disposed on the first electrode 170 and the second planarization layer 118. An opening to expose the first electrode 170 can be formed in the bank 180. Since the bank 180 can define an emission region of the display apparatus 100, the bank 180 can be referred to as a "pixel-defining film". A spacer can be further disposed on the bank 180, as in FIG. 1.

A light-emitting structure 200 including a light-emitting layer can further be disposed on the first electrode 170. The light-emitting structure 200 can include a hole layer, a light-emitting layer and an electron layer, which are stacked on the first electrode 170 in that order or in the reverse order. In addition, the light-emitting structure 200 can include first and second light-emitting structures such that a charge generation layer is interposed therebetween. In this case, any one of the first and second light-emitting structures generates blue light, and the other of the first and second light-emitting structures generates yellow-green light, thereby generating white light. The white light generated in the light-emitting structure 200 is incident upon a color filter disposed on an upper portion of the light-emitting structure 200, thereby forming a color image. In another embodiment, each light-emitting structure 200 generates color light corresponding to each sub-pixel, so that a color image can be realized without a separate color filter. For example the light-emitting structure 200 of the red R sub-pixel generates red light, the light-emitting structure 200 of the green G sub-pixel generates green light, and the light-emitting structure 200 of the blue B sub-pixel generates blue light.

A second electrode 210 can be further disposed on the light-emitting structure 200. The second electrode 210 can be disposed on the light-emitting structure 200 such that the light-emitting structure 200 is interposed between the first electrode 170 and the second electrode 210.

An encapsulating element 220 to prevent moisture permeation can be further disposed on the second electrode 210.

The encapsulating element 220 can include a first inorganic encapsulating layer 220a, a second organic encapsulating layer 220b and a third inorganic encapsulating layer 220c.

Figure 10:
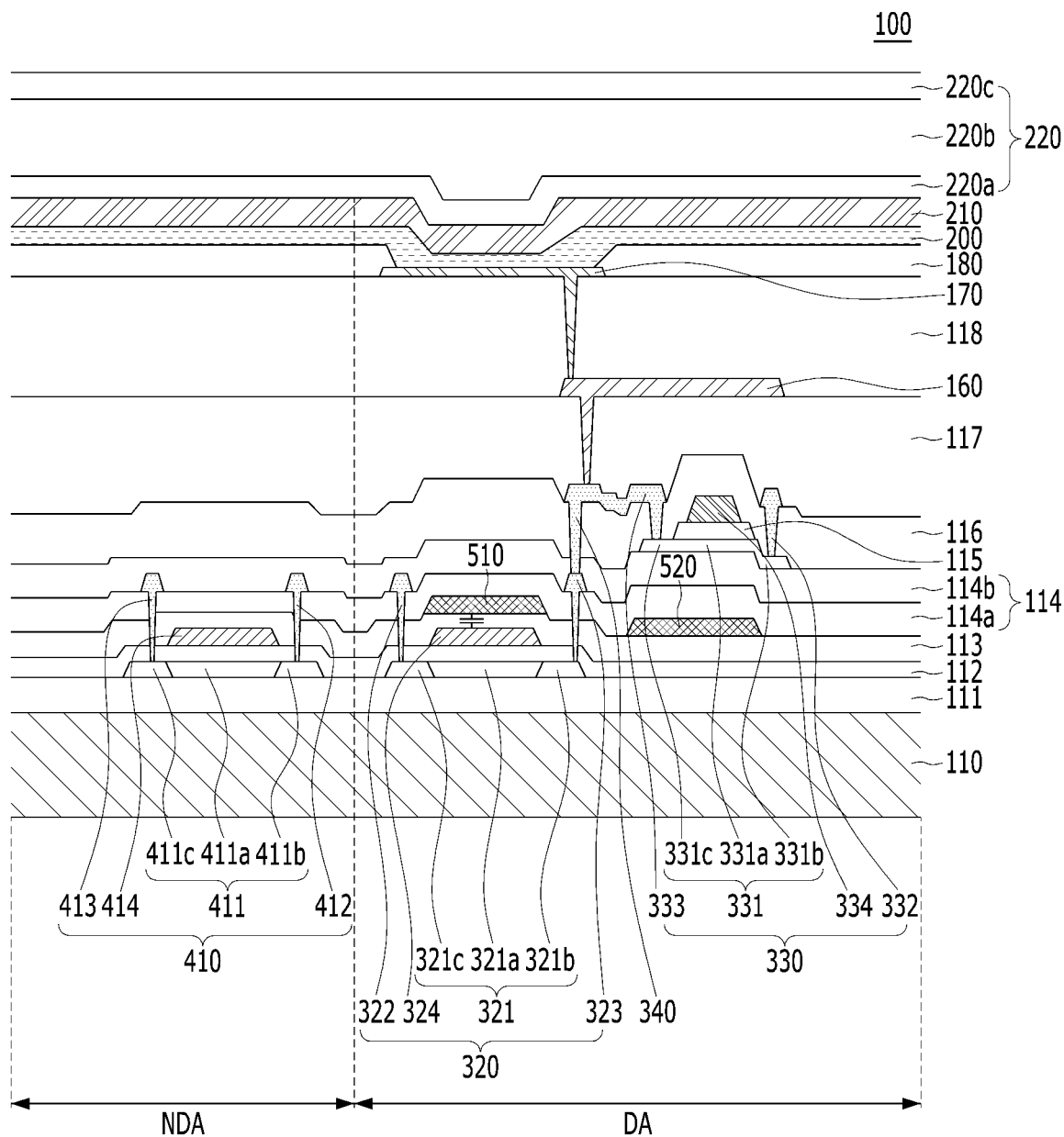
FIG. 10 is a cross-sectional view illustrating a display apparatus according to another embodiment of the present invention.

FIG. 10 is a sectional view illustrating a display apparatus 100 according to another embodiment of the present invention. The description will be given with reference to FIG. 9 along with FIG. 10, and redundant descriptions will be omitted or briefly explained.

For example, the substrate 110, the first buffer layer 111, the first gate insulating layer 112, the first interlayer insulating layer 113, the second gate insulating layer 115, the second interlayer insulating layer 116, the first planarization layer 117, the second planarization layer 118, the auxiliary electrode 160, the first electrode 170, the bank 180, the light-emitting structure 200, the second electrode 210, the encapsulating element 220, the first metal pattern 510, the second metal pattern 520 and the third thin film transistor 330 are substantially the same. Thus, redundant descriptions of the configuration of FIG. 10 that is substantially the same as FIG. 9 is omitted or briefly explained.

Referring to FIG. 10, the display apparatus 100 can include the substrate 110 formed of the display area DA formed of the plurality of pixels, and the non-display area NDA disposed adjacent to the display area DA. And, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the light-emitting structure 200, the second electrode 210, the encapsulating element 220, the first metal pattern 510, the second metal pattern 520, the first thin film transistor 410, the second thin film transistor 320, an auxiliary drain electrode 340, and the third thin film transistor 330 can be formed on the substrate 110. Herein, the first thin film transistor 410 can be disposed in the non-display area NDA of the substrate 110, and the second thin film transistor 320 and the third thin film transistor 330 can be disposed in the display area DA of the substrate 110.

The second thin film transistor 320 disposed in the display area DA can include a polysilicon material. The polysilicon material can include a low-temperature poly-silicon (LTPS). And, the third thin film transistor 330 disposed in the display area DA can include an oxide semiconductor. The second thin film transistor 320 including a polysilicon material can be the driving thin film transistor (Driving TFT) which is electrically connected to the first electrode 170 to supply current to the light-emitting structure 200. And, the third thin film transistor 330 including an oxide semiconductor can be a switching thin film transistor (Switching TFT) controlling the operation of the second thin film transistor 320 which is a driving thin film transistor. However, the present invention is not limited thereto, the second thin film transistor 320 including a polysilicon material can be a switching thin film transistor. And, the third thin film transistor 330 including an oxide semiconductor can be a driving thin film transistor.

The driving circuit to driving the pixels of the display area AA can be disposed on the non-display area NDA. And, the driving circuit can include a first thin film transistor 410. The first thin film transistor 410 disposed in the non-display area NDA can include a polysilicon material.

The second thin film transistor 320 disposed in the display area AA can be formed of n-type transistor (n-type TFT) or p-type transistor (p-type TFT). And, the third thin film transistor 330 disposed in the display area AA can be formed of n-type TFT. Also, the first thin film transistor 410 disposed in the non-display area NDA can be formed of n-type TFT or P-type TFT. For example, the first thin film transistor 410 which is disposed in the non-display area NDA and includes a polysilicon material can be formed of p-type TFT. In this case, the second thin film transistor 320 which is disposed in the display area DA and includes a polysilicon material can also be formed of p-type TFT. And, the third thin film transistor 330 which is disposed in the display area DA and includes an oxide semiconductor can be formed of n-type TFT. As another embodiment, the first thin film transistor 410 which is disposed in the non-display area NDA and includes a polysilicon material can be formed of n-type TFT. In this case, the second thin film transistor 320 which is disposed in the display area DA and includes a polysilicon material can also be formed n-type TFT. In additional, the third thin film transistor 330 which is disposed in the display area DA and includes an oxide semiconductor can be formed of n-type TFT.

Referring to FIG. 10, the second source electrode 322 and the second drain electrode 323 of the second thin film transistor 320 can be formed of the same material as the first source electrode 412 and the first drain electrode 413 of the first thin film transistor 410 in the display apparatus 100.

As shown in FIG. 10, the second lower buffer layer 114a of the second buffer layer 114 can be formed on the first metal pattern 510 and the second metal pattern 520. The second lower buffer layer 114a can be formed of a single layer structure of silicon nitride (SiNx) or silicon oxide (SiOx), or a multi-layer structure thereof. And, the first source electrode 412, the first drain electrode 413, the second source electrode 322 and the second drain electrode 323 can be formed on the second lower buffer layer 114a.

Thus, the first source electrode 412 and the first drain electrode 413 of the first thin film transistor 410 can be disposed on the second lower buffer layer 114a. And, the first source electrode 412 can be in direct contact with the first source region 411b of the first active layer 411 via the contact hole of the second lower buffer layer 114a, the first interlayer insulating layer 113 and the first gate insulating layer 112. Also, the first drain electrode 413 can be in direct contact with the first drain region 411c of the first active layer 411.

In additional, the second source electrode 322 and the second drain electrode 323 of the second thin film transistor 320 can be disposed on the second lower buffer layer 114a. The second source electrode 322 can be in direct contact with the second source region 321b of the second active layer 321 exposed by the contact hole of the second lower buffer layer 114a, the first interlayer insulating layer 113 and the first gate insulating layer 112. Furthermore, the second drain electrode 323 can be in direct contact with the second drain region 321c of the second active layer 321 exposed by the contact hole of the second lower buffer layer 114a, the first interlayer insulating layer 113 and the first gate insulating layer 112.

The second upper buffer layer 114b can be formed on the second lower buffer layer 114a, the first source electrode 412, the first drain electrode 413, the second source electrode 322 and the second drain electrode 323. The second upper buffer layer 114b can be formed in a single layer of silicon oxide (SiOx).

And, the third thin film transistor 330 can be formed on the second upper buffer layer 114b. Referring to FIG. 10, the third active layer 331 of the third thin film transistor 330 can be disposed on the second upper buffer layer 114b. Also, the third active layer 331 can overlap the second metal pattern 520.

In additional, the third gate electrode 334 can be disposed to overlap the third channel region 331c of the third active layer 331 with the second gate insulating layer 115 therebetween. The second interlayer insulating layer 116 can be formed on the third gate electrode 334 and the second upper buffer layer 114b. The third source electrode 332 and the third drain electrode 333 can be in direct contact with the third source region 331b and the third drain region 331c of the third active layer 331 exposed by the contact hole of the second interlayer insulating layer 116, respectively.

The auxiliary drain electrode 340 can be in direct contact with the second drain electrode 323 exposed by the contact hole of the second interlayer insulating layer 116 and the second upper buffer layer 114b. And, the auxiliary drain electrode 340 can be formed to be connected to and be integrated with the third drain electrode 333 of the third thin film transistor 330.

And, the auxiliary drain electrode 340 can be electrically connected to the first electrode 170 through the auxiliary electrode 160. Thus, the second thin film transistor 320 can be electrically connected to the first electrode 170 to supply current to the light-emitting structure 200.

Figure 11:
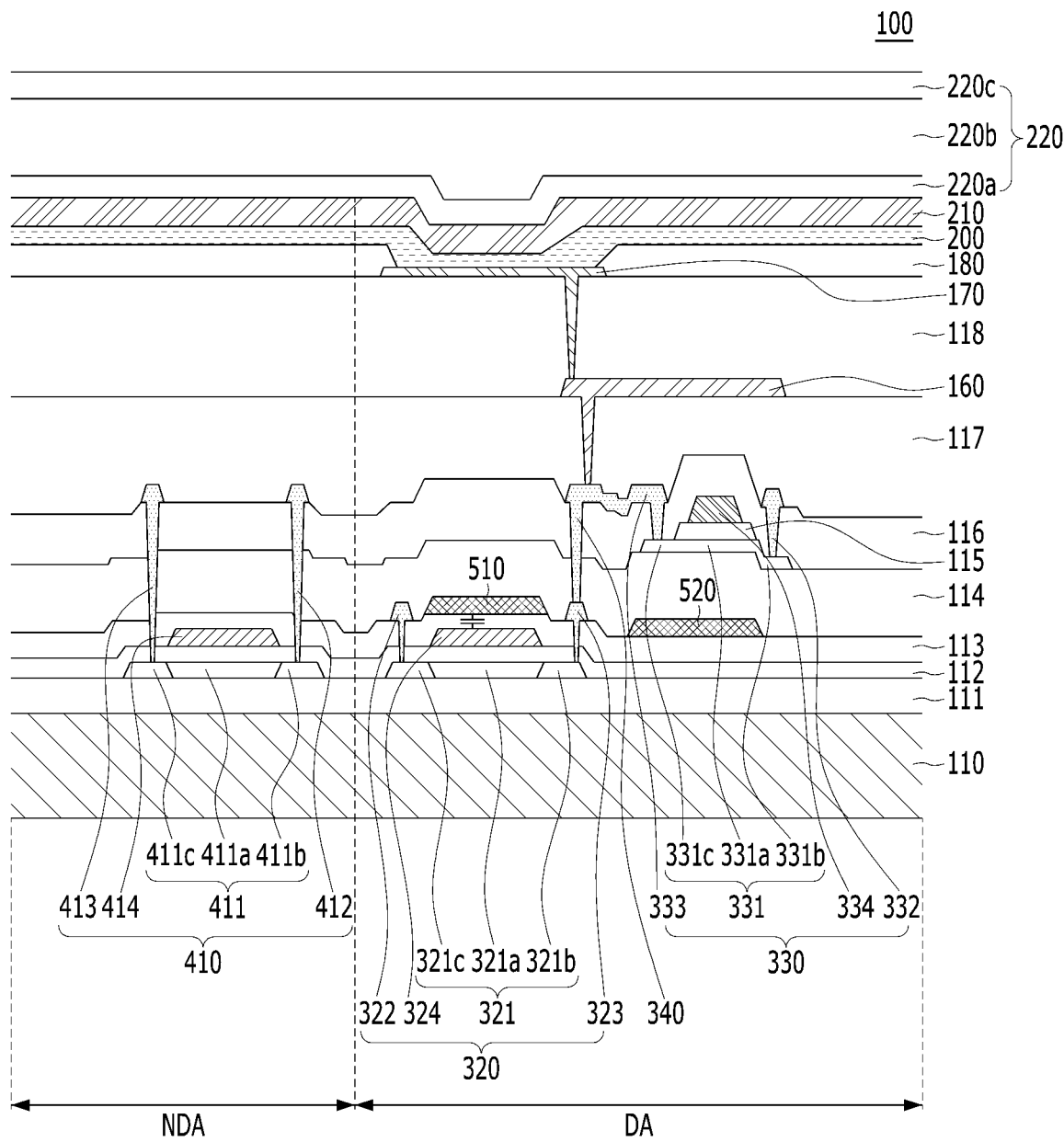
FIG. 11 is a cross-sectional view illustrating a display apparatus according to another embodiment of the present invention.

FIG. 11 is a sectional view illustrating a display apparatus 100 according to another embodiment of the present invention. The description will be given with reference to FIG. 9 along with FIG. 11, and redundant descriptions will be omitted or briefly explained. For example, the substrate 110, the first buffer layer 111, the first gate insulating layer 112, the first interlayer insulating layer 113, the second gate insulating layer 115, the second interlayer insulating layer 116, the first planarization layer 117, the second planarization layer 118, the auxiliary electrode 160, the first electrode 170, the bank 180, the light-emitting structure 200, the second electrode 210, the encapsulating element 220, the first metal pattern 510, the second metal pattern 520, the first thin film transistor 410 and the third thin film transistor 330 are substantially the same. Thus, redundant descriptions of the configuration of FIG. 11 that is substantially the same as FIG. 9 is omitted or briefly explained.

Referring to FIG. 11, the display apparatus 100 can include the substrate 110 formed of the display area DA formed of the plurality of pixels, and the non-display area NDA disposed adjacent to the display area DA. And, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the light-emitting structure 200, the second electrode 210, the encapsulating element 220, the first metal pattern 510, the second metal pattern 520, the first thin film transistor 410, the second thin film transistor 320, an auxiliary drain electrode 340, and the third thin film transistor 330 can be formed on the substrate 110. Herein, the first thin film transistor 410 can be disposed in the non-display area NDA of the substrate 110, and the second thin film transistor 320 and the third thin film transistor 330 can be disposed in the display area DA of the substrate 110.

Referring FIG. 11, the second drain electrode 323 of the second thin film transistor 320 is electrically connected to the first electrode 170 via the auxiliary drain electrode 340 in the display apparatus 100. The auxiliary drain electrode 340 can be formed of the same material as the third source electrode 332 and the third drain electrode 333 of the third thin film transistor 330. The auxiliary drain electrode 340 can be formed of the same material as the first source electrode 412 and the first drain electrode 413 of the first thin film transistor 410. Thus, the auxiliary drain electrode 340 can be formed of the same material as the first source electrode 412, the first drain electrode 413, the third source electrode 332 and the third drain electrode 333.

In FIG. 11, the first interlayer insulating layer 113 can be formed on the first gate electrode 414 of the first thin film transistor 410 and the second gate electrode 324 of the second thin film transistor 320. And, the first metal pattern 510 overlapping with the second gate electrode 324, the second metal pattern 520 overlapping with the third active layer 331, the second source electrode 322 being in direct contact with the second source region 321b and the second drain electrode 323 being in direct contact with the second drain region 321c can be formed on the first interlayer insulating layer 113. Thus, the first metal pattern 510, the second metal pattern 520, the second source electrode 322 and the second drain electrode 323 can be disposed to being in contact with an upper surface of the first interlayer insulating layer 113, and can be the same material.

The second source electrode 322 can be contact with the second source region 321b of the second active layer 321 via the contact hole of the first interlayer insulating layer 113 and the first gate insulating layer 112. And, the second drain electrode 323 can be in contact with the second drain region 321c of the second active layer 321 via the contact hole of the first interlayer insulating layer 113 and the first gate insulating layer 112.

In additional, the second buffer layer 114 can be formed on the first metal pattern 510, the second metal pattern 520, the second source electrode 322 and the second drain electrode 323. The third thin film transistor 330 can be formed on the second buffer layer 114. The third active layer 331 of the third thin film transistor 330 can be disposed on the second buffer layer 114. Also, the third channel region 331a of the third active layer 331 can overlap the second metal pattern 520.

In additional, the third gate electrode 334 can be disposed to overlap the third channel region 331a of the third active layer 331 with the second gate insulating layer 115 therebetween. The second interlayer insulating layer 116 can be formed on the third gate electrode 334 and the second buffer layer 114. The third source electrode 332 and the third drain electrode 333 can be in contact with the third source region 331b and the third drain region 331c of the third active layer 331 exposed by the contact hole of the second interlayer insulating layer 116, respectively.

The auxiliary drain electrode 340 can be in contact with the second drain electrode 323 of the second thin film transistor 320 exposed by the contact hole of the second interlayer insulating layer 116 and the second buffer layer 114. Thus, the second thin film transistor 320 can serve to supply current to the light-emitting structure 200 by being electrically connected to the first electrode 170 via the auxiliary drain electrode 340. The auxiliary drain electrode 340 can be formed to be connected to and be integrated with the third drain electrode 333 of the third thin film transistor 330.

Figure 12:
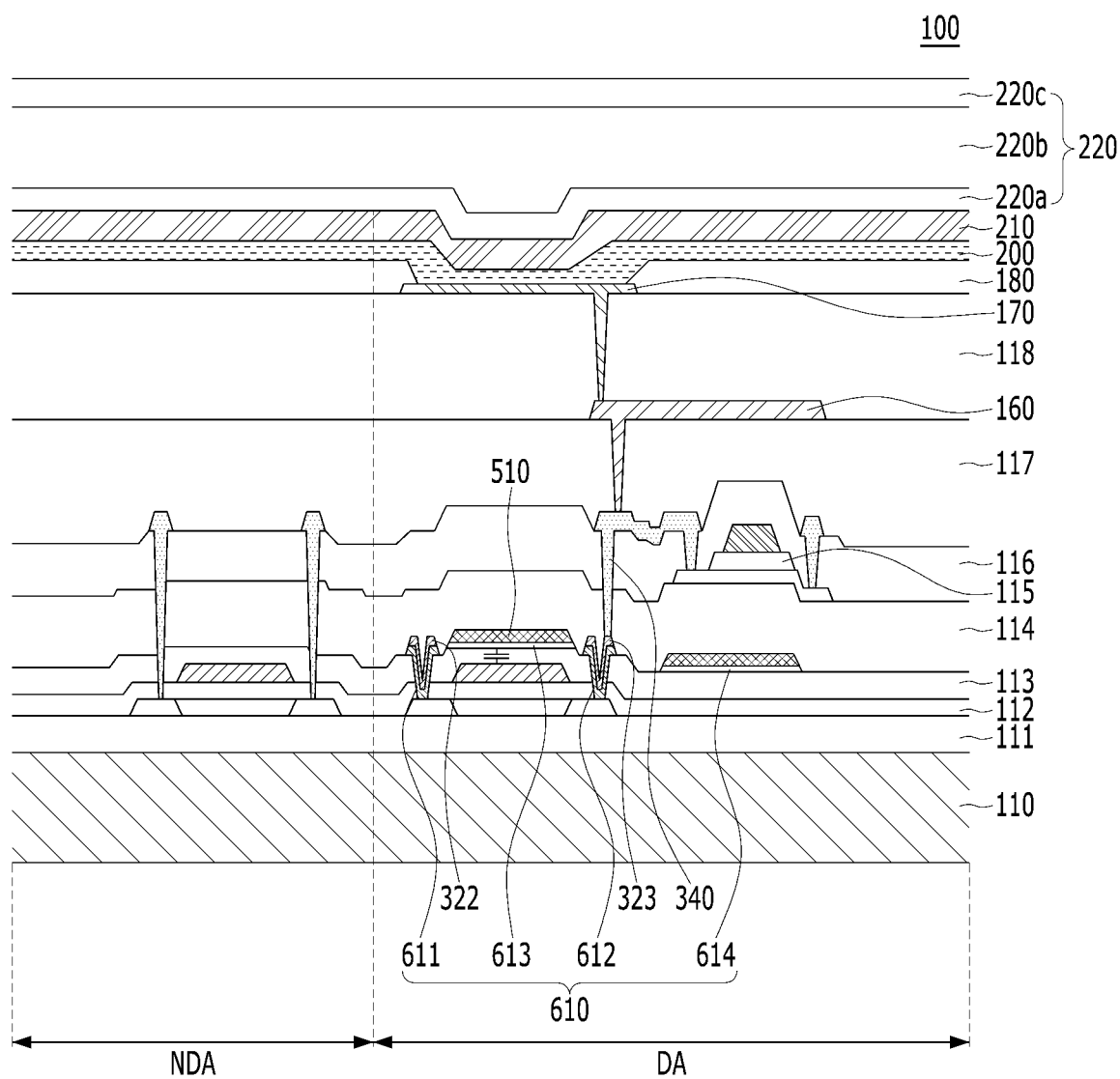
FIG. 12 is a cross-sectional view illustrating a display apparatus according to another embodiment of the present invention.

FIG. 12 is a sectional view illustrating a display apparatus 100 according to another embodiment of the present invention. The description will be given with reference to FIG. 11 along with FIG. 12, and redundant descriptions will be omitted or briefly explained. For example, the substrate 110, the first buffer layer 111, the first gate insulating layer 112, the first interlayer insulating layer 113, the second gate insulating layer 115, the second interlayer insulating layer 116, the first planarization layer 117, the second planarization layer 118, the auxiliary electrode 160, the first electrode 170, the bank 180, the light-emitting structure 200, the second electrode 210, the encapsulating element 220, the first thin film transistor 410 and the third thin film transistor 330 are substantially the same. Thus, redundant descriptions of the configuration of FIG. 12 that is substantially the same as FIG. 11 is omitted or briefly explained.

Referring to FIG. 12, the display apparatus 100 can include the substrate 110 formed of the display area DA formed of the plurality of pixels, and the non-display area NDA disposed adjacent to the display area DA. And, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the light-emitting structure 200, the second electrode 210, the encapsulating element 220, the first metal pattern 510, the second metal pattern 520, the first thin film transistor 410, the second thin film transistor 320, an auxiliary drain electrode 340, the third thin film transistor 330, and a barrier layer 610 can be formed on the substrate 110. Herein, the first thin film transistor 410 can be disposed in the non-display area NDA of the substrate 110, and the second thin film transistor 320 and the third thin film transistor 330 can be disposed in the display area DA of the substrate 110.

Referring FIG. 12, the first interlayer insulating layer 113 can be formed on the first gate electrode 414 of the first thin film transistor 410 and the second gate electrode 324 of the second thin film transistor 320.

And, the first metal pattern 510 overlapping with the second gate electrode 324, the second metal pattern 520 overlapping with the third active layer 331, the second source electrode 322 electrically connected to the second source region 321b and the second drain electrode 323 electrically connected to the second drain region 321c can be formed on the first interlayer insulating layer 113. Thus, the first metal pattern 510, the second metal pattern 520, the second source electrode 322 and the second drain electrode 323 can be disposed on the first interlayer insulating layer 113, and can be the same material.

In additional, as shown in FIG. 12, the barrier layer 610 including a first barrier layer 611, a second barrier layer 612, a third barrier layer 613 and a fourth barrier layer 614 can be disposed on the first interlayer insulating layer 113. For example, the first barrier layer 611 can be disposed between the first interlayer insulating layer 113 and the second source electrode 322 of the second thin film transistor 320. The second barrier layer 612 can be disposed between the first interlayer insulating layer 113 and the second drain electrode 323 of the second thin film transistor 320. And, the third barrier layer 613 can be disposed between the first metal pattern 510 and the first interlayer insulating layer 113. The fourth barrier layer 614 can be disposed between the first interlayer insulating layer 113 and the second metal pattern 520.

Thus, the barrier layer 610 can be disposed on the first interlayer insulating layer 113. And, the second source electrode 322, the second drain electrode 323, the first metal pattern 510 and the second metal pattern 520 on the barrier layer 610 can have the same material. For example, the first barrier layer 611, the second barrier layer 612, the third barrier layer 613 and the fourth barrier layer 614 on the first interlayer insulating layer 113 can have the same material. Also, the second source electrode 322 can be disposed on the first barrier layer 611, and the second drain electrode 323 can be disposed on the second barrier layer 612. In additional, the first metal pattern 510 can be disposed on the third barrier layer 613, and the second metal pattern 520 can be disposed on the fourth barrier layer 614.

The first barrier layer 611 and the second source electrode 322 on the first barrier layer 611 overlap the second source region 321b of the second active layer 321. And, the second barrier layer 612 and the second drain electrode 323 on the second barrier layer 612 overlap the second drain region 321c of the second active layer 321. Also, the third barrier layer 613 and the first metal pattern 510 on the third barrier layer 613 overlap the second channel region 321a of the second active layer 321. Furthermore, the fourth barrier layer 614 and the second metal pattern 520 on the fourth barrier layer 614 overlap the third channel region 331a of the third active layer 331.

The first barrier layer 611, the second barrier layer 612, the third barrier layer 613 and the fourth barrier layer 614 can be a metal material capable of stable bonding with hydrogen (H). For example, the barrier layer 610 can be a metal material, such as titanium (Ti), calcium (Ca), yttrium (Y), magnesium (Mg), tantalum (Ta), and vanadium (V). Thus, the first barrier layer 611, the second barrier layer 612, and the third barrier layer 613 can prevent hydrogen (H) from diffusing to the second active layer 321 of the second thin film transistor 320. And, the fourth barrier layer 614 can prevent hydrogen (H) from diffusing to the third active layer 331 of the third thin film transistor 330.

As shown in FIG. 12, the first barrier layer 611 and the second barrier layer 612 can be in contact with the second source region 321b and the second drain region 321c of the second active layer 321 which are exposed by the contact hole of the first interlayer insulating layer 113 and the first gate insulating layer 112, respectively.

The first barrier layer 611, the second source electrode 322, the second barrier layer 612, the second drain electrode 323, the third barrier layer 613, the first metal pattern 510, the fourth barrier layer 614 and the second metal pattern 520 can be formed by the same photolithography process. For example, after depositing the first metal layer for the barrier layer 610, the second metal layer for the second source electrode 322, the second drain electrode 323, the first metal pattern 510 and the second metal pattern 520 can be successively deposited on the first metal layer. Then, the photo-resist can be formed on an upper surface stacked the first metal layer and the second metal layer. And, the photo-resist can be patterned through an exposure process using a mask. In additional, the etching process for patterning the first metal layer and the second metal layer can be performed using the patterned photo-resist, so that a barrier layer 610 can be formed by the first metal layer, and the second source electrode 322, the second drain electrode 323, the first metal pattern 510 and the second metal pattern 520 can be formed by the second metal layer. In this way, the first barrier layer 611, the second source electrode 322, the second barrier layer 612, the second drain electrode 323, the third barrier layer 613, the first metal pattern 510, the fourth barrier layer 614, and the second metal pattern 520 are formed through one photolithography process. Therefore, there is an advantage that can reduce the production cost.

In FIG. 12, it is described that the first barrier layer 611 is disposed on a lower surface of the second source electrode 322, but the present invention is not limited thereto. For example, the first barrier 611 can be disposed in contact with an upper surface of the second source electrode 322. Alternatively, the first barrier 611 can be disposed in contact with the lower surface and the upper surface of the second source electrode 322. And, it is described that second barrier layer 612 is disposed on a lower surface of the second drain electrode 323, but the present invention is not limited thereto. For example, the second barrier 612 can be disposed in contact with an upper surface of the second drain electrode 323. Alternatively, the second barrier 612 can be disposed in contact with the lower surface and the upper surface of the second drain electrode 323.

Furthermore, it is described that the third barrier layer 613 is disposed on a lower surface of the first metal pattern 510, but the present invention is not limited thereto. For example, the third barrier layer 613 can be disposed in contact with an upper surface of the first metal pattern 510. Alternatively, the third barrier 613 can be disposed in contact with the lower surface and the upper surface of the first metal pattern 510. And, it is described that the fourth barrier layer 614 is disposed on a lower surface of the second metal pattern 520, but the present invention is not limited thereto. For example, the fourth barrier layer 614 can be disposed in contact with an upper surface of the second metal pattern 520. Alternatively, the fourth barrier 614 can be disposed in contact with the lower surface and the upper surface of the second metal pattern 520.

The first barrier layer 611 and the second barrier layer 612 can prevent hydrogen (H) from diffusing to the second active layer 321 of the second thin film transistor 320. In detail, the second source electrode 322 and the second drain electrode 323 can be formed of a metal, such as molybdenum (Mo), copper (Cu), or aluminum (Al) which have unstable hydrogen (H) bonding compared to the first barrier layer 611 and the second barrier layer 612. During a depositing process for forming the second buffer layer 114 on the second source electrode 322 and the second drain electrode 323, hydrogen (H) in the chamber can be bonded with the metal material of the second source electrode 322 and the second drain electrode 323. And, the unstable bonding between the hydrogen (H) and the metal material of the second source electrode 322 and the second drain electrode 323 can be broken by the heat treatment process for the third active layer 331 of the third thin film transistor 330. When the bonding between the hydrogen (H) and the metal material of the second source electrode 322 and the second drain electrode 323 is broken, the hydrogen (H) emitted from the second source electrode 322 and the second drain electrode 323 permeate into the second active layer 321 of the second thin film transistor 320. And, the hydrogen (H) permeated into the second active layer 321 can re-hydrogenated in the second active layer 321, so that the characteristics of the second thin film transistor 320 can degraded. The first barrier layer 611 and the second barrier layer 612 which are respectively disposed between the upper surface of the second active layer 321 and the lower surface of the second source electrode 322 and the second drain electrode 323 can bond with hydrogen (H) emitted from the second source electrode 322 and the second drain electrode 323. Thus, the first barrier layer 611 and the second barrier layer 612 which are formed of a metal material capable of stable bonding with hydrogen (H) can prevent from diffusing hydrogen (H) to the second active layer 321 by stable bonding with hydrogen (H) generated by the manufacturing process. And, deteriorating the characteristics of the second thin film transistor 320 can be prevented by preventing re-hydrogenated in the second active layer 321.

The hydrogen (H) generated in the second source electrode 321 and the second drain electrode 322 which are in direct contact with the second active layer 321 can have the greatest influence on the deterioration of the characteristics of the second thin film transistor 320. Therefore, the third barrier layer 613 and the fourth barrier layer 614 may not be formed on the lower surface or the upper surface of the first metal pattern 510 and the second metal pattern 520.

Referring to FIG. 12, among the second thin film transistor 320 and the third thin film transistor 330 which are disposed in the display area DA of the substrate 110, the first barrier layer 611 and the second barrier layer 612 can be respectively disposed only on lower surfaces of the second source electrode 322 and the second drain electrode 323 of the second thin film transistor 320 including a polysilicon material. And, the first source electrode 412 and the first drain electrode 413 of the first thin film transistor 310 which includes a polysilicon material and is disposed in the non-display area NDA can be disposed on a layer different from the second source electrode 322 and the second drain electrode 323 of the second thin film transistor 320 which includes a polysilicon material and is disposed in the display area DA.

Figure 13:
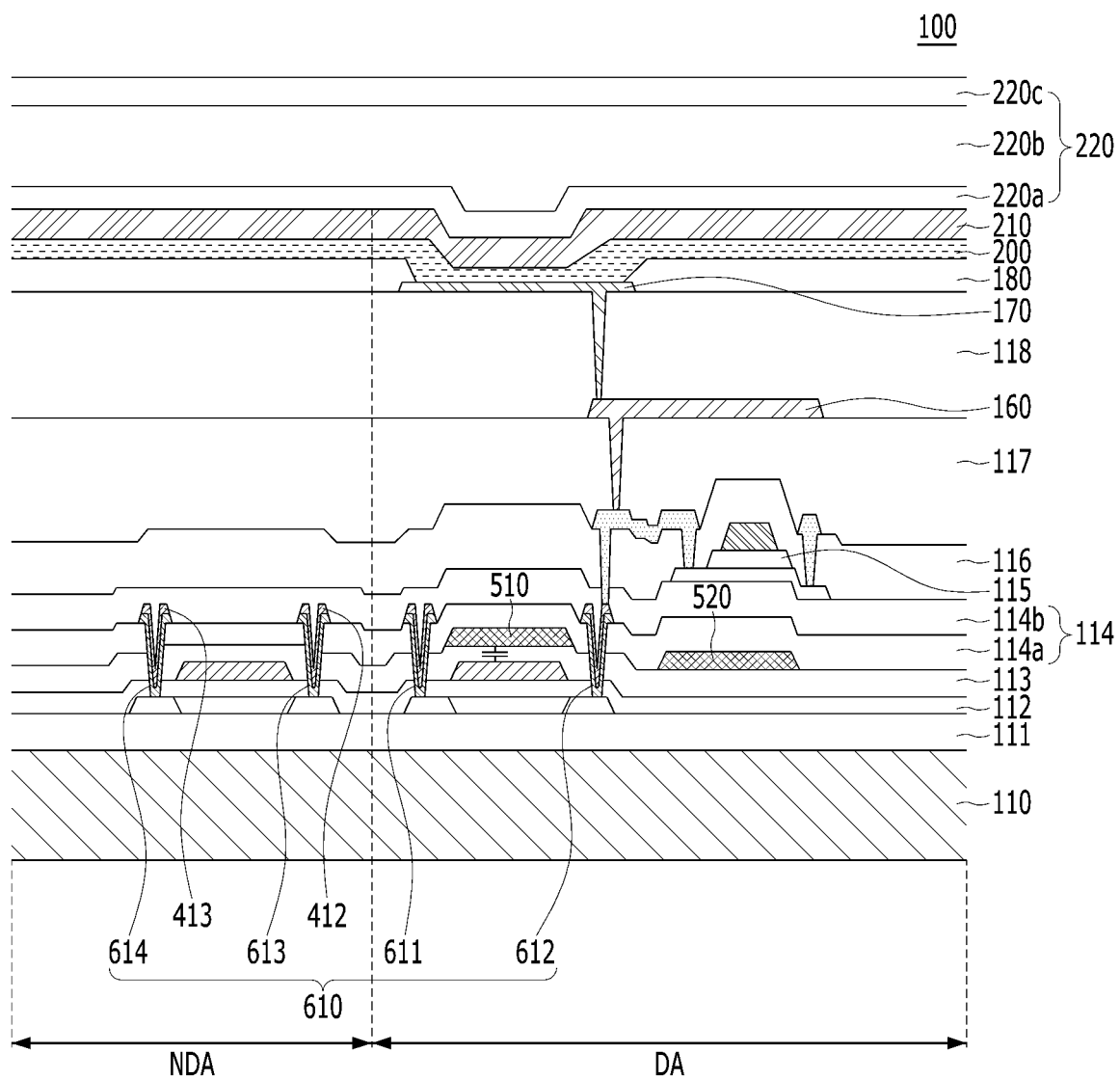
FIG. 13 is a cross-sectional view illustrating a display apparatus according to another embodiment of the present invention.

FIG. 13 is a sectional view illustrating a display apparatus 100 according to another embodiment of the present invention. The description will be given with reference to FIG. 10 along with FIG. 13, and redundant descriptions will be omitted or briefly explained. For example, the substrate 110, the first buffer layer 111, the first gate insulating layer 112, the first interlayer insulating layer 113, the second gate insulating layer 115, the second interlayer insulating layer 116, the first planarization layer 117, the second planarization layer 118, the auxiliary electrode 160, the first electrode 170, the bank 180, the light-emitting structure 200, the second electrode 210, the encapsulating element 220, the third thin film transistor 330, the first metal pattern 510 and the second metal pattern 520 are substantially the same. Thus, redundant descriptions of the configuration of FIG. 13 that is substantially the same as FIG. 10 is omitted or briefly explained.

Referring to FIG. 13, the display apparatus 100 can include the substrate 110 formed of the display area DA formed of the plurality of pixels, and the non-display area NDA disposed adjacent to the display area DA. And, the first buffer layer 111, the first gate insulating layer 112, the first interlayer insulating layer 113, the second buffer layer 114, the second gate insulating layer 115, the second interlayer insulating layer 116, the first planarization layer 117, the auxiliary electrode 160, the second planarization layer 118, the first electrode 170, the bank 180, the light-emitting structure 200, the second electrode 210, the encapsulating element 220, the first metal pattern 510, the second metal pattern 520, the first thin film transistor 410, the second thin film transistor 320, an auxiliary drain electrode 340, the third thin film transistor 330, and a barrier layer 610 can be formed on the substrate 110. Herein, the first thin film transistor 410 can be disposed in the non-display area NDA of the substrate 110, and the second thin film transistor 320 and the third thin film transistor 330 can be disposed in the display area DA of the substrate 110.

Referring FIG. 13, the first interlayer insulating layer 113 can be formed on the first gate electrode 414 of the first thin film transistor 410 and the second gate electrode 324 of the second thin film transistor 320. And, the first metal pattern 510 overlapping with the second gate electrode 324, the second metal pattern 520 overlapping with the third active layer 331 can be formed on the first interlayer insulating layer 113. Thus, the first metal pattern 510 and the second metal pattern 520 can be disposed on the first interlayer insulating layer 113, and have the same material.

The second lower buffer layer 114a can be formed on the first metal pattern 510 and the second metal pattern 520. The second lower buffer layer 114a can be formed of a single layer of silicon nitride (SiNx) or a multiple layer of silicon nitride (SiNx) and silicon oxide (SiOx) alternately stacked. For example, the second lower buffer layer 114a can be formed of a single layer of silicon nitride (SiNx). Alternately, the second lower buffer layer 114a can be formed of a double layer stacked in order of silicon oxide (SiOx) and silicon nitride (SiNx). Alternately, the second lower buffer layer 114a can be a triple layer stacked in the order of silicon nitride (SiNx), silicon oxide (SiOx), and silicon nitride (SiNx).

And, the first source electrode 412 electrically connected to the first source region 411b of the first active layer 411, the first drain electrode 413 electrically connected to the first drain region 411c of the first active layer 411, the second source electrode 322 electrically connected to the second source region 321b of the second active layer 321, and the second drain electrode 323 electrically connected to the second drain region 321c of the second active layer 321 can be formed on the second lower buffer layer 114a. Thus, the first source electrode 412, the first drain electrode 413, the second source electrode 322 and the second drain electrode 323 can be disposed on the second lower buffer layer 114a, and can be the same material.

In additional, the barrier layer 610 including a first barrier layer 611, a second barrier layer 612, a third barrier layer 613 and a fourth barrier layer 614 can be disposed on the second lower buffer layer 114a. For example, the first barrier layer 611 can be disposed between the second lower buffer layer 114a and the second source electrode 322 of the second thin film transistor 320. The second barrier layer 612 can be disposed between the second lower buffer layer 114a and the second drain electrode 323 of the second thin film transistor 320. And, the third barrier layer 613 can be disposed between the second lower buffer layer 114a and the first source electrode 412 of the first thin film transistor 410. The fourth barrier layer 614 can be disposed between the second lower buffer layer 114a and the first drain electrode 413 of the first thin film transistor 411.

Thus, the barrier layer 610 can be disposed on the second lower buffer layer 114a. And, the second source electrode 322, the second drain electrode 323, the first source electrode 412 and the first drain electrode 413 on the barrier layer 610 can have the same material. For example, the first barrier layer 611, the second barrier layer 612, the third barrier layer 613 and the fourth barrier layer 614 on the second lower buffer layer 114a can have the same material. Also, the second source electrode 322 can be disposed on the first barrier layer 611, and the second drain electrode 323 can be disposed on the second barrier layer 612. In additional, the first source electrode 412 can be disposed on the third barrier layer 613, and the first drain electrode 413 can be disposed on the fourth barrier layer 614.

The first barrier layer 611 and the second source electrode 322 on the first barrier layer 611 overlap the second source region 321b of the second active layer 321. And, the second barrier layer 612 and the second drain electrode 323 on the second barrier layer 612 overlap the second drain region 321c of the second active layer 321. Also, the third barrier layer 613 and the first source electrode 412 on the third barrier layer 613 overlap the first source region 411b of the first active layer 411. Furthermore, the fourth barrier layer 614 and the first drain electrode 413 on the fourth barrier layer 614 overlap the first drain region 411c of the first active layer 411.

The first barrier layer 611, the second barrier layer 612, the third barrier layer 613 and the fourth barrier layer 614 can be a metal material capable of stable bonding with hydrogen (H). For example, the barrier layer 610 can be a metal material, such as titanium (Ti), calcium (Ca), yttrium (Y), magnesium (Mg), tantalum (Ta), and vanadium (V). Thus, the first barrier layer 611 and the second barrier layer 612 can prevent hydrogen (H) from diffusing to the second active layer 321 of the second thin film transistor 320. And, the third barrier layer 613 and the fourth barrier layer 614 can prevent hydrogen (H) from diffusing to the first active layer 411 of the first thin film transistor 410.

As shown in FIG. 13, the first barrier layer 611 and the second barrier layer 612 can be in contact with the second source region 321b and the second drain region 321c of the second active layer 321 which are exposed by the contact hole of the second lower buffer layer 114a, the first interlayer insulating layer 113 and the first gate insulating layer 112, respectively.

And, the third barrier layer 613 and the fourth barrier layer 614 can be in contact with the first source region 411b and the first drain region 411c of the first active layer 411 exposed by the contact hole of the second lower buffer layer 114a, the first interlayer insulating layer 113 and the first gate insulating layer 112, respectively.

The first barrier layer 611, the second source electrode 322, the second barrier layer 612, the second drain electrode 323, the third barrier layer 613, the first source electrode 412, the fourth barrier layer 614 and the first drain electrode 413 can be formed through one photolithography process.

In FIG. 13, it is described that the first barrier layer 611 is disposed on a lower surface of the second source electrode 322, but the present invention is not limited thereto. For example, the first barrier 611 can be disposed in contact with an upper surface of the second source electrode 322. Alternatively, the first barrier 611 can be disposed in contact with the lower surface and the upper surface of the second source electrode 322. And, it is described that second barrier layer 612 is disposed on a lower surface of the second drain electrode 323, but the present invention is not limited thereto. For example, the second barrier 612 can be disposed in contact with an upper surface of the second drain electrode 323. Alternatively, the second barrier 612 can be disposed in contact with the lower surface and the upper surface of the second drain electrode 323.

Furthermore, it is described that the third barrier layer 613 is disposed on a lower surface of the first source electrode 412, but the present invention is not limited thereto. For example, the third barrier layer 613 can be disposed in contact with an upper surface of the first source electrode 412. Alternatively, the third barrier 613 can be disposed in contact with the lower surface and the upper surface of the first source electrode 412. And, it is described that the fourth barrier layer 614 is disposed on a lower surface of the first drain electrode 413, but the present invention is not limited thereto. For example, the fourth barrier layer 614 can be disposed in contact with an upper surface of the first drain electrode 413. Alternatively, the fourth barrier 614 can be disposed in contact with the lower surface and the upper surface of the first drain electrode 413.

The first barrier layer 611 and the second barrier layer 612 can prevent hydrogen (H) from diffusing into the second active layer 321 of the second thin film transistor 320. And, the third barrier layer 613 and the fourth barrier layer 614 can be prevent hydrogen (H) from diffusing into the first active layer 411 of the first thin film transistor 410.

The display apparatus according to embodiments of the present invention will be described below.

The display device according to an embodiment of the present invention includes a first thin-film transistor including a first active layer including a polysilicon material, a first gate electrode overlapping the first active layer such that a first gate insulating layer is interposed therebetween and including n layers, and a first source electrode and a first drain electrode connected to the first active layer, a second thin-film transistor including a second active layer including a polysilicon material, a second gate electrode overlapping the second active layer such that a first gate insulating layer is interposed therebetween and including n+1 layers, and a second source electrode and a second drain electrode connected to the second active layer, and a third thin-film transistor including a third active layer including an oxide semiconductor, a third gate electrode overlapping the third active layer such that a second gate insulating layer is interposed therebetween, and a third source electrode and a third drain electrode connected to the third active layer.

According to an embodiment of the present invention, n is a natural number.

According to an embodiment of the present invention, in the case of n=1, the first gate electrode can have a single-layer structure and the second gate electrode can have a double-layer structure including a lower metal layer and an upper metal layer.

According to an embodiment of the present invention, the upper metal layer of the second gate electrode can include titanium (Ti) or titanium nitride (TiNx).

According to an embodiment of the present invention, the first thin-film transistor and the third thin-film transistor can be used as switching thin-film transistors, and the second thin-film transistor can be used as a driving thin-film transistor.

According to an embodiment of the present invention, the display apparatus can further include a first electrode electrically connected to the second drain electrode of the second thin-film transistor, a light-emitting structure disposed on the first electrode, and a second electrode disposed on the light-emitting structure.

According to an embodiment of the present invention, the second lower metal layer of the second gate electrode and the first gate electrode can include the same material.

According to an embodiment of the present invention, each of the first source electrode and the first drain electrode of the first thin-film transistor can have a single-layer structure, and each of the second source electrode and the second drain electrode of the second thin-film transistor can have a double-layer structure including an upper electrode layer and a lower electrode layer including a different material from the upper electrode layer. Also, each of the third source electrode and the third drain electrode of the third thin-film transistor can have a single-layer structure.

According to an embodiment of the present invention, the second source electrode can include a second source upper electrode layer and a second source lower electrode layer, and the second drain electrode can include a second drain upper electrode layer and a second drain lower electrode layer. Also, the second source upper electrode layer, the second drain upper electrode layer, the first source electrode, the first drain electrode, the third source electrode and the third drain electrode can include the same material.

A display apparatus according to another embodiment can include a first thin-film transistor including a first active layer including a polysilicon material, a first gate electrode overlapping the first active layer such that a first gate insulating layer is interposed therebetween, and a first source electrode and a first drain electrode connected to the first active layer, a second thin-film transistor including a second active layer including a polysilicon material, a second gate electrode overlapping the second active layer such that a first gate insulating layer is interposed therebetween, and a second source electrode and a second drain electrode connected to the second active layer, a third thin-film transistor including a third active layer including an oxide semiconductor, a third gate electrode overlapping the third active layer such that a second gate insulating layer is interposed therebetween, and a third source electrode and a third drain electrode connected to the third active layer, and a storage capacitor including a first capacitor electrode disposed on the same layer as the first gate electrode and the second gate electrode, and a second capacitor electrode overlapping the first capacitor electrode such that a first interlayer insulating layer including a first interlayer upper insulating layer and a first interlayer lower insulating layer is interposed therebetween. Also, the upper surface of the second gate electrode can contact the first interlayer upper insulating layer of the first interlayer insulating layer and the upper surface of the first gate electrode can contact the first interlayer lower insulating layer of the first interlayer insulating layer.

According to an embodiment of the present invention, the first thin-film transistor and the third thin-film transistor can be used as switching thin-film transistors, and the second thin-film transistor can be used as a driving thin-film transistor.

According to an embodiment of the present invention, the display apparatus can further include a first electrode electrically connected to the second drain electrode of the second thin-film transistor, a light-emitting structure disposed on the first electrode, and a second electrode disposed on the light-emitting structure.

According to an embodiment of the present invention, the first interlayer upper insulating layer can be a silicon oxide (SiOx) layer, and the first interlayer lower insulating layer can be a silicon nitride (SiNx) layer.

According to an embodiment of the present invention, the first interlayer upper insulating layer can be a silicon dioxide (SiO$_2$) layer.

According to an embodiment of the present invention, the first interlayer insulating layer in a region corresponding to the second gate electrode can have a double-layer structure, and the first interlayer insulating layer in a region corresponding to the first gate electrode can have a single-layer structure.

According to an embodiment of the present invention, the first gate electrode of the first thin-film transistor can have a single-layer structure and the second gate electrode of the second thin-film transistor can have a double-layer structure.

According to an embodiment of the present invention, each of the first source electrode and the first drain electrode of the first thin-film transistor can have a single-layer structure, and each of the second source electrode and the second drain electrode of the second thin-film transistor can have a double-layer structure.

A display apparatus according to another embodiment of the present invention can include a first thin-film transistor including a first active layer including a polysilicon material, a first gate electrode overlapping the first active layer such that a first gate insulating layer is interposed therebetween, and a first source electrode and a first drain electrode connected to the first active layer, a second thin-film transistor including a second active layer including a polysilicon material, a second gate electrode overlapping the second active layer such that a first gate insulating layer is interposed therebetween, and a second source electrode and a second drain electrode connected to the second active layer, a third thin-film transistor including a third active layer including an oxide semiconductor, a third gate electrode overlapping the third active layer such that a second gate insulating layer is interposed therebetween, and a third source electrode and a third drain electrode connected to the third active layer, and a storage capacitor including a first capacitor electrode disposed on the same layer as the first gate electrode and the second gate electrode, and a second capacitor electrode overlapping the first capacitor electrode such that a first interlayer insulating layer is interposed therebetween. Also, each of the first source electrode and the first drain electrode of the first thin-film transistor can have a single-layer structure, and each of the second source electrode and the second drain electrode of the second thin-film transistor can have a double-layer structure.

According to an embodiment of the present invention, the first thin-film transistor and the third thin-film transistor can be used as switching thin-film transistors, and the second thin-film transistor can be used as a driving thin-film transistor.

According to an embodiment of the present invention, the display apparatus can further include a first electrode electrically connected to the second drain electrode of the second thin-film transistor, a light-emitting structure disposed on the first electrode, and a second electrode disposed on the light-emitting structure.

According to an embodiment of the present invention, the second source electrode can include a second source upper electrode layer and a second source lower electrode layer, and the second drain electrode can include a second drain upper electrode layer and a second drain lower electrode layer.

According to an embodiment of the present invention, the second source lower electrode layer of the second source electrode and the second drain lower electrode layer of the second drain electrode include the same material as the second capacitor electrode of the storage capacitor.

According to an embodiment of the present invention, the second source upper electrode layer, the second drain upper electrode layer, the first source electrode, the first drain electrode, the third source electrode and the third drain electrode can include the same material.

According to an embodiment of the present invention, the first gate electrode can have a single-layer structure and the second gate electrode can have a double-layer structure including a lower metal layer and an upper metal layer.

According to an embodiment of the present invention, the upper metal layer of the second gate electrode can include titanium (Ti) or titanium nitride (TiNx).

According to an embodiment of the present invention, the first interlayer insulating layer can include a first interlayer upper insulating layer including a silicon oxide (SiOx) material and a first interlayer lower insulating layer including a silicon nitride (SiNx) material. An upper surface of the second gate electrode can contact the first interlayer upper insulating layer and an upper surface of the first gate electrode can contact the first interlayer lower insulating layer.

As apparent from the foregoing, in accordance with the present disclosure, the reliability of the display apparatus can be improved by disposing thin-film transistors including different semiconductor materials.

Therefore, the gate electrode structure can be formed differently depending on the characteristics of the transistor, so that a desired s-factor value at or below a threshold voltage can be increased.

Also, according to the present disclosure, the first gate electrode of the first thin-film transistor, which is a switching thin-film transistor, can include n layers. In addition, the second gate electrode of the second thin-film transistor used as a driving thin-film transistor can include n+1 layers. The uppermost layer or the lowermost layer of the second gate electrode including n+1 layers can be formed of titanium (Ti) or titanium nitride (TiNx). The titanium (Ti) or titanium nitride (TiNx) layer of the second gate electrode can serve as a barrier layer that prevents hydrogen from diffusing into the second active layer of the second thin-film transistor. Thus, by creating a difference in the degree of hydrogenation between the first active layer of the first thin-film transistor, which is a switching thin-film transistor, and the second active layer of the second thin-film transistor, which is a driving thin-film transistor, the s-factor value at or below a threshold voltage of only the second thin-film transistor, used as the driving thin-film transistor, can be increased.

Also, by differently designing the structures of the insulating layers on the gate electrodes of the first thin-film transistor and the second thin-film transistor, thin-film transistors having different characteristics can be realized.

In addition, according to the present disclosure, each of the second source electrode and the second drain electrode of the second thin-film transistor is designed to have a double-layer structure, thereby preventing hydrogen from diffusing into the channel region of the active layer. In addition, in the process of forming the second source electrode and the second drain electrode, only the second active layer of the second thin-film transistor can be subjected to selective heat treatment to perform the dehydrogenation process, so that the s-factor value at or below the threshold value of only the second thin-film transistor element can be increased.

The effects according to the present disclosure are not limited by the contents set forth above, and other unforeseen effects are incorporated herein in their entirety.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display apparatus comprising:
a first thin-film transistor including a first active layer composed of a first polysilicon material, a first gate electrode overlapping the first active layer so that a first gate insulating layer is interposed therebetween, a first source electrode and a first drain electrode, the first gate electrode including n layers electrically connected to each other or n layer, the first source electrode and the first drain electrode connected to the first active layer;
a second thin-film transistor including a second active layer composed of a second polysilicon material, a second gate electrode overlapping the second active layer so that the first gate insulating layer is interposed therebetween, a second source electrode and a second drain electrode, the second gate electrode including n+1 layers, which are electrically connected to each other, the second source electrode and the second drain electrode connected to the second active layer; and
a third thin-film transistor including a third active layer composed of an oxide semiconductor, a third gate electrode overlapping the third active layer so that a second gate insulating layer is interposed therebetween, a third source electrode and a third drain electrode, the third source electrode and the third drain electrode connected to the third active layer,
wherein each of the first source electrode and the first drain electrode of the first thin-film transistor has a single-layer structure,
wherein each of the third source electrode and the third drain electrode of the third thin-film transistor has a single-layer structure,
wherein each of the second source electrode and the second drain electrode of the second thin-film transistor has a stacked structure of an upper electrode layer and a lower electrode layer including a different material from the upper electrode layer,
wherein the upper electrode layer and the lower electrode layer of the second source electrode are a second source upper electrode layer and a second source lower electrode layer,
wherein the upper electrode layer and the lower electrode layer of the second drain electrode are a second drain upper electrode layer and a second drain lower electrode layer, and
wherein the second source upper electrode layer, the second drain upper electrode layer, the first source electrode, the first drain electrode, the third source electrode and the third drain electrode include a same material.

2. The display apparatus according to claim 1, wherein n is a natural number.

3. The display apparatus according to claim 2, wherein, in a case of n=1, the first gate electrode has a single-layer structure and the second gate electrode has a stacked structure of a lower metal layer and an upper metal layer.

4. The display apparatus according to claim 3, wherein the upper metal layer of the second gate electrode includes titanium (Ti) or titanium nitride (TiNx).

5. The display apparatus according to claim 3, wherein the lower metal layer of the second gate electrode and the first gate electrode include a same material.

6. The display apparatus according to claim 1, wherein each of the first thin-film transistor and the third thin-film transistor is a switching thin-film transistor, and the second thin-film transistor is a driving thin-film transistor.

7. The display apparatus according to claim 1, further comprising:
a first electrode electrically connected to the second drain electrode of the second thin-film transistor;
a light-emitting structure disposed on the first electrode; and
a second electrode disposed on the light-emitting structure.

8. A display apparatus comprising:
a first thin-film transistor including a first active layer composed of a first polysilicon material, a first gate electrode overlapping the first active layer so that a first gate insulating layer is interposed therebetween, a first source electrode and a first drain electrode, the first source electrode and the first drain electrode connected to the first active layer;
a second thin-film transistor including a second active layer composed a second polysilicon material, a second gate electrode overlapping the second active layer so that the first gate insulating layer is interposed therebetween, a second source electrode and a second drain electrode, the second source electrode and the second drain electrode connected to the second active layer;

a third thin-film transistor including a third active layer composed of an oxide semiconductor, a third gate electrode overlapping the third active layer so that a second gate insulating layer is interposed therebetween, a third source electrode and a third drain electrode, the third source electrode and the third drain electrode connected to the third active layer; and a storage capacitor including a first capacitor electrode disposed on a same layer as the first gate electrode and the second gate electrode, and a second capacitor electrode overlapping the first capacitor electrode so that a first interlayer insulating layer including a first interlayer upper insulating layer and a first interlayer lower insulating layer is interposed therebetween, wherein an upper surface of the second gate electrode contacts the first interlayer upper insulating layer of the first interlayer insulating layer, and an upper surface of the first gate electrode contacts the first interlayer lower insulating layer of the first interlayer insulating layer.

9. The display apparatus according to claim 8, wherein each of the first thin-film transistor and the third thin-film transistor is a switching thin-film transistor, and the second thin-film transistor is a driving thin-film transistor.

10. The display apparatus according to claim 8, further comprising:
a first electrode electrically connected to the second drain electrode of the second thin-film transistor;
a light-emitting structure disposed on the first electrode; and
a second electrode disposed on the light-emitting structure.

11. The display apparatus according to claim 8, wherein the first interlayer upper insulating layer is a silicon oxide (SiOx) layer, and the first interlayer lower insulating layer is a silicon nitride (SiNx) layer.

12. The display apparatus according to claim 8, wherein the first interlayer upper insulating layer is a silicon dioxide ($SiO_2$) layer.

13. The display apparatus according to claim 8, wherein a region of the first interlayer insulating layer corresponding to the second gate electrode has a double-layer structure, and a region of the first interlayer insulating layer corresponding to the first gate electrode has a single-layer structure.

14. The display apparatus according to claim 8, wherein the first gate electrode of the first thin-film transistor has a single-layer structure, and the second gate electrode of the second thin-film transistor has a double-layer structure.

15. The display apparatus according to claim 8, wherein each of the first source electrode and the first drain electrode of the first thin-film transistor has a single-layer structure, and
wherein each of the second source electrode and the second drain electrode of the second thin-film transistor has a double-layer structure.

16. A display apparatus comprising:
a first thin-film transistor including a first active layer composed of a polysilicon material, a first gate electrode overlapping the first active layer so that a first gate insulating layer is interposed therebetween, a first source electrode and a first drain electrode, the first source electrode and the first drain electrode connected to the first active layer;
a second thin-film transistor including a second active layer composed of a polysilicon material, a second gate electrode overlapping the second active layer so that a first gate insulating layer is interposed therebetween, a second source electrode and a second drain electrode, the second source electrode and the second drain electrode connected to the second active layer;

a third thin-film transistor including third active layer composed of an oxide semiconductor, a third gate electrode overlapping the third active layer so that a second gate insulating layer is interposed therebetween, a third source electrode and a third drain electrode, the third source electrode and the third drain electrode connected to the third active layer; and a storage capacitor including a first capacitor electrode disposed on a same layer as the first gate electrode and the second gate electrode, and a second capacitor electrode overlapping the first capacitor electrode so that a first interlayer insulating layer is interposed therebetween, wherein each of the first source electrode and the first drain electrode of the first thin-film transistor has a single-layer structure, and wherein each of the second source electrode and the second drain electrode of the second thin-film transistor has a double-layer structure.

17. The display apparatus according to claim 16, wherein each of the first thin-film transistor and the third thin-film transistor is a switching thin-film transistor, and the second thin-film transistor is a driving thin-film transistor.

18. The display apparatus according to claim 16, further comprising:
a first electrode electrically connected to the second drain electrode of the second thin-film transistor;
a light-emitting structure disposed on the first electrode; and
a second electrode disposed on the light-emitting structure.

19. The display apparatus according to claim 16, wherein the second source electrode is composed of a second source upper electrode layer and a second source lower electrode layer, and
wherein the second drain electrode is composed of a second drain upper electrode layer and a second drain lower electrode layer.

20. The display apparatus according to claim 19, wherein the second source lower electrode layer of the second source electrode and the second drain lower electrode layer of the second drain electrode include the same material as the second capacitor electrode of the storage capacitor.

21. The display apparatus according to claim 19, wherein the second source upper electrode layer, the second drain upper electrode layer, the first source electrode, the first drain electrode, the third source electrode and the third drain electrode are composed of the same material.

22. The display apparatus according to claim 16, wherein the first gate electrode has a single-layer structure, and the second gate electrode has a double-layer structure including a lower metal layer and an upper metal layer.

23. The display apparatus according to claim 22, wherein the upper metal layer of the second gate electrode includes titanium (Ti) or titanium nitride (TiNx).

24. The display apparatus according to claim 16, wherein the first interlayer insulating layer includes a first interlayer upper insulating layer composed of a silicon oxide (SiOx) material, and a first interlayer lower insulating layer composed of a silicon nitride (SiNx) material, and
wherein an upper surface of the second gate electrode contacts the first interlayer upper insulating layer, and an upper surface of the first gate electrode contacts the first interlayer lower insulating layer.

25. A display apparatus comprising:
a substrate including a display area and a non-display area adjacent to the display area;
a first buffer layer on the substrate;
a first thin film transistor on the non-display area of the substrate, the first thin film transistor including a first active layer including a first polysilicon material, a first gate electrode overlapping the first active layer with a first gate insulating layer, and a first source electrode and a first drain electrode which are connected to the first active layer;
a second thin film transistor on the display area of the substrate, the second thin film transistor including a second active layer including a second polysilicon material, a second gate electrode overlapping the second active layer with the first gate insulating layer, and a second source electrode and a second drain electrode which are connected to the second active layer;
a third thin film transistor on the display area of the substrate, the third thin film transistor including a third active layer including an oxide semiconductor, a third gate electrode overlapping the third active layer with a second gate insulating layer, and a third source electrode and a third drain electrode which are connected to the third active layer;
a first metal pattern overlapping the second gate electrode with a first interlayer insulating layer;
a first barrier layer disposed between the second active layer and the second source electrode and between the first interlayer insulating layer and the second source electrode; and
a second barrier layer disposed between the second active layer and the second drain electrode and between the first interlayer insulating layer and the second drain electrode.

26. The display apparatus according to claim 25, further comprising a second metal pattern which overlaps the third active layer of the third thin film transistor, and is disposed on the first interlayer insulating layer.

27. The display apparatus according to claim 26, further comprising:
a third barrier layer between the first metal pattern and the second gate electrode; and
a fourth barrier layer between the second metal pattern and the first interlayer insulating layer.

28. The display apparatus according to claim 27, wherein the first barrier layer, the second barrier layer, the third barrier layer and the fourth barrier layer are formed of a same material, and
wherein the first barrier layer, the second barrier layer, the third barrier layer and the fourth barrier layer include one of titanium (Ti), calcium (Ca), yttrium (Y), magnesium (Mg), tantalum (Ta), and vanadium (V).

29. The display apparatus according to claim 26, wherein the second source electrode, the second drain electrode, the first metal pattern and the second metal pattern are disposed on the first interlayer insulating layer, and are formed of a same material.

30. The display apparatus according to claim 25, wherein the first source electrode, the first drain electrode, the third source electrode and the third drain electrode are formed of a same material.

31. A display apparatus comprising:
a substrate including a display area and a non-display area adjacent to the display area;
a first buffer layer on the substrate;
a first thin film transistor on the non-display area of the substrate, the first thin film transistor including a first active layer including a first polysilicon material, a first gate electrode overlapping the first active layer with a first gate insulating layer, and a first source electrode and a first drain electrode which are connected to the first active layer;
a second thin film transistor on the display area of the substrate, the second thin film transistor including a second active layer including a second polysilicon material, a second gate electrode overlapping the second active layer with a first gate insulating layer, and a second source electrode and a second drain electrode which are connected to the second active layer;
a third thin film transistor on the display area of the substrate, the third thin film transistor including the third active layer including an oxide semiconductor, a third gate electrode overlapping the third active layer with a second gate insulating layer, and a third source electrode and a third drain electrode which are connected to the third active layer;
a first metal pattern overlapping the second gate electrode with a first interlayer insulating layer; and
a barrier layer respectively disposed between the second active layer and the second source/drain electrodes, between the first interlayer insulating layer and the second source/drain electrodes, between the first active layer and the first source/drain electrodes, and between the first interlayer insulating layer and the first source/drain electrodes.

32. The display apparatus according to claim 31, wherein the barrier layer includes:
a first barrier layer between the second source electrode and the second source region of the second active layer,
a second barrier layer between the second drain electrode and the second drain region of the second active layer,
a third barrier layer between the first source electrode and the first source region of the first active layer, and
a fourth barrier layer between the first drain electrode and the first drain region of the first active layer.

33. The display apparatus according to claim 32, wherein the first barrier layer, the second barrier layer, the third barrier layer and the fourth barrier layer are formed of the same material, and
wherein the first barrier layer, the second barrier layer, the third barrier layer and the fourth barrier layer include one of titanium (Ti), calcium (Ca), yttrium (Y), magnesium (Mg), tantalum (Ta), and vanadium (V).

34. The display apparatus according to claim 31, wherein a second metal pattern which is disposed on the first interlayer insulating layer, and overlaps the third active layer with a second buffer layer.

35. The display apparatus according to claim 34, wherein the first metal pattern and the second metal pattern are disposed on the first interlayer insulating layer and have the same material.

36. The display apparatus according to claim 34, wherein the second buffer layer includes a second lower buffer layer and a second upper buffer layer stacked on the second lower buffer layer, and
wherein the second lower buffer layer is disposed between the first metal pattern and the second metal pattern, and the second upper buffer layer is disposed between the second lower buffer layer and the third active layer.

37. The display apparatus according to claim 36, wherein the first source electrode, the first drain electrode, the second source electrode and the second drain electrode have a same material, and are disposed on the second lower buffer layer.

38. The display apparatus according to claim 34, wherein the first thin film transistor and the second thin film transistor are disposed on the first buffer layer, and the third thin film transistor is disposed on the second buffer layer.

\* \* \* \* \*